(12) United States Patent
Park et al.

(10) Patent No.: US 11,723,265 B2
(45) Date of Patent: Aug. 8, 2023

(54) ORGANIC LIGHT EMITTING DIODE WITH HIGH EFFICIENCY

(71) Applicant: SFC CO., LTD., Cheongju-si (KR)

(72) Inventors: Young-Hwan Park, Cheongju-si (KR); Soon-Wook Cha, Goyang-si (KR); Yoona Shin, Seoul (KR); Sungeun Choi, Seoul (KR)

(73) Assignee: SFC CO., LTD., Cheongju-si (KR)

( * ) Notice: Subject to any disclaimer, the term of this patent is extended or adjusted under 35 U.S.C. 154(b) by 0 days.

(21) Appl. No.: 16/558,856

(22) Filed: Sep. 3, 2019

(65) Prior Publication Data

US 2020/0168803 A1 May 28, 2020

(30) Foreign Application Priority Data

Jul. 4, 2018 (KR) .................. 10-2018-0077903

(51) Int. Cl.
*H10K 85/60* (2023.01)
*H10K 50/12* (2023.01)

(52) U.S. Cl.
CPC ........... *H10K 85/615* (2023.02); *H10K 50/12* (2023.02)

(58) Field of Classification Search
None
See application file for complete search history.

(56) References Cited

U.S. PATENT DOCUMENTS

| | | | | |
|---|---|---|---|---|
| 2009/0146558 | A1* | 6/2009 | Egawa | 313/504 |
| 2009/0322211 | A1* | 12/2009 | Takahashi | 313/504 |
| 2010/0264406 | A1* | 10/2010 | Nagao | H01L 51/54 |
| | | | | 257/40 |
| 2015/0239816 | A1* | 8/2015 | Zaragoza Doerwald | |
| | | | | C07C 45/58 |
| 2016/0079543 | A1* | 3/2016 | Park | H01L 51/0067 |
| 2017/0062729 | A1* | 3/2017 | Cha | H01L 51/0061 |
| 2019/0016666 | A1* | 1/2019 | Jeong | C07C 211/54 |

FOREIGN PATENT DOCUMENTS

| | | |
|---|---|---|
| KR | 1020080100789 A | 11/2008 |
| KR | 1020120092555 | 8/2012 |
| KR | 1020160124521 A | 10/2016 |
| KR | 1020180009428 A | 1/2018 |

OTHER PUBLICATIONS

English translation of KR 2011/0027033 combined with the original KR 2011/0027033, Jung-Tae Je, Mar. 16, 2011 (Year: 2011).*
CIE1931 Diagram, web page address https://www.biyee.net/color-science/cie-chromaticity-diagram/ (Year: 2021).*
Ziegler et al. "Crystal structure of 9,10-bis-(2,6-difluorophenyl)-anthracene, C26H14F4", Z. Kristallogr. NCS 2013, vol. 228, p. 109-110 (Year: 2013).*
Pang et al. "A full-color, low-power, wearable display for mobile applications", SPIE, Mar. 29, 2012 (Year: 2012).*
Jeong Keum Park, "Anthrylenes with End-Capping Diphenyl moiety for Blue Organic Light-Emitting Diodes", IEEE 2010, https://ieeexplore.ieee.org/document/5424683 (Year: 2010).*
Qianqian Du, "Studyonblueorganiclight-emittingdiodesdopedwith4,4'-bis (9-ethyl-3carbazovinylene)-1,1'-biphenylinvarioushostmaterials", Optics Communications, 2016, vol. 366, p. 253-259 (Year: 2016).*
English translation of CN 108409607 A and original CN 108409607 A, Zaifeng Xie, Aug. 17, 2018 (Year: 2018).*
Sergei M. Bachilo et al., Determination of Triplet Quantum Yields from Triplet-Triplet Annihilation Fluorescence, The Journal of Physical Chemistry, Aug. 24, 2000, vol. 104, No. 33, pp. 7711-7714, American Chemical Society, Washington DC, USA.
Office Action from Korea Intellectual Property Office of 10-2018-0077903, Oct. 29, 2019.

* cited by examiner

*Primary Examiner* — Dylan C Kershner
*Assistant Examiner* — Seokmin Jeon
(74) *Attorney, Agent, or Firm* — STIP Law Group, LLC

(57) ABSTRACT

Disclosed herein is an organic light emitting diode, comprising: a first electrode; a second electrode facing the first electrode; and a light emitting layer interposed between the first electrode and the second electrode, wherein the light-emitting layer contains at least one of the anthracene derivatives represented by the following Chemical Formula A and having an orbital energy level of TTA phenomenon-based singlet generation in which the second triplet excited orbital energy level ($T_2$) is higher than two times the lowest triplet excited orbital energy level ($T_1$) ($T_2>2T_1$).

7 Claims, 3 Drawing Sheets

Type I　　　　　　　Type II　　　　　　　Type III

(2T1>Q1>T2>S1>T1)　　(Q1>2T1>T2>S1>T1)　　(Q1>T2>2T1>S1>T1)

ORGANIC LIGHT EMITTING DIODE WITH HIGH EFFICIENCY

CROSS-REFERENCE TO RELATED APPLICATIONS

This application claims the priority of the Korean Patent Applications NO 10-2018-0077903 filed on Jul. 4, 2018, in the Korean Intellectual Property Office, the disclosure of which is incorporated herein by reference.

TECHNICAL FIELD

The present disclosure relates to an organic light-emitting diode and, more particularly, to an organic light-emitting diode exhibiting high efficiency, in which a material having a specific structure is employed.

BACKGROUND ART

Organic light-emitting diodes, based on self-luminescence, exhibit the advantages of having a wide viewing angle, excellent contrast, fast response time, high brightness, excellent driving voltage and response rate characteristics, and of allowing for a polychromic display.

A typical organic light-emitting diode includes a positive electrode (anode) and a negative electrode (cathode), facing each other, with an organic emission layer disposed therebetween.

As to the general structure of the organic light-emitting diode, a hole transport layer, a light-emitting layer, an electron transport layer, and a cathode are formed in that order on an anode. Here, all of the hole transport layer, the light-emitting layer, and the electron transport layer are organic films comprising organic compounds.

An organic light-emitting diode having such a structure operates as follows: when a voltage is applied between the anode and the cathode, the anode injects holes which are then transferred to the light-emitting layer via the hole transport layer while electrons injected from the cathode move to the light-emitting layer via the electron transport layer. In the luminescent zone, the carriers such as holes and electrons recombine to produce an exciton. When the exciton returns to the ground state from the excited state, the molecule of the light-emitting layer emits light.

Materials used as the organic layers in organic light-emitting diodes may be divided according to functions into luminescent materials and charge carrier materials, for example, a hole injection material, a hole transport material, an electron injection material, and an electron transport material. The light-emitting mechanism forms the basis of classification of luminescent materials as fluorescent and phosphorescent materials, which use excitons in singlet and triplet states, respectively.

Meanwhile, when a single material is employed as the luminescent material, intermolecular actions cause the maximum luminescence wavelength to shift toward a longer wavelength, resulting in a reduction in color purity and luminous efficiency due to light attenuation. In this regard, a host-dopant system may be used as a luminescent material so as to increase the color purity and the luminous efficiency through energy transfer. This is based on the principle whereby, when a dopant which is smaller in energy band gap than a host forming a light-emitting layer is added in a small amount to the light-emitting layer, excitons are generated from the light-emitting layer and transported to the dopant, emitting light at high efficiency. Here, light with desired wavelengths can be obtained depending on the kind of the dopant because the wavelength of the host moves to the wavelength range of the dopant.

As concerns the efficiency of organic light-emitting diodes, statistically, the probability of forming a singlet state and a triplet state occurs at a ratio of 25%:75%. It would thus be expected that in fluorescent EL devices, only the formation of singlet excitons results in the emission of useful radiation, placing a theoretical limit of 25% on the internal quantum efficiency of such fluorescent EL devices.

With the aim of solving the disadvantages, a method for fabricating an organic light-emitting diode of high efficiency has been proposed in which advantage of taken of the effective occurrence of a triplet-triplet fusion (TTF) or triplet-triplet annihilation (TTA) phenomenon accounting for the generation of singlet excitons through the collision and fusion of two triplet excitons.

According to S. M. Bachilo et al. (J. Phys. Chem. A, 104, 7711 (2000)), assuming that high-order excitons such as quintet excitons are quickly returned to triplet excitons, triplet excitons (hereinafter abbreviated as $^3A^*$) collide with each other with an increase in the density thereof, whereby a reaction shown by the following formula occurs.

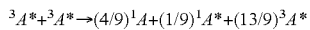

$$^3A^* + ^3A^* \rightarrow (4/9)^1A + (1/9)^1A^* + (13/9)^3A^*$$

In the formula, $^1A$ represents the ground state and $^1A^*$ represents the lowest excited singlet excitons.

Hence, $5\,^3A^* \rightarrow 4\,^1A + ^1A^*$, and it is expected that, among triplet excitons initially generated, which account for 75%, one fifth thereof, that is, 20%, is changed to singlet excitons. Therefore, the amount of singlet excitons which contribute to emission is 40%, which is a value obtained by adding 15% ((75%×(1/5)=15%) to 25%, which is the amount ratio of initially generated singlet excitons. At this time, the ratio of luminous intensity derived from TTF (TTF ratio) relative to the total luminous intensity is 15/40, that is, 37.5%. Assuming that singlet excitons are generated by collision of initially-generated triplet excitons which account for 75% (i.e., one singlet exciton is generated from two triplet excitons), a significantly high internal quantum efficiency of 62.5% is obtained which is a value obtained by adding 37.5% ((75%×(1/2)=37.5%) to 25%, which is the amount ratio of initially generated singlet excitons. At this time, the TTF ratio is 60% (37.5/62.5).

FIG. 1 illustrates a light emission process in which two molecules in respective triplet excited states undergo the TTA phenomenon to return to the singlet ground state ($S_0$) through the first excited state ($S_1$) in a singlet state, with the concomitant emission of light.

Such TTA phenomenon can be classified into three types the respective energy levels of which are illustrated in FIG. 2.

In the case of compounds corresponding to Type II, the orbital energy level diagram of TTA phenomenon-based singlet generation shows that the second triplet excited orbital energy level ($T_2$) is lower than two times the lowest triplet excited orbital energy level ($T_1$) ($T_2<2T_1$), so that there simultaneously exist two options that the two molecules in excited triplets might return to either $S_1$ or $T_2$. In contrast, in the case of the compounds corresponding to Type III, the orbital energy level diagram of singlet generation according to the TTA phenomenon shows that the second triplet excited orbital energy level ($T_2$) is higher than two times the lowest triplet excited orbital energy level ($T_1$) ($T_2>2T_1$), so that there is only one option that the two molecules in excited triplets return $S_1$ only, whereby luminous efficiency can be improved.

Possible theoretical values of luminous efficiency by Type according to the TTA phenomenon are listed in Table 1, below. As is understood from the data of Table 1, Type I can theoretically improve luminous efficiency by 0.1 (10%) for phosphorescence, which can amount to a theoretical efficiency of 32.5% when being added with 25% of fluorescence (0.25+0.075=0.325). For Type II, the luminous efficiency can be theoretically improved by 0.2 (20%) on the phosphorescence basis, which can amount to a theoretical efficiency of 40% when being added with 25% of fluorescence (0.25+0.15=0.40). For Type III, the luminous efficiency can be theoretically improved by 0.5 (50%) on the phosphorescence basis, which can amount to a theoretical efficiency of 62.5% when being added with 25% of fluorescence (0.25+0.375=0.625).

TABLE 1

|  | Type I | Type II | Type III |
|---|---|---|---|
| S | 0.25 | 0.25 | 0.25 |
| T | 0.75 | 0.75 | 0.75 |
| TTA | 0.1 | 0.2 | 0.5 |
| Prompt F(PF) | 0.25 | 0.25 | 0.25 |
| Delayed F(DF) | 0.075 | 0.15 | 0.375 |
| Total QY (EL yield) | 32.5% | 40.0% | 62.5% |
| TT ratio | 23.1% | 37.5% | 60.0% |

Accordingly, when advantage is taken of the TTA phenomenon, the use of a compound corresponding to Type III as a luminous material can brought about a more improved efficiency, compared to a compound corresponding to Type II.

However, most of the anthracene derivatives used as hosts in organic light-emitting diodes corresponds to Type II and only few compounds corresponding to Type III are known.

Meanwhile, with regard to efficiency improvement through the TTA phenomenon, reference may be made to Korean Patent No. 10-2012-0092555 A (Aug. 21, 2012), which discloses an organic light-emitting diode in which a blocking layer is interposed between a light-emitting layer and an electron injection layer, as shown in FIG. 3, to induce the more effective occurrence of the TTA (Triplet-Triplet Annihilation) phenomenon. In this regard, the blocking layer is set to have a triplet energy larger than that of the host of the light-emitting layer so as to confine triplet excitons within the light-emitting layer. In addition, the organic light-emitting diode is designed to employ materials in which respective affinities of both the electron injection layer and the blocking layer satisfy a specific condition, whereby the fluorescence emission efficiency is improved.

However, the prior art document amounts to a method for more effectively causing the TTF phenomenon to improve the luminous efficiency. To this end, the blocking layer should include a material that is higher in triplet energy than the host to prevent the annihilation of the triplet excitations generated in the host, and an aromatic heterocyclic compound of a specific fused ring should be employed in the blocking layer.

Therefore, there is still a continued need to develop organic light-emitting diodes having a more improved luminous efficiency by taking advantage of the TTA phenomenon with the introduction of a compound corresponding to Type III into a light emitting layer in the organic light-emitting diode.

PRIOR ART DOCUMENT

Patent Literature (Patent Literature 0001) Korean Patent No. 10-2012-0092555 A (Aug. 21, 2012)

Non-Patent Literature (Non-Patent Literature 0001) J. Phys. Cem. A, 104, 7711 (2000)

DETAILED DESCRIPTION OF THE INVENTION

Technical Problem

Designed to solve the problems encountered in conventional techniques, the present disclosure provides an organic light-emitting diode having an improved efficiency on the basis of the finding that an anthracene derivative having a specific structure corresponds to Type III in the orbital energy level of TTA phenomenon-based singlet generation.

Technical Solution

The present disclosure provides an organic light emitting diode comprising: a first electrode; a second electrode facing the first electrode; and a light emitting layer interposed between the first electrode and the second electrode, wherein the light-emitting layer contains at least one of the anthracene derivatives represented by the following Chemical Formula A and having an orbital energy level of TTA phenomenon-based singlet generation in which the second triplet excited orbital energy level ($T_2$) is higher than two times the lowest triplet excited orbital energy level ($T_1$) ($T_2 > 2T_1$):

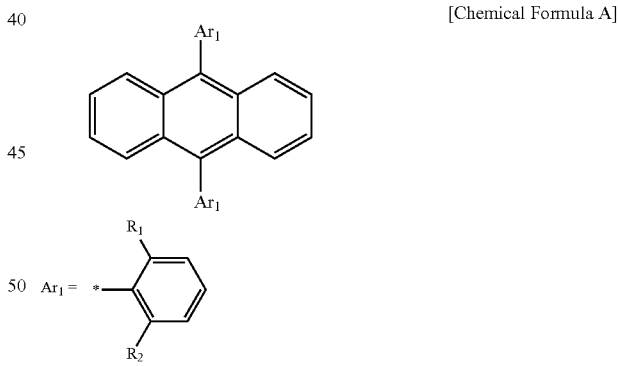

[Chemical Formula A]

wherein,

"*" within $Ar_1$ denotes a bond to the carbon atom in the aromatic ring of the anthracene moiety, and $R_1$ and $R_2$, which may be the same or different, are each independently selected from among a hydrogen atom, a deuterium atom, a substituted or unsubstituted alkyl of 1 to 20 carbon atoms, a substituted or unsubstituted aryl of 6 to 20 carbon atoms, a substituted or unsubstituted alkenyl of 2 to 20 carbon atoms, a substituted or unsubstituted alkynyl of 2 to 20 carbon atoms, a substituted or unsubstituted cycloalkyl of 3 to 20 carbon atoms, a substituted or unsubstituted cycloalkenyl of 5 to 20 carbon atoms, a substituted or unsubstituted heteroaryl of 2 to 20 carbon atoms, a substituted or unsubstituted heterocycloalkyl of 2 to 20 carbon atoms, a substituted or unsubstituted alkoxy of 1 to 20 carbon atoms, a substituted or unsubstituted aryloxy of 6 to 20 carbon atoms, a substituted or unsubstituted alkylthioxy of 1 to 20 carbon atoms, a substituted or unsubstituted arylthioxy of 6 to 20 carbon atoms, a substituted or unsubstituted akylsilyl of 1 to 20 carbon atoms, a substituted or unsubstituted arylsilyl of 6 to 20 carbon atoms, a cyano, a nitro, and a halogen, without a hydrogen or deuterium atom simultaneously given to both of $R_1$ and $R_2$.

Advantageous Effect

Having an anthracene derivative of a specific structure introduced into a light emitting layer thereof, the organic light emitting diode according to the present invention can evoke the delayed fluorescence according to Type III in the TTA phenomenon and is thus advantageous over conventional organic light emitting diodes in terms of luminous efficiency.

BEST MODE FOR INVENTION

Figure 1:
FIG. 1 and FIG. 2 illustrate light emission processes.
Figure 1:
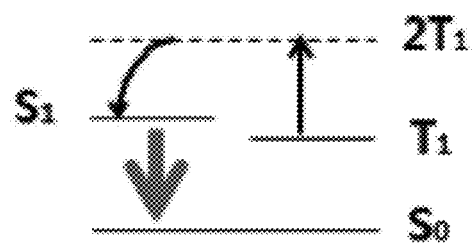

Hereinafter, exemplary embodiments which can be easily implemented by those skilled in the art will be described with reference to the accompanying drawings. In each drawing of the present disclosure, sizes or scales of components may be enlarged or reduced than their actual sizes or scales for better illustration, and known components are not depicted therein to clearly show features of the present disclosure. Therefore, the present disclosure is not limited to the drawings. When describing the principle of the embodiments of the present disclosure in detail, details of well-known functions and features may be omitted to avoid unnecessarily obscuring the presented embodiments.

In drawings, for convenience of description, sizes of components may be exaggerated for clarity. For example, since sizes and thicknesses of components in drawings are arbitrarily shown for convenience of description, the sizes and thicknesses are not limited thereto. Furthermore, throughout the description, the terms "on" and "over" are used to refer to the relative positioning, and mean not only that one component or layer is directly disposed on another component or layer but also that one component or layer is indirectly disposed on another component or layer with a further component or layer being interposed therebetween. Also, spatially relative terms, such as "below", "beneath", "lower", and "between", may be used herein for ease of description to refer to the relative positioning.

Throughout the specification, unless explicitly described to the contrary, the word "comprise" and variations such as "comprises" or "comprising" will be understood to imply the inclusion of stated elements but not the exclusion of any other elements.

An organic light emitting diode according to the present discloses comprises: a first electrode; a second electrode facing the first electrode; and a light emitting layer interposed between the first electrode and the second electrode, wherein the light-emitting layer contains at least one of the anthracene derivatives represented by the following Chemical Formula A and having an orbital energy level of TTA phenomenon-based singlet generation in which the second triplet excited orbital energy level ($T_2$) is higher than two times the lowest triplet excited orbital energy level ($T_1$) ($T_2 > 2T_1$):

[Chemical Formula A]

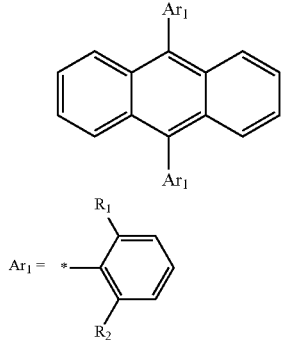

wherein,
"*" within $Ar_1$ denotes a bond to the carbon atom in the aromatic ring of the anthracene moiety, and
$R_1$ and $R_2$, which may be the same or different, are each independently selected from among a hydrogen atom, a deuterium atom, a substituted or unsubstituted alkyl of 1 to 20 carbon atoms, a substituted or unsubstituted aryl of 6 to 20 carbon atoms, a substituted or unsubstituted alkenyl of 2 to 20 carbon atoms, a substituted or unsubstituted alkynyl of 2 to 20 carbon atoms, a substituted or unsubstituted cycloalkyl of 3 to 20 carbon atoms, a substituted or unsubstituted cycloalkenyl of 5 to 20 carbon atoms, a substituted or unsubstituted heteroaryl of 2 to 20 carbon atoms, a substituted or unsubstituted heterocycloalkyl of 2 to 20 carbon atoms, a substituted or unsubstituted alkoxy of 1 to 20 carbon atoms, a substituted or unsubstituted aryloxy of 6 to 20 carbon atoms, a substituted or unsubstituted alkylthioxy of 1 to 20 carbon atoms, a substituted or unsubstituted arylthioxy of 6 to 20 carbon atoms, a substituted or unsubstituted akylsilyl of 1 to 20 carbon atoms, a substituted or unsubstituted arylsilyl of 6 to 20 carbon atoms, a cyano, a nitro, and a halogen, both of $R_1$ and $R_2$ being not a hydrogen or deuterium atom, simultaneously,
wherein the term "substituted" in the expression "substituted or unsubstituted" means having at least one substituent selected from the group consisting of a deuterium atom, a cyano, a halogen, a hydroxy, a nitro, an alkyl of 1 to 10 carbon atoms, a halogenated alkyl of 1 to 10 carbon atoms, an alkenyl of 1 to 10 carbon atoms, an alkynyl of 1 to 10 carbon atoms, a heteroalkyl of 1 to 10 carbon atoms, an aryl of 6 to 12 carbon atoms, an arylalkyl of 6 to 12 carbon atoms, a heteroaryl of 2 to 12 carbon atoms or a heteroarylalkyl of 2 to 12 carbon atoms, an alkoxy of 1 to 10 carbon atoms, an alkylamino of 1 to 10 carbon atoms, an arylamino of 6 to 12 carbon atoms, a hetero arylamino of 1 to 12 carbon atoms, an alkylsilyl of 1 to 10 carbon atoms, an arylsilyl of 6 to 12 carbon atoms, and an aryloxy of 1 to 12 carbon atoms.

The expression indicating the number of carbon atoms, such as "a substituted or unsubstituted alkyl of 1 to 30 carbon atoms", "a substituted or unsubstituted aryl of 5 to 50 carbon atoms", etc. means the total number of carbon atoms of, for example, the alkyl or aryl radical or moiety alone, exclusive of the number of carbon atoms of substituents attached thereto. For instance, a phenyl group with a butyl at the para position falls within the scope of an aryl of 6 carbon atoms, even though it is substituted with a butyl radical of 4 carbon atoms.

As used herein, the term "aryl" means an organic radical derived from an aromatic hydrocarbon by removing one hydrogen that is bonded to the aromatic hydrocarbon. It may be a single or fused aromatic system including a 5- to 7-membered ring, and preferably a 5- to 6-membered ring. Further, the aromatic system may include a fused ring that is formed by adjacent substituents on the aryl radical.

Examples of the aryl include phenyl, naphthyl, biphenyl, terphenyl, anthryl, indenyl, fluorenyl, phenanthryl, triperylenyl, pyrenyl, perylenyl, chrysenyl, naphthacenyl, and fluoranthenyl, but are not limited thereto.

At least one hydrogen atom of the aryl may be substituted by a deuterium atom, a halogen atom, a hydroxy, a nitro, a cyano, a silyl, an amino (—$NH_2$, —NH(R), —N(R') (R") wherein R' and R" are each independently an alkyl of 1 to 10 carbon atoms, in this case, called "alkylamino"), an amidino, a hydrazine, a hydrazone, a carboxyl, a sulfonic acid, a phosphoric acid, an alkyl of 1 to 24 carbon atoms, a halogenated alkyl of 1 to 24 carbon atoms, an alkenyl of 1 to 24 carbon atoms, an alkynyl of 1 to 24 carbon atoms, a heteroalkyl of 1 to 24 carbon atoms, an aryl of 6 to 24 carbon atoms, an arylalkyl of 6 to 24 carbon atoms, a heteroaryl of 2 to 24 carbon atoms, or a heteroarylalkyl of 2 to 24 carbon atoms.

The heteroaryl substituent used in the compound of the present disclosure refers to a hetero aromatic radical of 2 to 24 carbon atoms bearing 1 to 4 heteroatoms selected from among N, O, P, Se, Te, Si, Ge, and S. In the aromatic radical, two or more rings may be fused. One or more hydrogen atoms on the heteroaryl may be substituted by the same substituents as on the aryl.

Examples of the alkyl substituent useful in the present disclosure include methyl, ethyl, propyl, isopropyl, isobutyl, sec-butyl, tert-butyl, pentyl, iso-amyl, and hexyl. At least one hydrogen atom of the alkyl may be substituted by the same substituent as in the aryl.

Examples of the alkoxy substituent useful in the present disclosure include methoxy, ethoxy, propoxy, isobutyloxy, sec-butyloxy, pentyloxy, iso-amyloxy, and hexyloxy. At least one hydrogen atom of the alkoxy may be substituted by the same substituent as in the aryl.

Representative among examples of the silyl useful in the present disclosure are trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl. One or more hydrogen atoms of the silyl may be substituted by the same substituent as in the aryl.

The compound represented by Chemical Formula A has a phenyl group attached to the anthracene moiety thereof at positions 9 and 10 wherein the phenyl group has identical substituents $R_1$ and $R_2$ bonded thereto at the ortho position, without a hydrogen or deuterium atom simultaneously given to both of $R_1$ and $R_2$.

Given as a host within a light emitting layer in an organic light emitting diode, the anthracene derivative having the structure can bring about the effect of Type III according to the TTA phenomenon and improve the luminous efficiency in the light emitting diode.

In addition, the substituents $R_1$ and $R_2$ in the anthracene derivative represented by Chemical Formula A may be the same or different.

Here, the substituents $R_1$ and $R_2$ in the anthracene derivatives represented by Chemical Formula A are the same or different and are each independently selected preferably from among a substituted or unsubstituted alkyl of 1 to 5 carbon atoms, a substituted or unsubstituted aryl of 6 to 12 carbon atoms, a substituted or unsubstituted cycloalkyl of 3 to 8 carbon atoms, a substituted or unsubstituted heteroaryl of 2 to 12 carbon atoms, a substituted or unsubstituted alkoxy of 1 to 5 carbon atoms, a substituted or unsubstituted aryloxy of 6 to 12 carbon atoms, a substituted or unsubstituted alkylthioxy of 1 to 5 carbon atoms, a substituted or unsubstituted arylthioxy of 6 to 12 carbon atoms, a cyano, a nitro, and a halogen and more preferably from among a substituted or unsubstituted alkyl of 1 to 5 carbon atoms, a substituted or unsubstituted aryl of 6 to 12 carbon atoms, a cyano, and a halogen such as F, Cl, Br, and I.

In greater detail, the anthracene derivative represented by Chemical Formula A may be one selected from the following Compounds 1 to 6, but is not limited thereto:

[Compound 1]

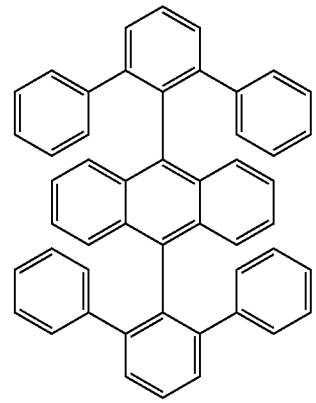

[Compound 2]

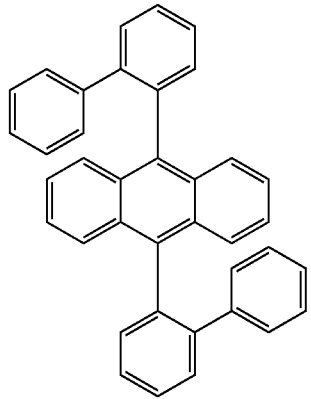

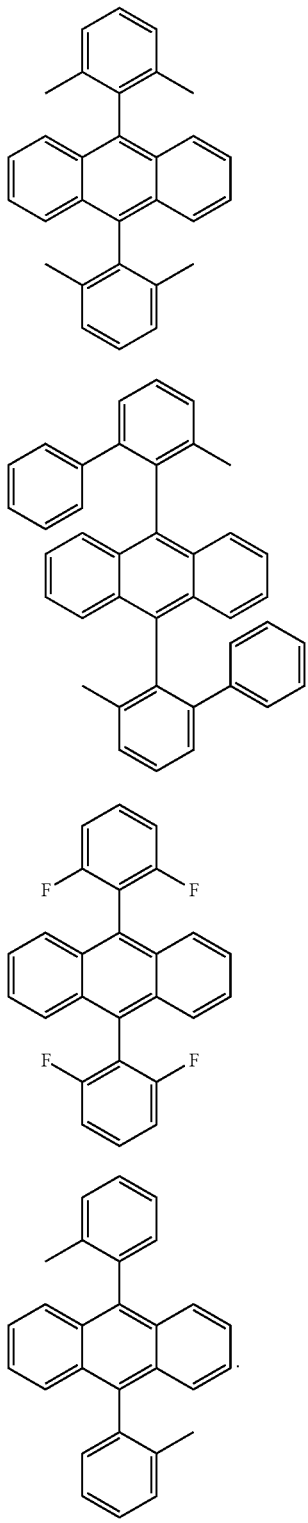

[Compound 3]

[Compound 4]

[Compound 5]

[Compound 6]

According to some particular embodiments of the present disclosure, the organic light-emitting diode may comprise at least one of a hole injection layer, a hole transport layer, a functional layer capable of both hole injection and hole transport, an electron transport layer, and an electron injection layer, in addition to the light-emitting layer.

Below, the organic light-emitting diode of the present disclosure is explained with reference to the drawings.

Figure 2:
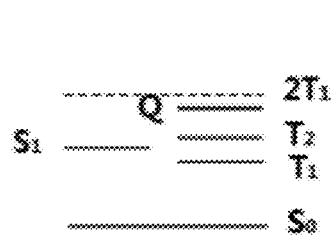
Figure 2:
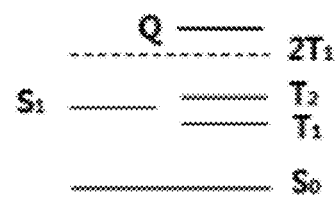
Figure 2:
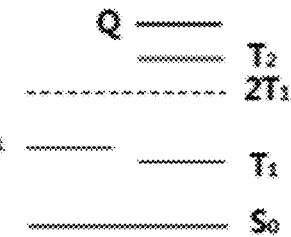
Figure 3:
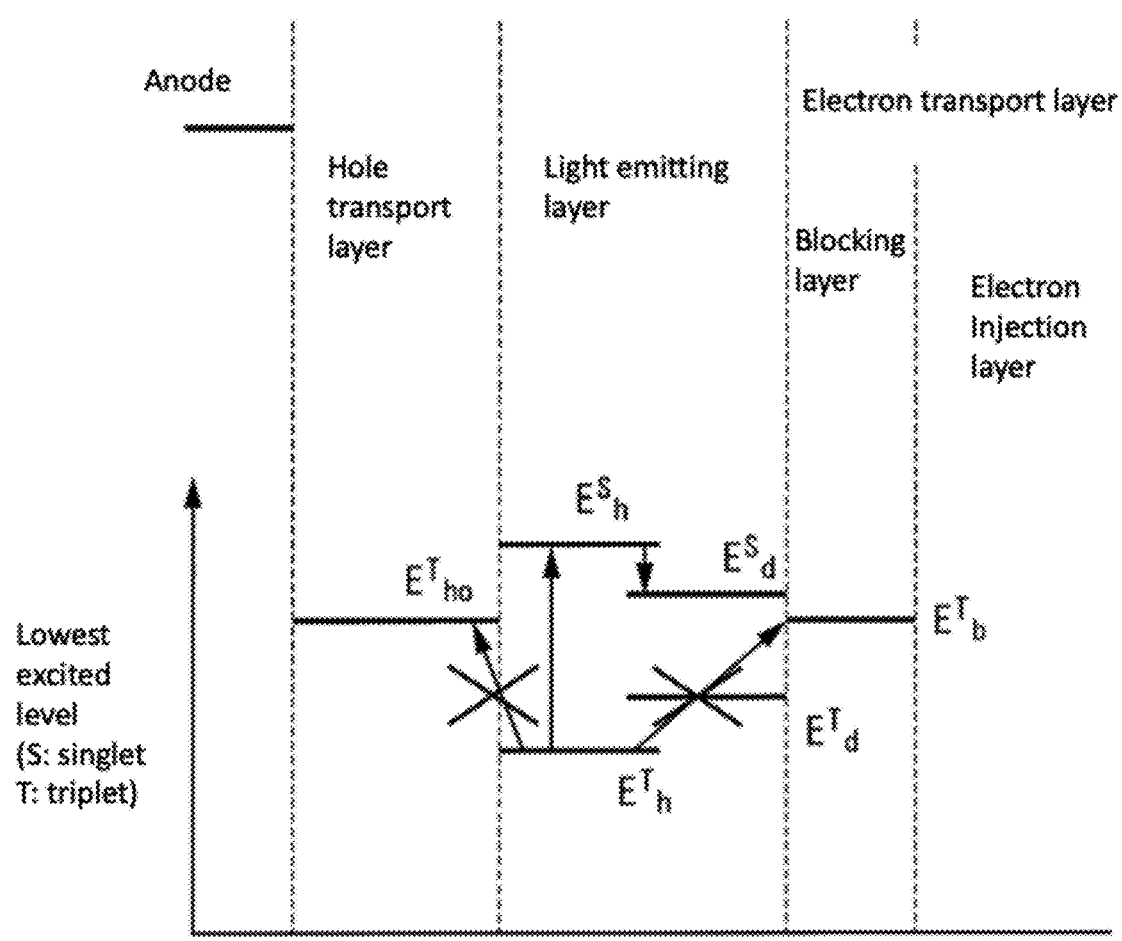
FIG. 3 is a diagram illustrating an energy level structure of a conventional organic light emitting diode that is designed to improve in luminous efficiency by augmenting the TTF phenomenon.
Figure 4:
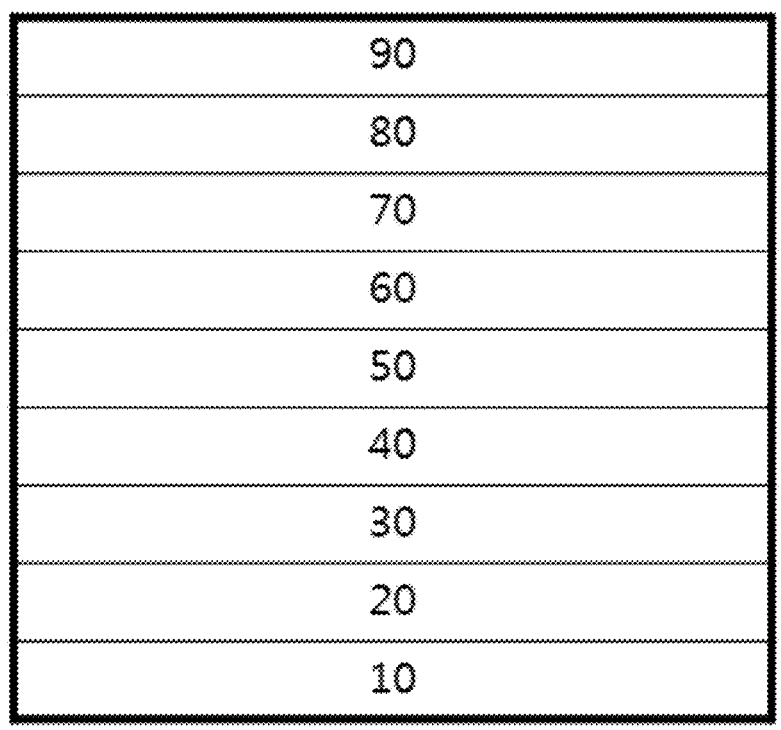
FIG. 4 is a schematic view of an organic light-emitting diode according to an embodiment of the present disclosure.

FIG. 2 is a schematic cross-sectional view of the structure of an organic light-emitting diode according to some embodiments of the present disclosure.

As shown in FIG. 2, the organic light-emitting diode according to the present disclosure comprises an anode 20, a hole transport layer 40, an organic light-emitting layer 50, an electron transport layer 60, and a cathode 80, and optionally a hole injection layer 30 and an electron injection layer 70. In addition, one or two intermediate layers may be further formed in the organic light-emitting diode.

Reference is made to FIG. 2 with regard to the organic light-emitting diode of the present disclosure and the fabrication thereof. First, a substrate 10 is coated with an anode electrode material to form an anode 20. So long as it is used in a typical organic EL device, any substrate may be used as the substrate 10. Preferable is an organic substrate or transparent plastic substrate that exhibits excellent transparency, surface smoothness, ease of handling, and waterproofness. As the anode electrode material, indium tin oxide (ITO), indium zinc oxide (IZO), tin oxide ($SnO_2$), or zinc oxide (ZnO), which are transparent and superior in terms of conductivity, may be used.

A hole injection layer material is applied on the anode 20 by thermal deposition in a vacuum or by spin coating to form a hole injection layer 30. Subsequently, thermal deposition in a vacuum or by spin coating may also be conducted to form a hole transport layer 40 with a hole transport layer material on the hole injection layer 30.

No particular limitations are imparted to the hole injection layer material, as long as it is one that is typically used in the art. For example, mention may be made of 2-TNATA [4,4',4"-tris(2-naphthylphenyl-phenylamino)-triphenylamine], NPD [N,N'-di(l-naphthyl)-N,N'-diphenylbenzidine], TPD [N,N'-diphenyl-N,N'-bis(3-methylphenyl)-1,1'-biphenyl-4,4'-diamine], or DNTPD [N,N'-diphenyl-N,N'-bis-[4-(phenyl-m-tolyl-amino)-phenyl]-biphenyl-4,4'-diamine], but the present disclosure is not limited thereby.

So long as it is typically used in the art, any material may be selected for the hole transport layer without particular limitation. Examples include, but are not limited to, N,N'-bis(3-methylphenyl)-N,N'-diphenyl-[1,1-biphenyl]-4,4'-diamine (TPD) and N,N'-di(naphthalen-1-yl)-N,N'-diphenyl-benzidine (a-NPD).

Then, an organic light-emitting layer 50 is deposited on the hole transport layer 40 by deposition in a vacuum or by spin coating. In some embodiments of the present disclosure, the light-emitting layer particularly ranges in thickness from 50 to 2,000 Å.

Here, the light-emitting layer includes a host and a dopant, wherein the organic compound represented by Chemical Formula A may be used as the host.

In addition to the compound represented by Chemical Formula A, an additional host material may be employed in the light emitting layer. Moreover, the light emitting layer may contain a dopant material together with the host compound.

The additional host available in the light emitting layer according to the present disclosure include at least one of the compounds represented by the following Chemical Formula 1A:

[Chemical Formula 1A]

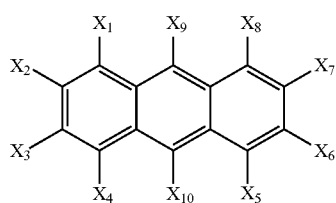

wherein, $X_1$ to $X_{10}$, which may be the same or different, are each independently selected from the group consisting of a hydrogen atom, a deuterium atom, a substituted or unsubstituted alkyl of 1 to 30 carbon atoms, a substituted or unsubstituted alkenyl of 2 to 30 carbon atoms, a substituted or unsubstituted cycloalkyl of 3 to 30 carbon atoms, a substituted or unsubstituted cycloalkenyl of 5 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted aryl of 5 to 50 carbon atoms, a substituted or unsubstituted heteroaryl of 3 to 50 carbon atoms bearing O, N, or S as a heteroatom, a substituted or unsubstituted silicone, a substituted or unsubstituted boron, a substituted or unsubstituted silane, a carbonyl, a phosphoryl, an amino, a nitrile, a hydroxy, a nitro, a halogen, an amide, and an ester, wherein adjacent groups of $X_1$ to $X_{10}$ may form an aliphatic, an aromatic, a heteroaliphatic, or a heteroaromatic fused ring.

In greater detail, the host may be selected from the group consisting of the following [Compound 1] to [Compound 196], but is not limited thereto:

[Compound 1]

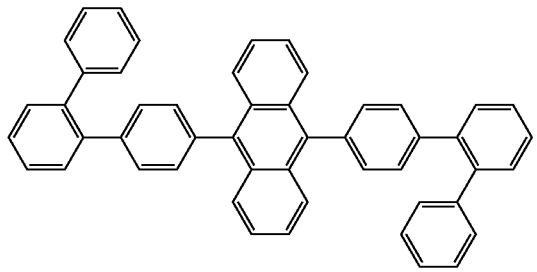

[Compound 2]

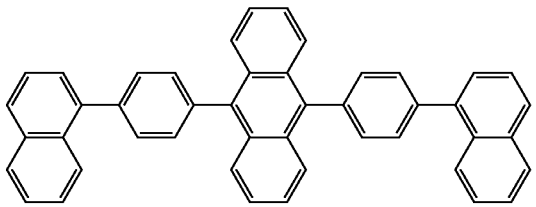

[Compound 3]

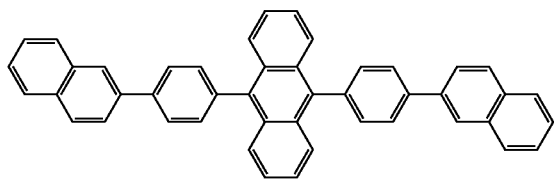

[Compound 4]

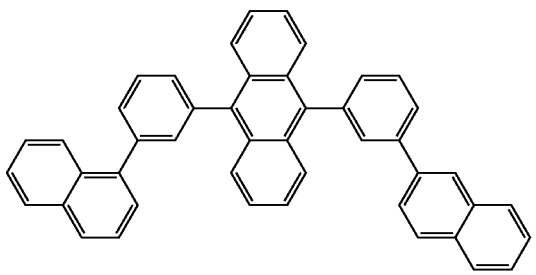

[Compound 5]

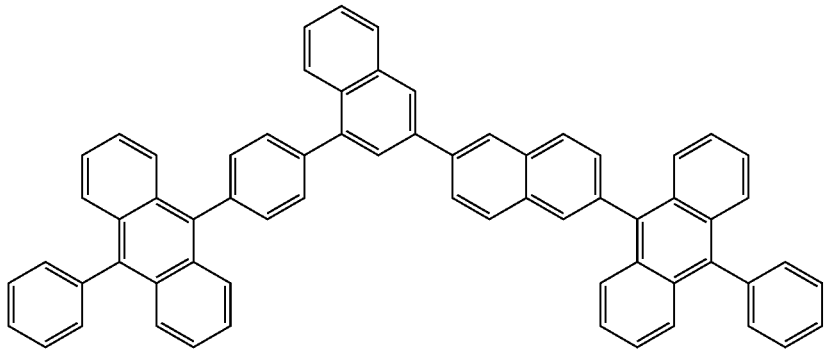

[Compound 6]
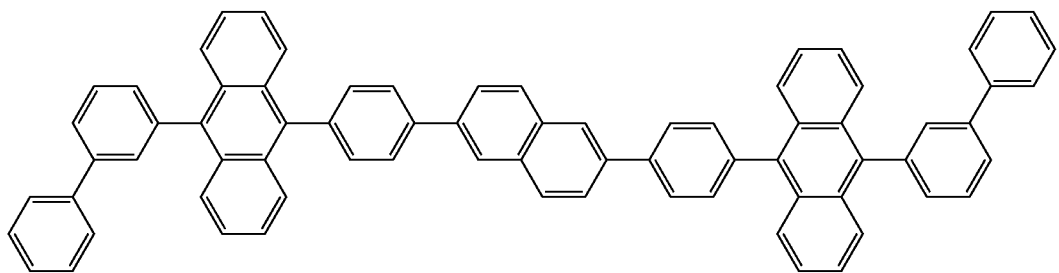
[Compound 7]
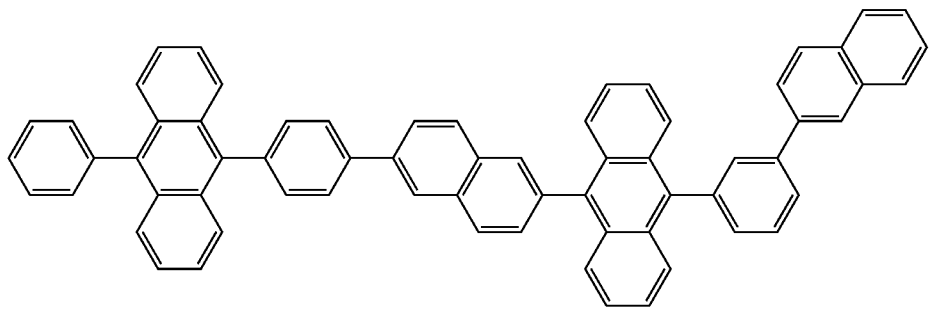
[Compound 8]
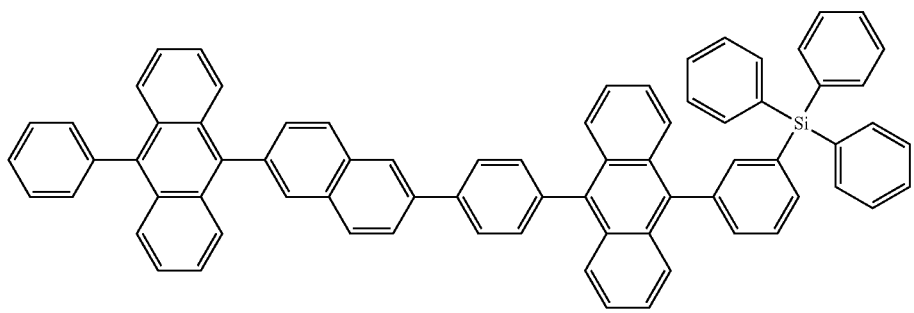
[Compound9]
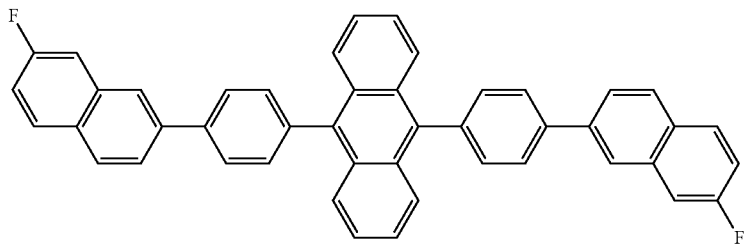
[Compound10]
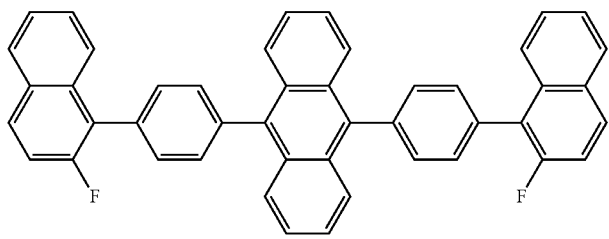

[Compound11]
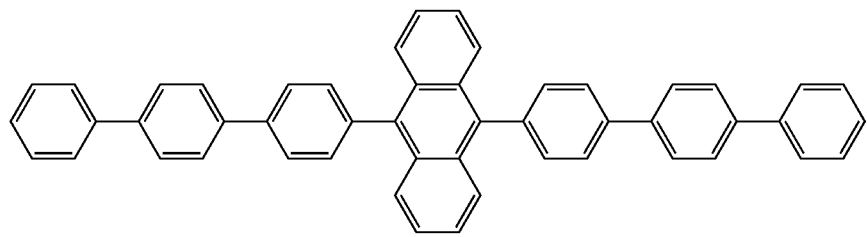
[Compound12]
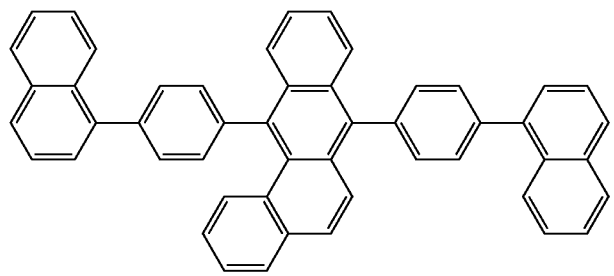
[Compound13]
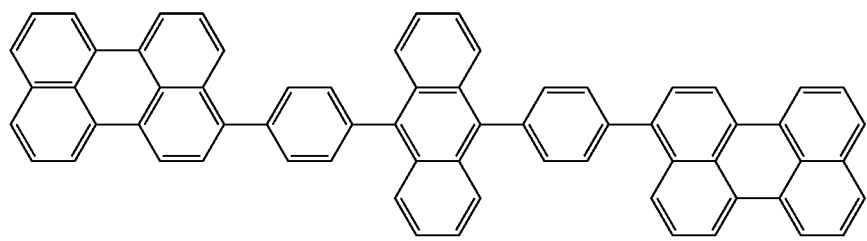
[Compound14]
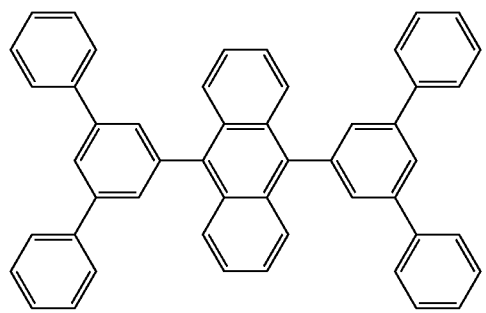
[Compound15]
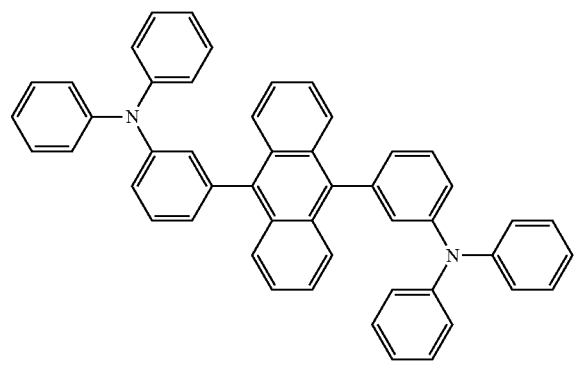
[Compound16]
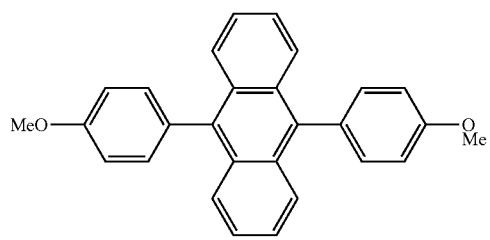

[Compound17]
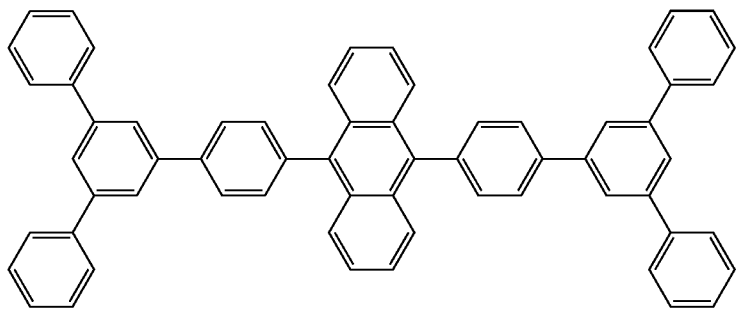
[Compound18]
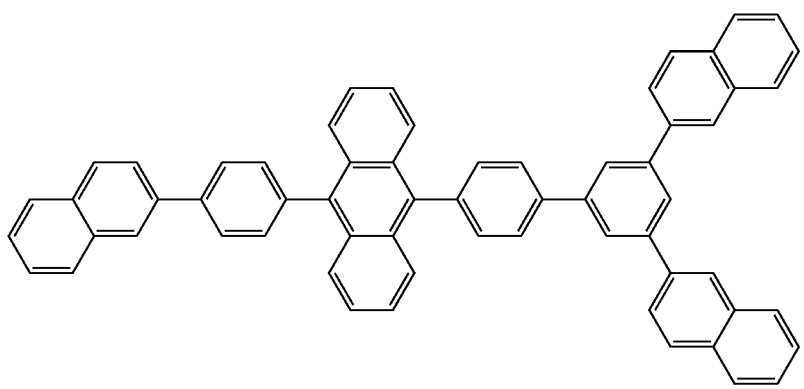
[Compound19]
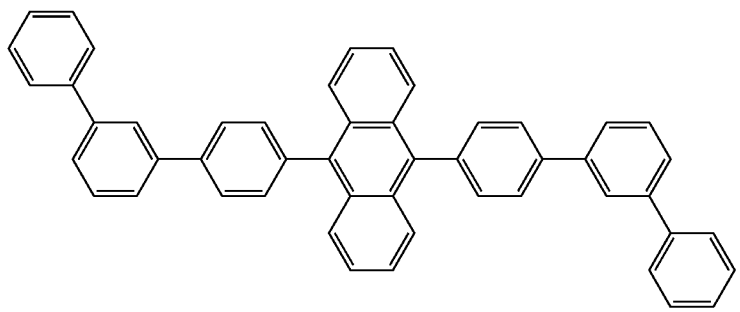
[Compound20]
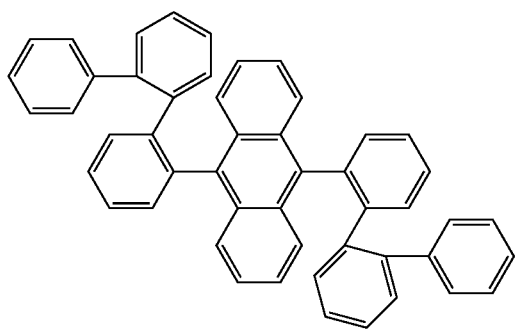
[Compound21]
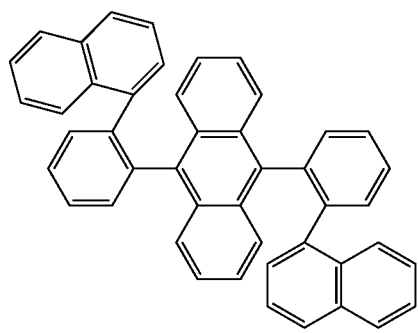

-continued
[Compound22]
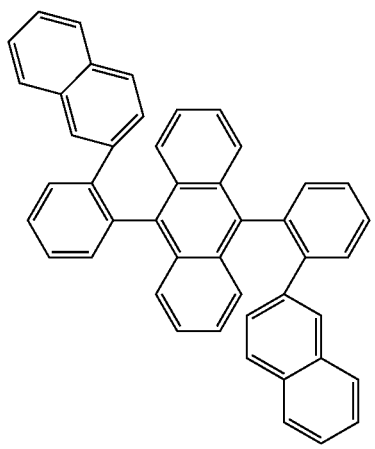
[Compound23]
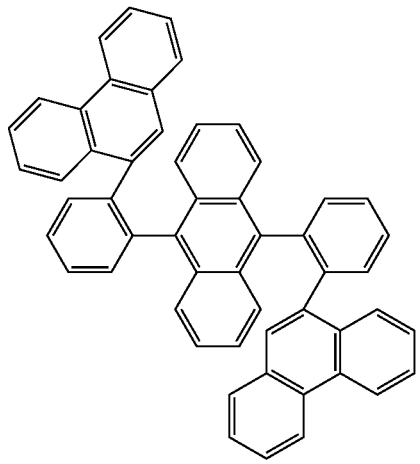
[Compound24]
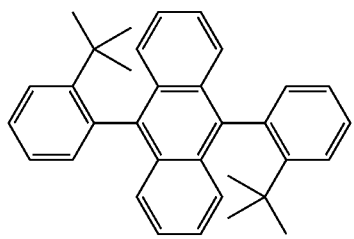
[Compound25]
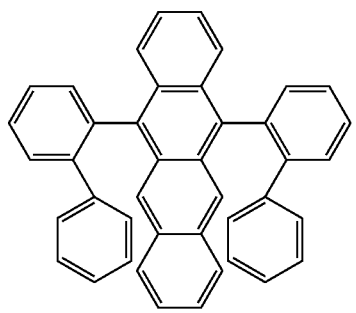
[Compound26]
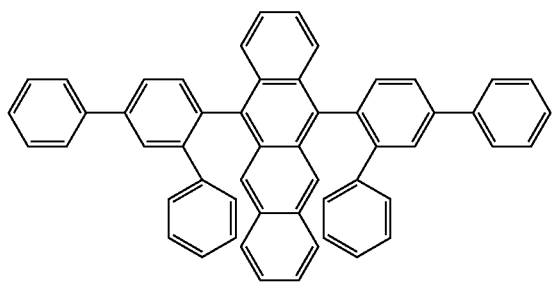
[Compound27]
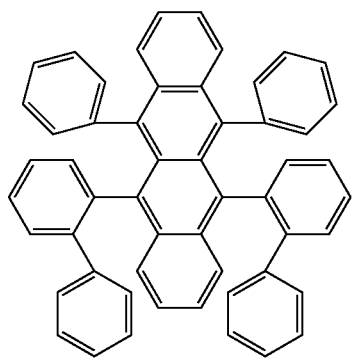
[Compound28]
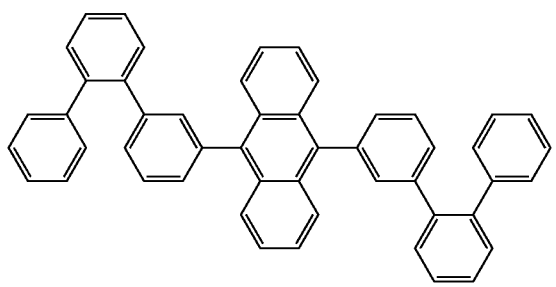
[Compound29]
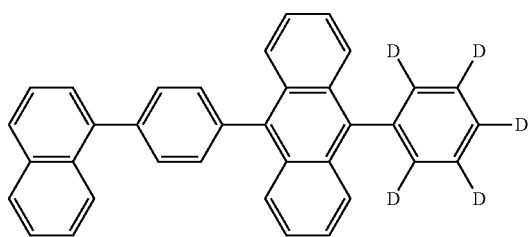

-continued
[Compound30]
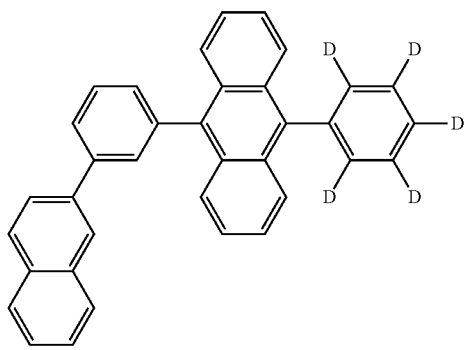
[Compound31]
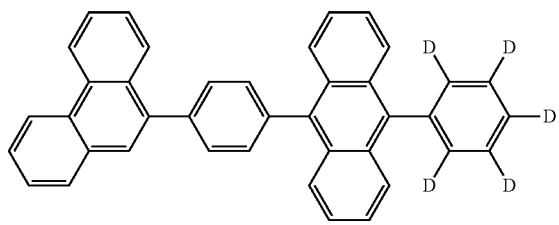
[Compound32]
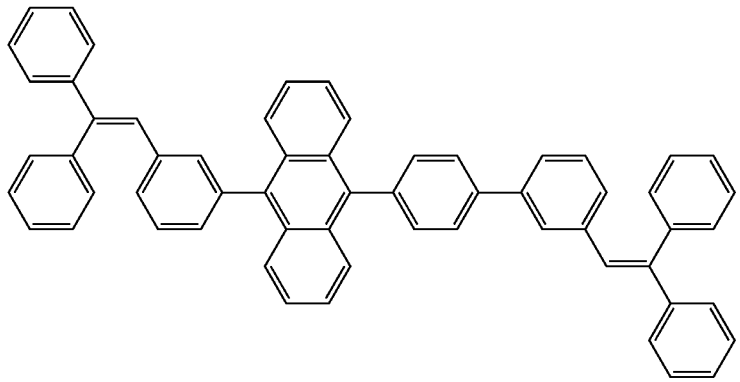
[Compound33]
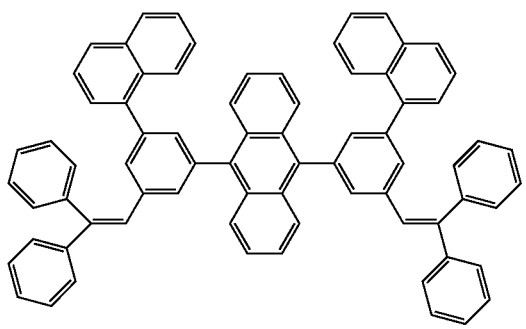
[Compound34]
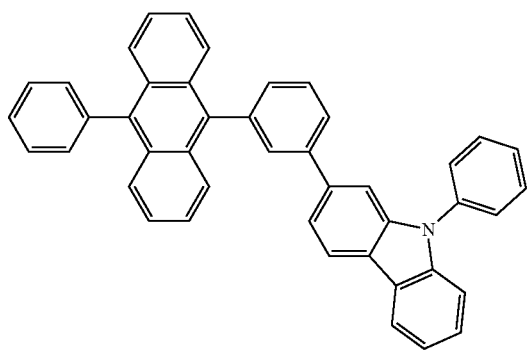
[Compound35]
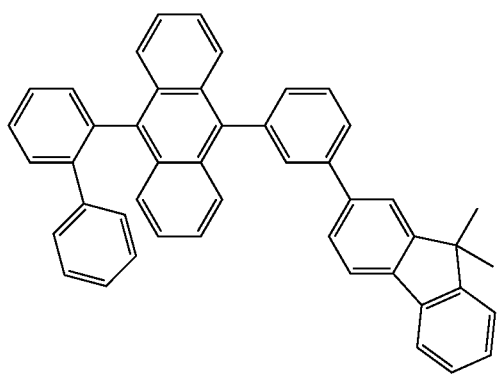
[Compound36]
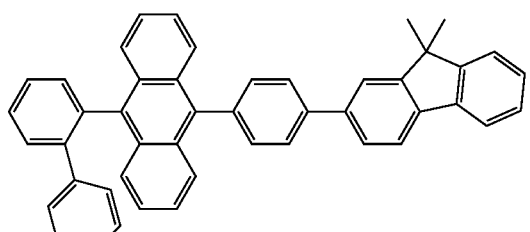

-continued
[Compound37]
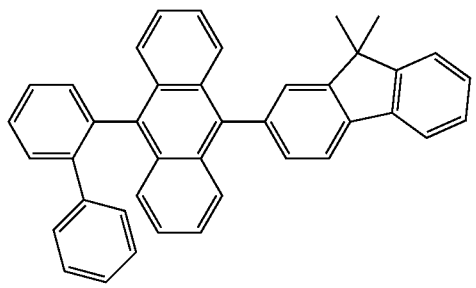
[Compound38]
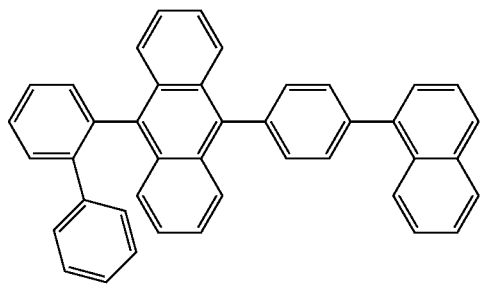
[Compound39]
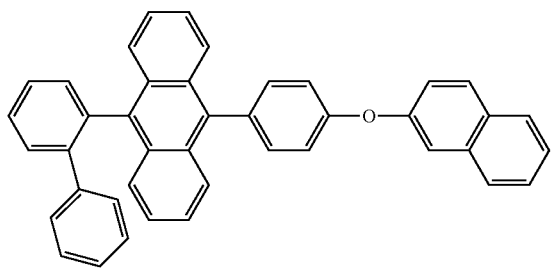
[Compound40]
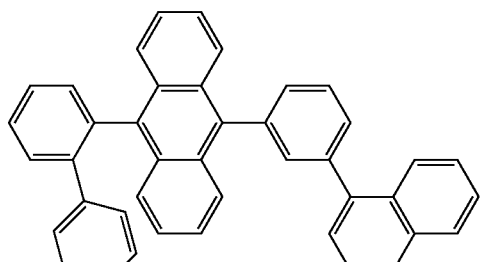
[Compound41]
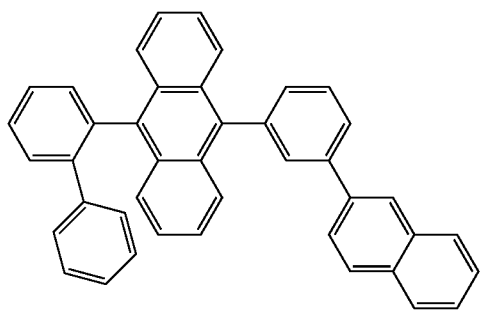
[Compound42]
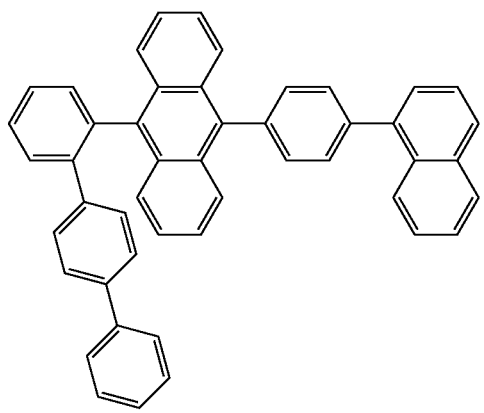
[Compound43]
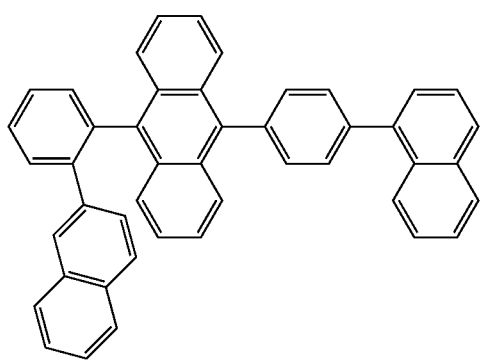
[Compound44]
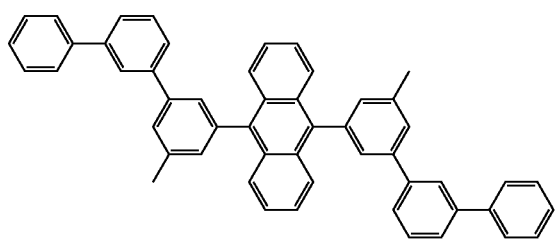

-continued
[Compound45]
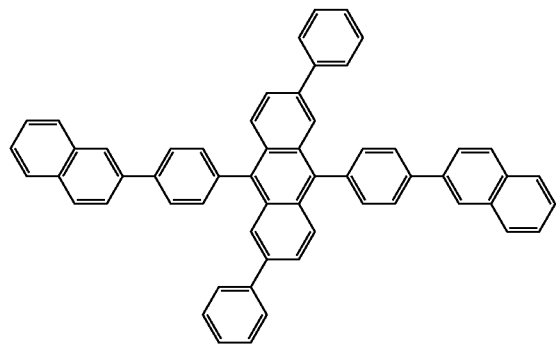
[Compound46]
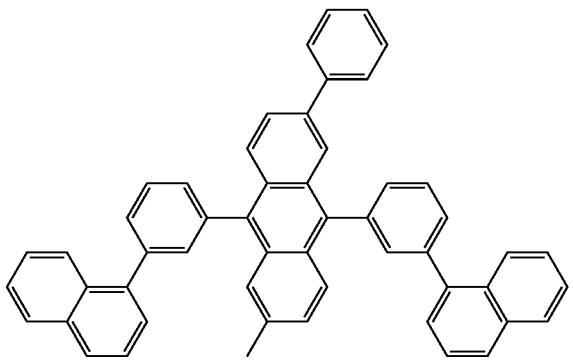
[Compound47]
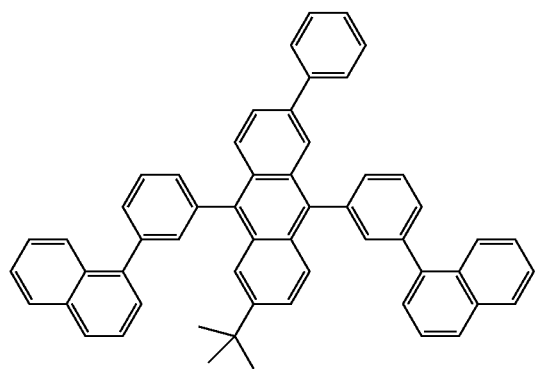
[Compound48]
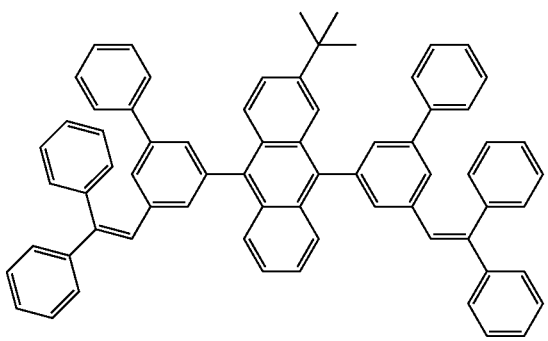
[Compound49]
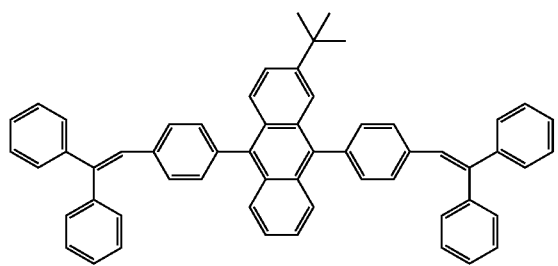
[Compound50]
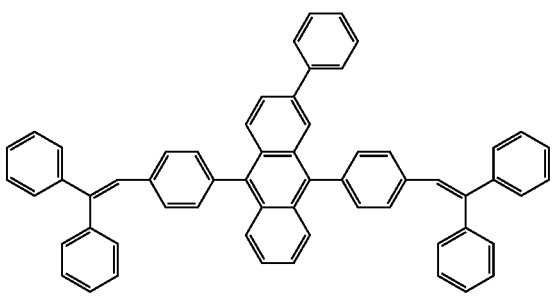
[Compound51]
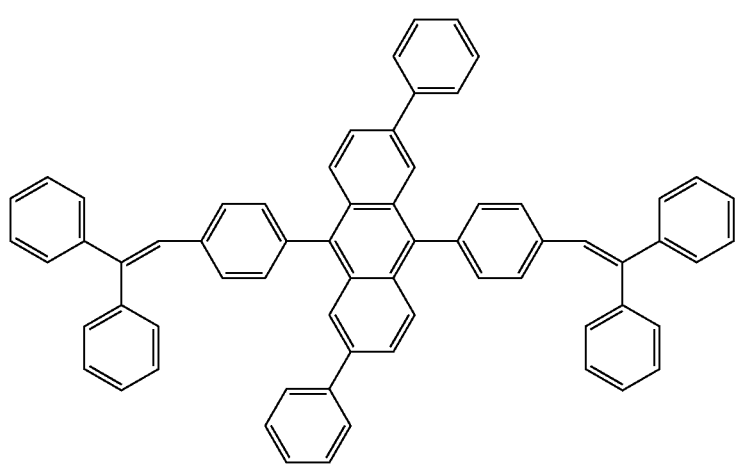

[Compound52]
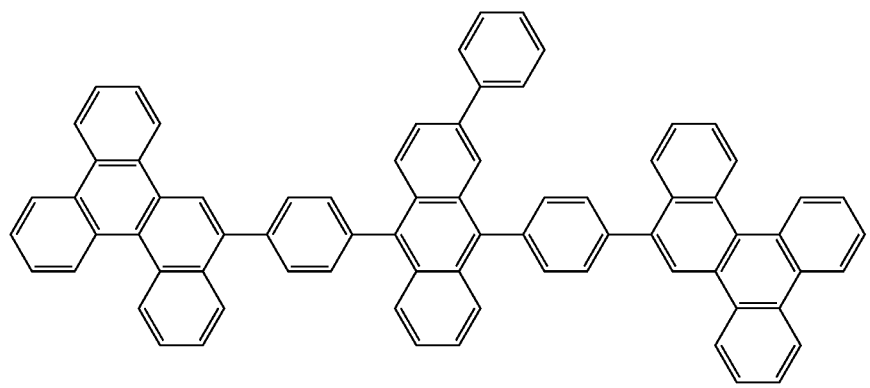
[Compound53]
[Compound54]
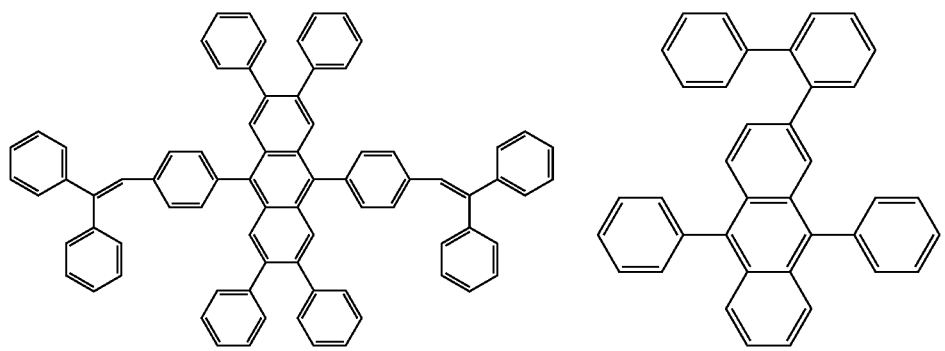
[Compound55]
[Compound56]
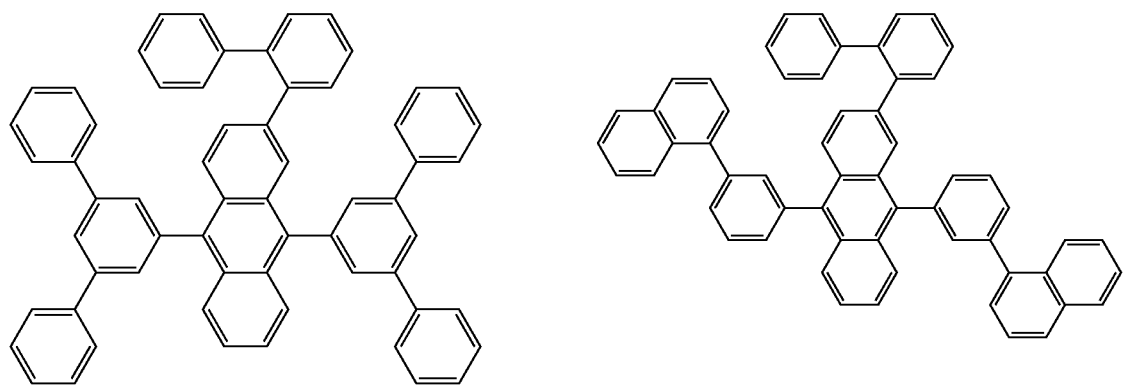
[Compound57]
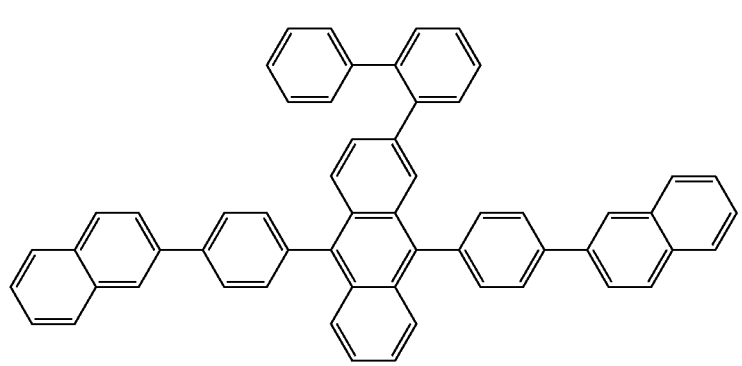

-continued
[Compound58]
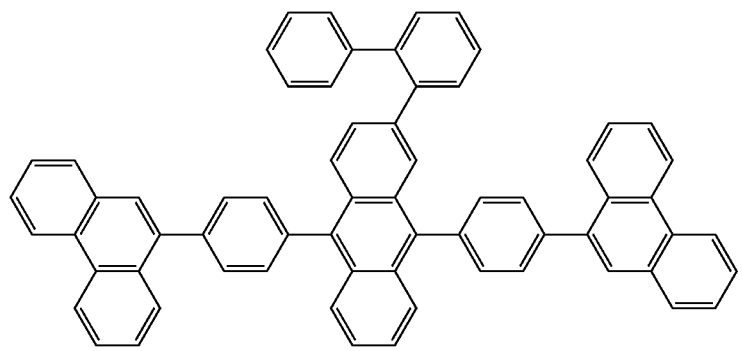
[Compound59]
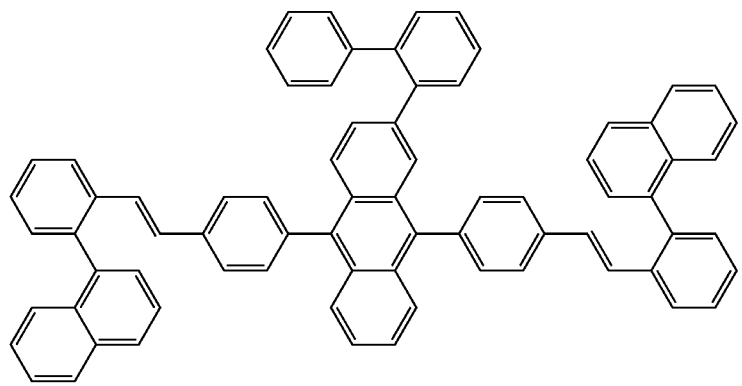
[Compound60]
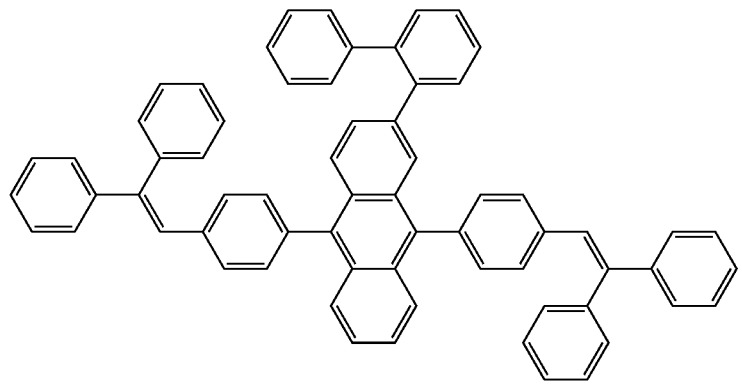
[Compound61]
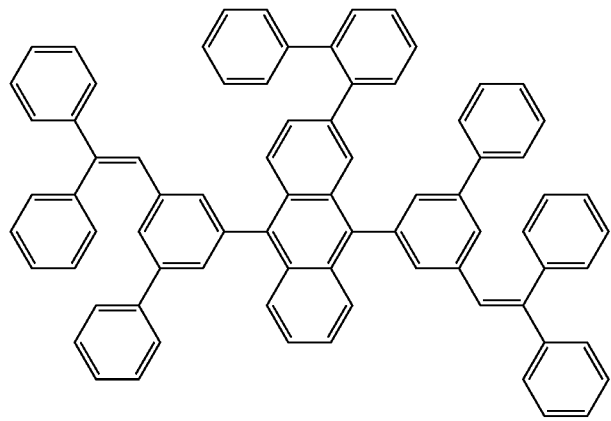

-continued
[Compound62]
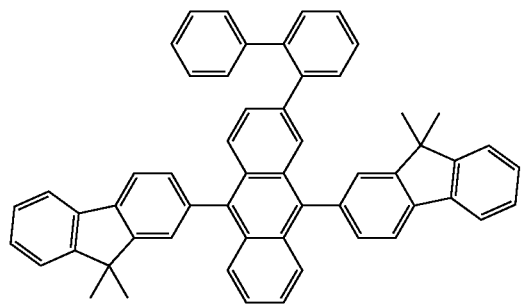
[Compound63]
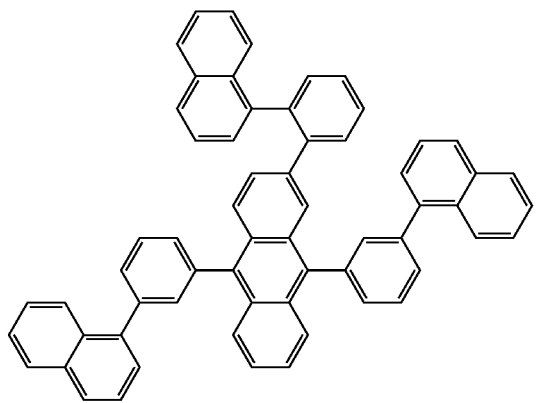
[Compound64]
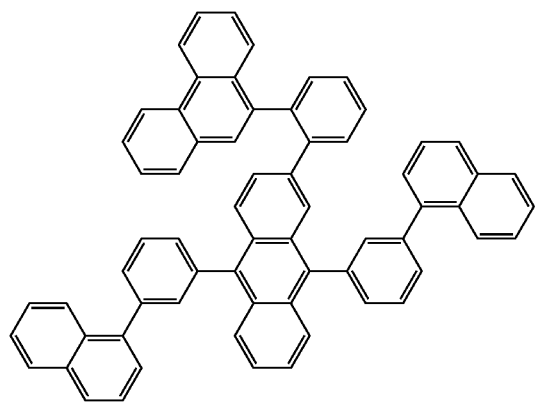
[Compound65]
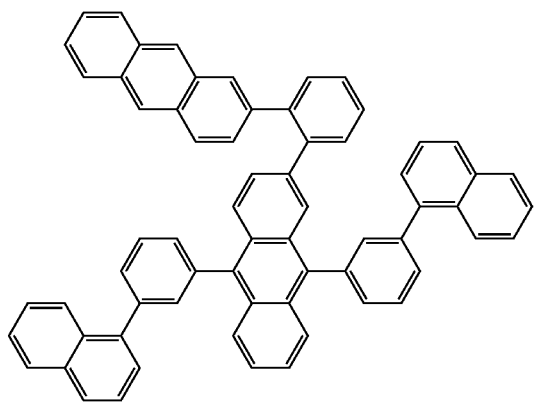
[Compound66]
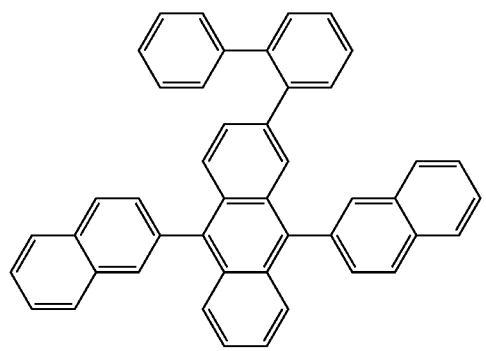
[Compound67]
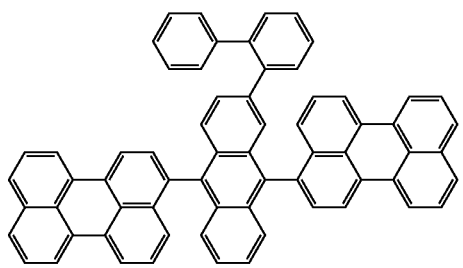
[Compound68]
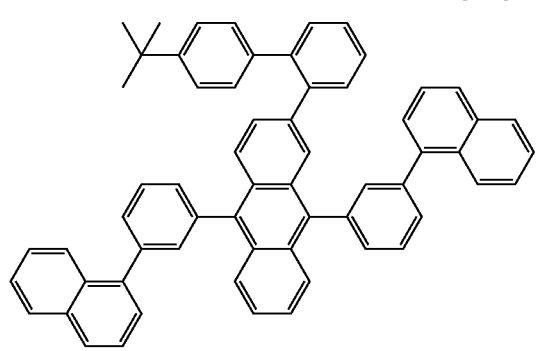
[Compound69]
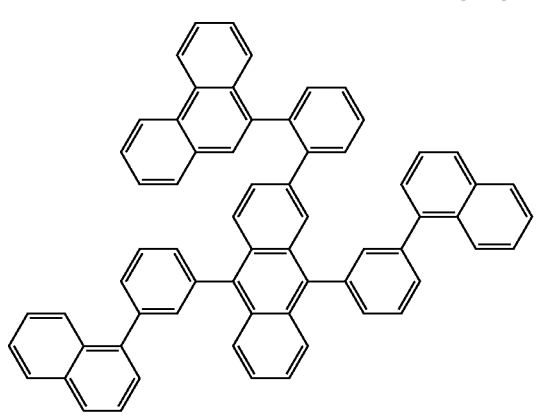

[Compound70]
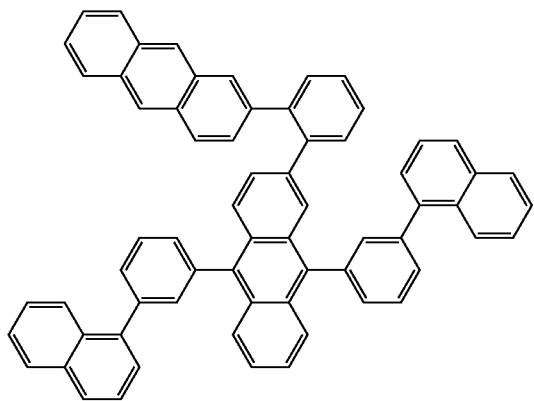
[Compound71]
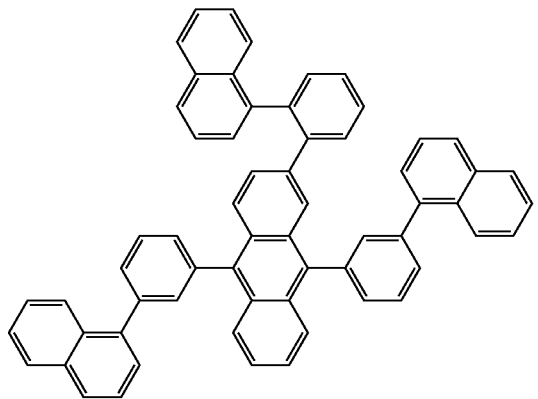
[Compound72]
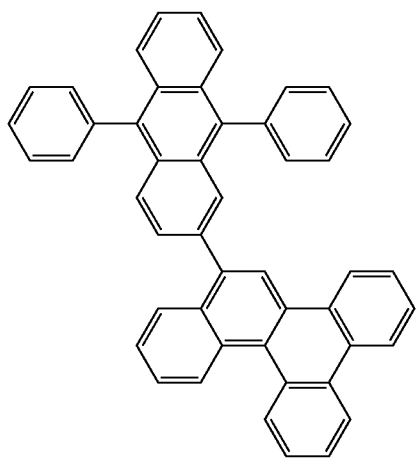
[Compound73]
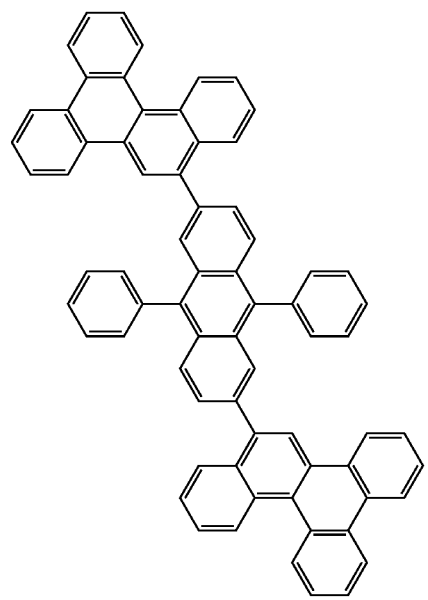
[Compound74]
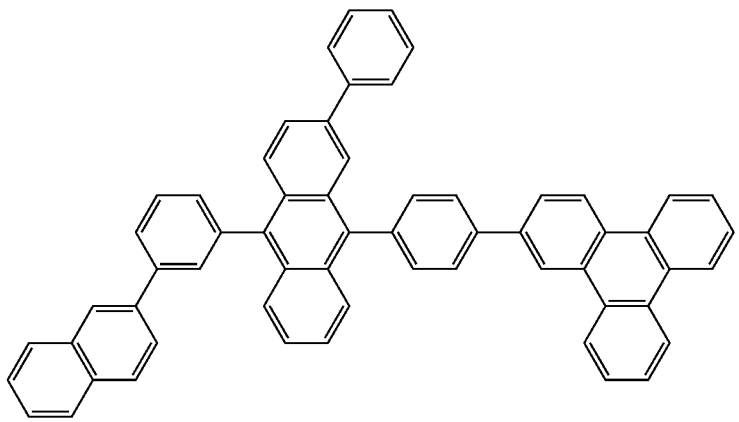

[Compound75]
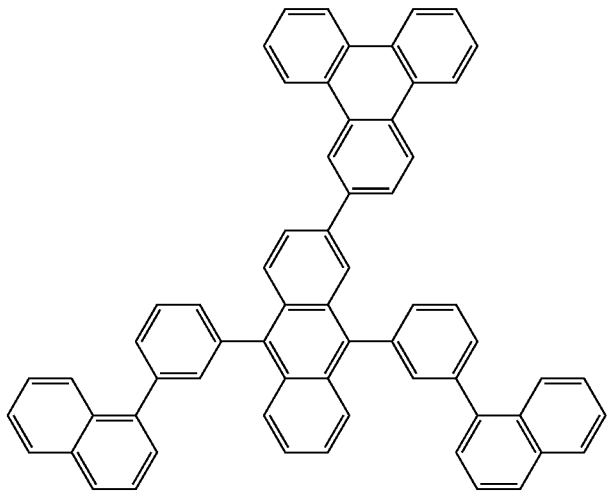
[Compound76]
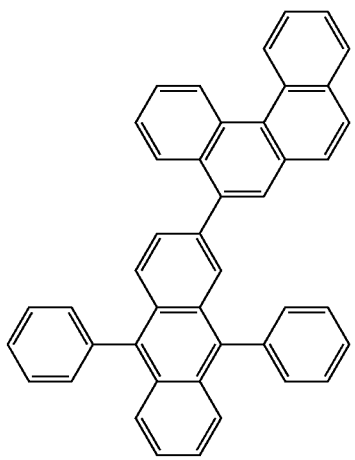
[Compound77]
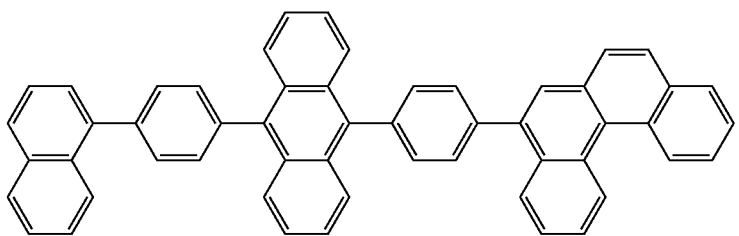
[Compound78]
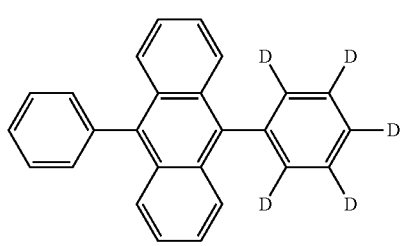
[Compound79]
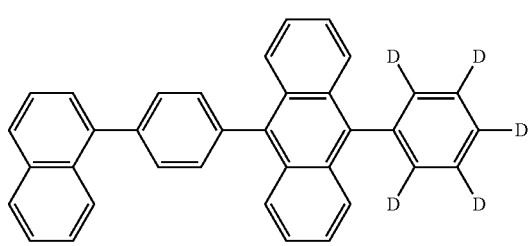

-continued
[Compound80]
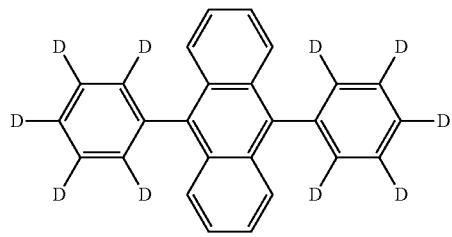
[Compound81]
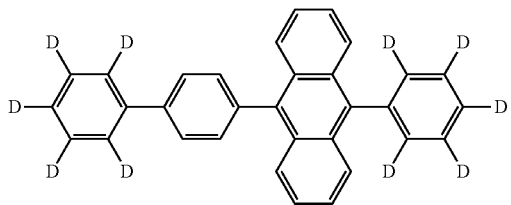
[Compound82]
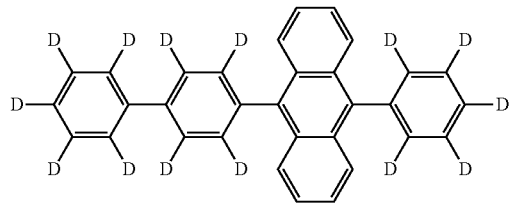
[Compound83]
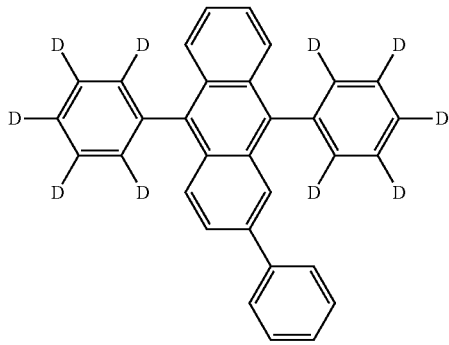
[Compound84]
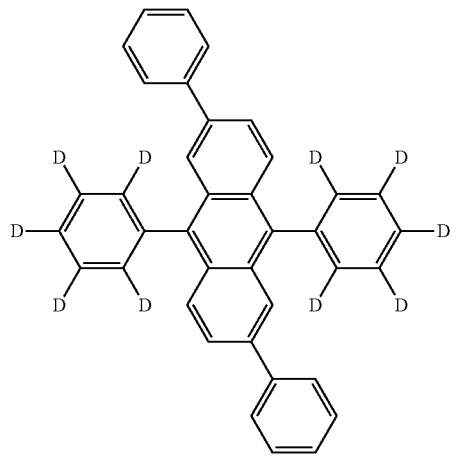
[Compound85]
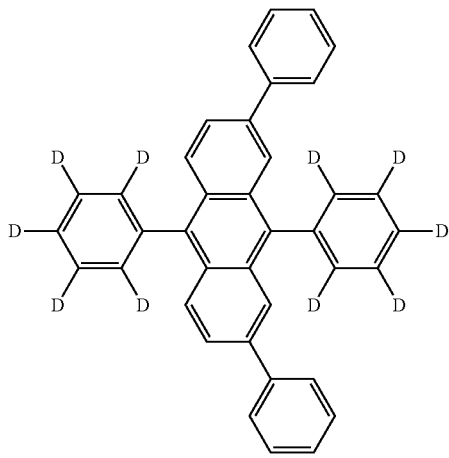
[Compound86]
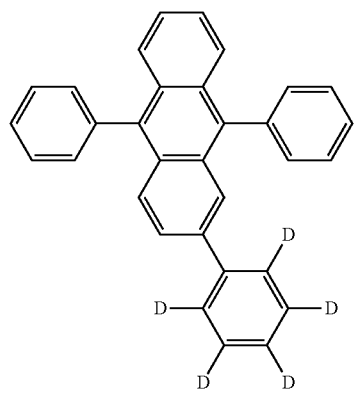
[Compound87]
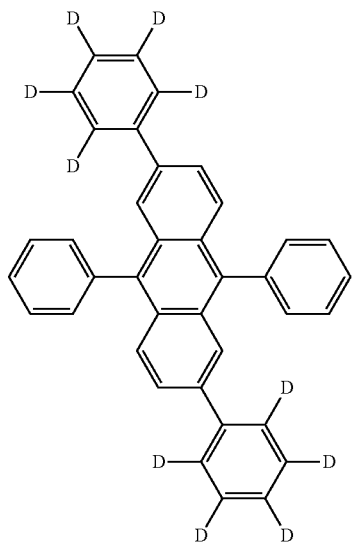

-continued
[Compound88]
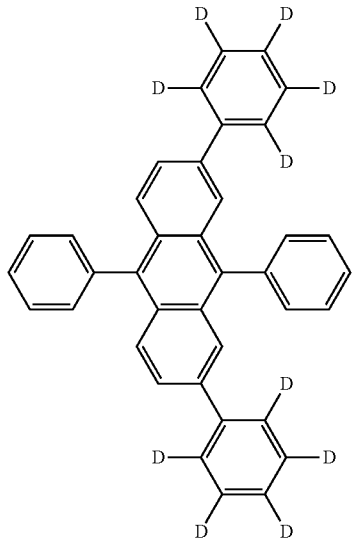
[Compound89]
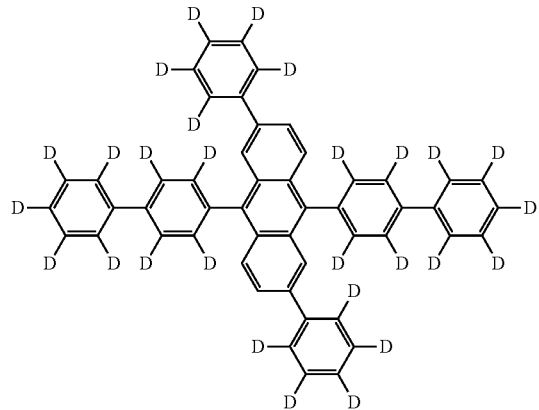
[Compound90]
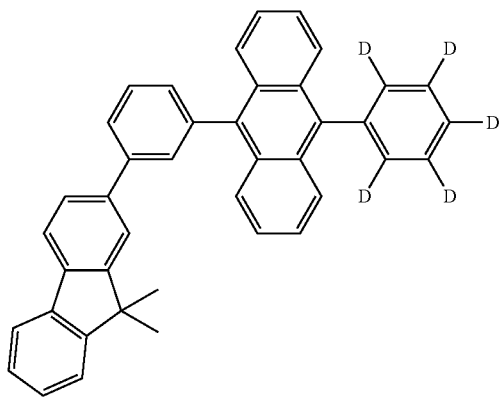
[Compound91]
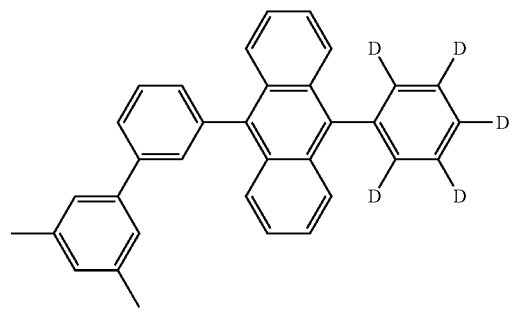
[Compound92]
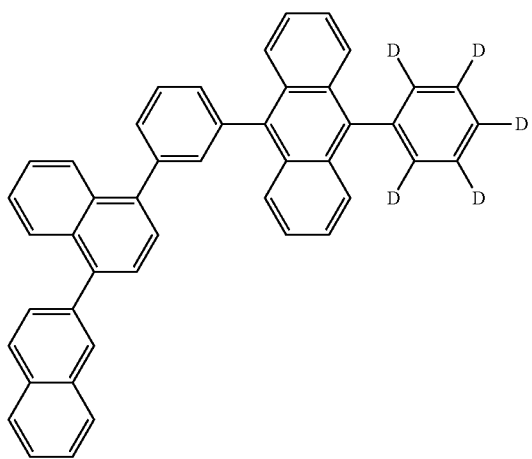
[Compound93]
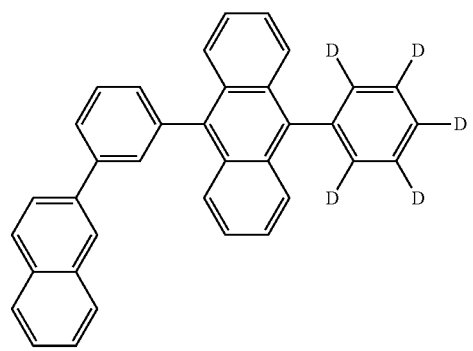

[Compound94]
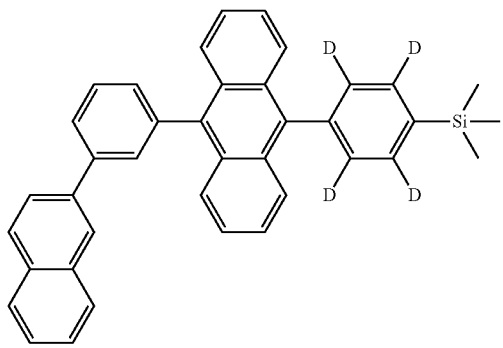
[Compound95]
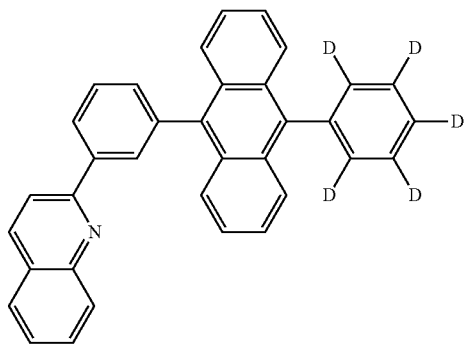
[Compound96]
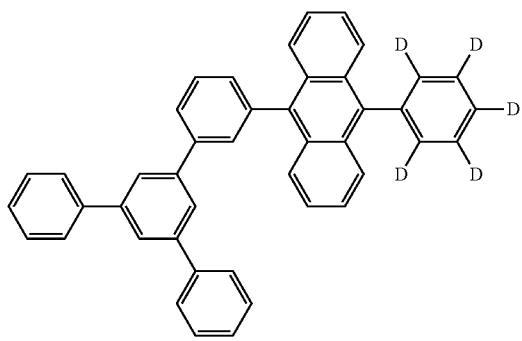
[Compound97]
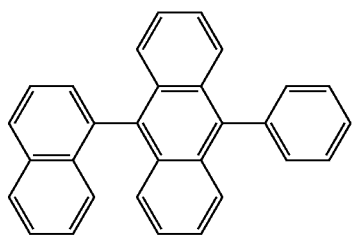
[Compound98]
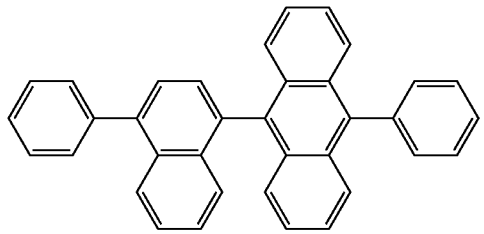
[Compound99]
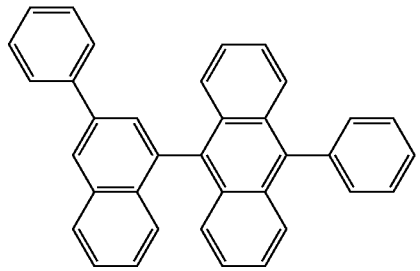
[Compound100]
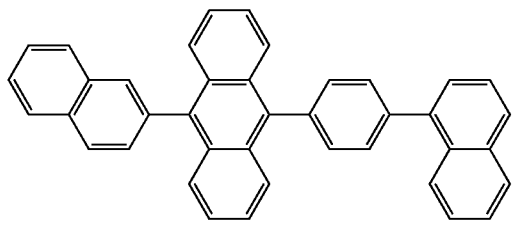
[Compound101]
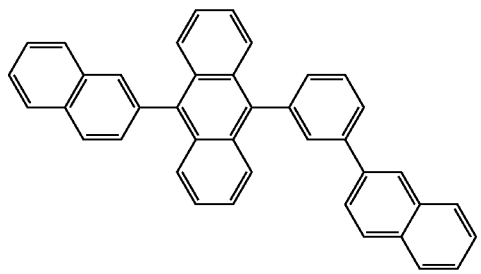
[Compound102]
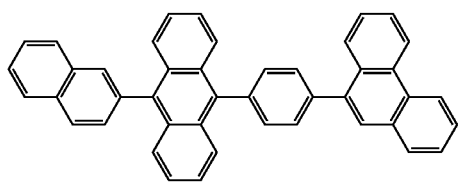
[Compound103]
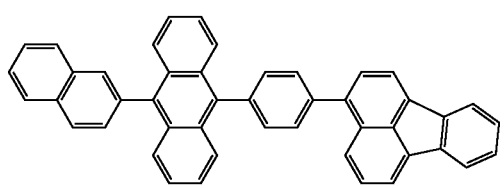

-continued
[Compound104]
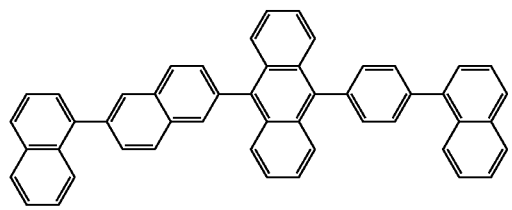
[Compound105]
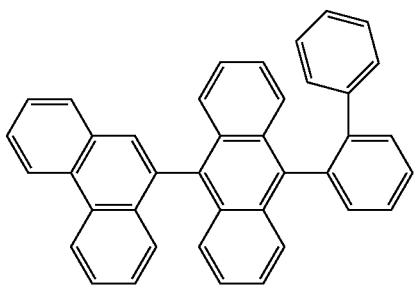
[Compound106]
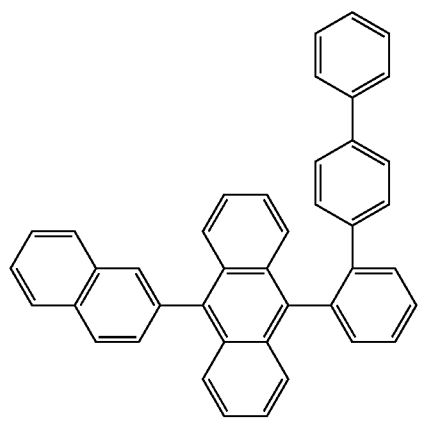
[Compound107]
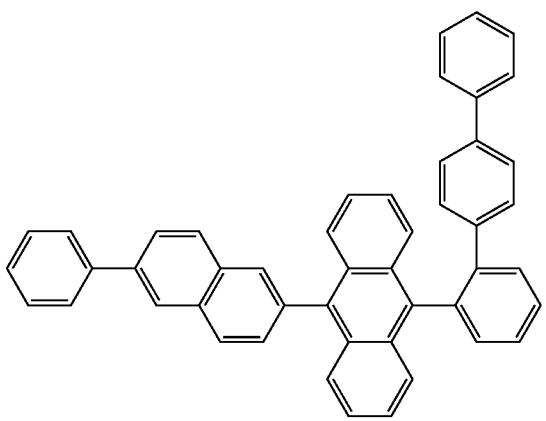
[Compound108]
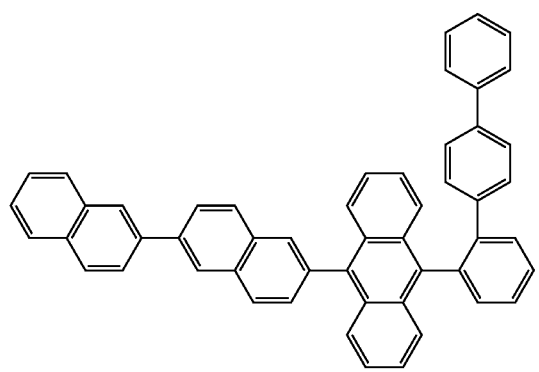
[Compound109]
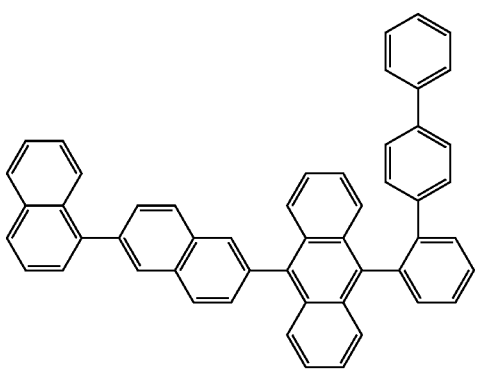
[Compound110]
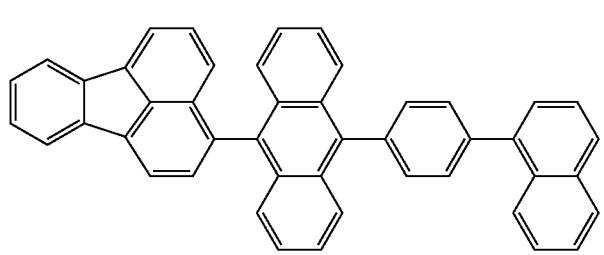
[Compound111]
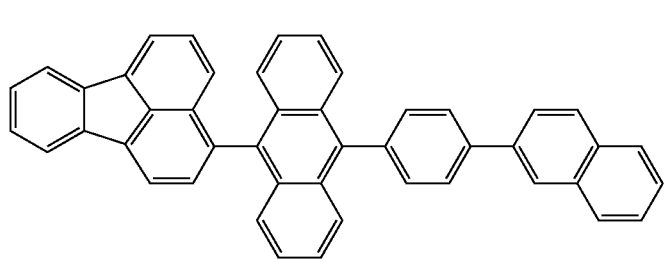

[Compound112]
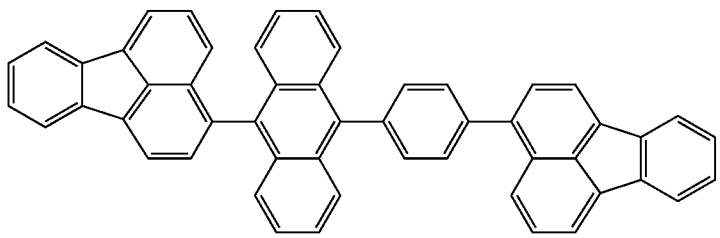
[Compound113]
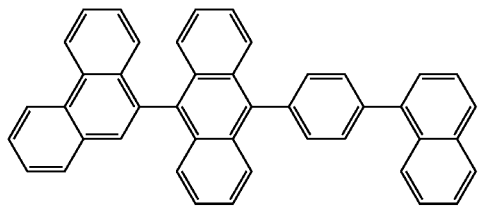
[Compound114]
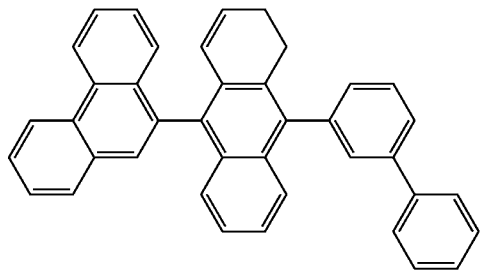
[Compound115]
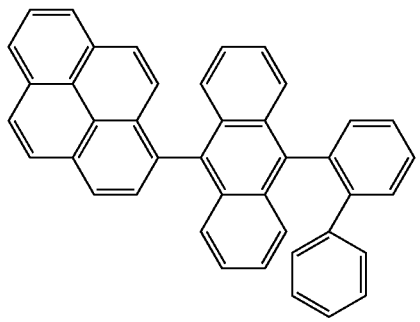
[Compound116]
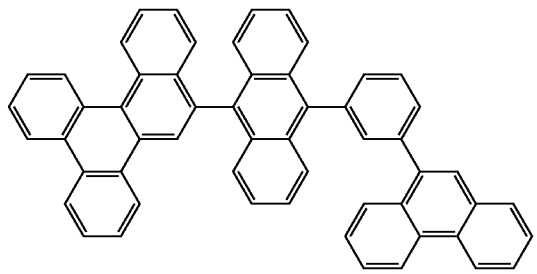
[Compound117]
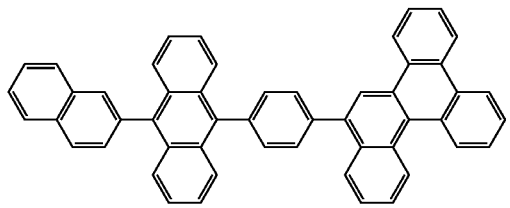
[Compound118]
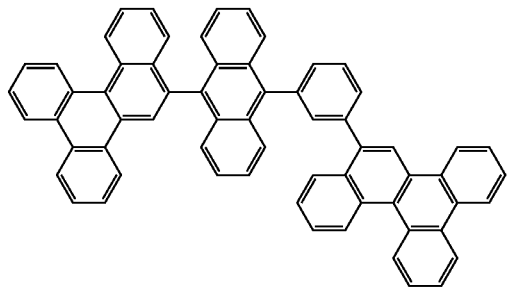
[Compound119]
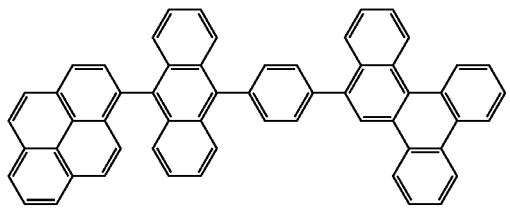
[Compound120]
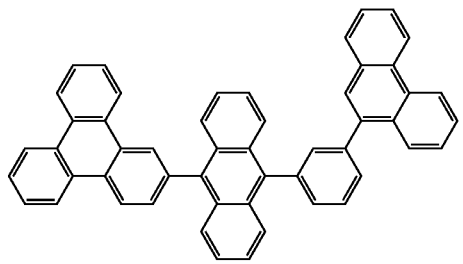

-continued
[Compound121]
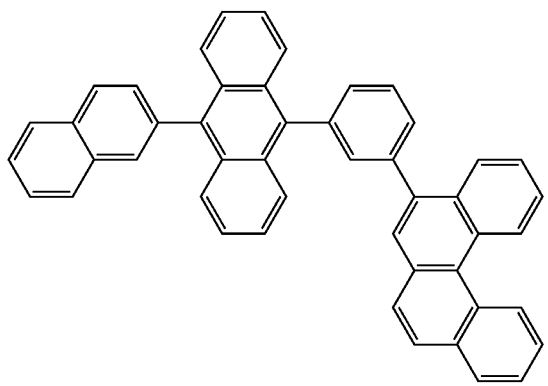
[Compound122]
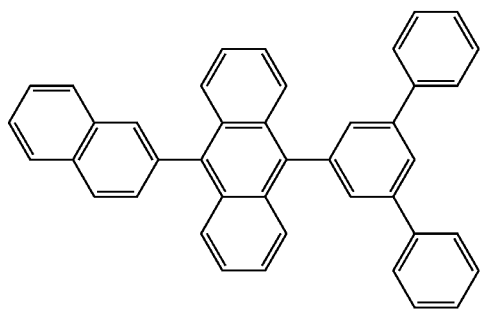
[Compound123]
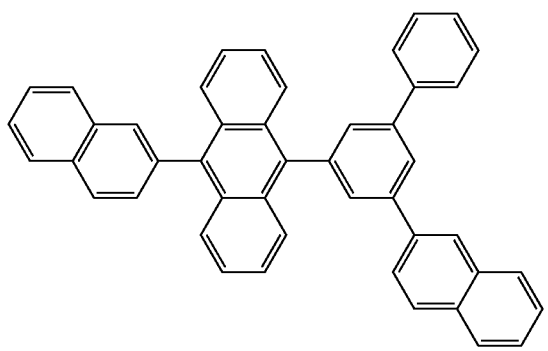
[Compound124]
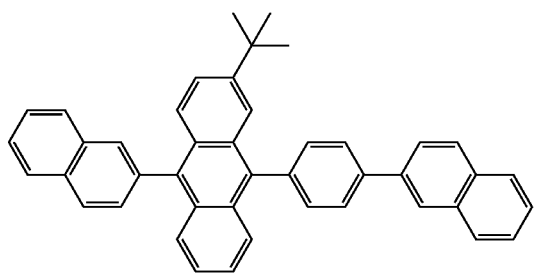
[Compound125]
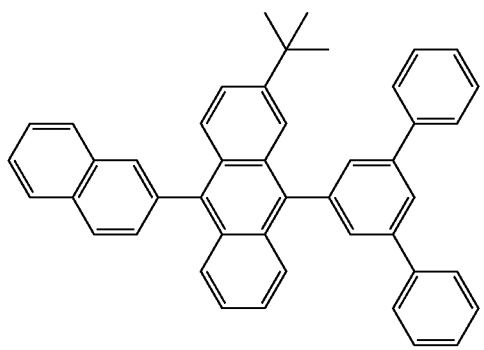
[Compound126]
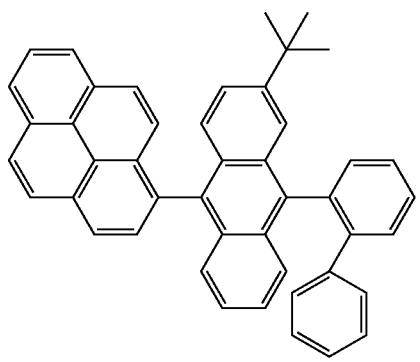
[Compound127]
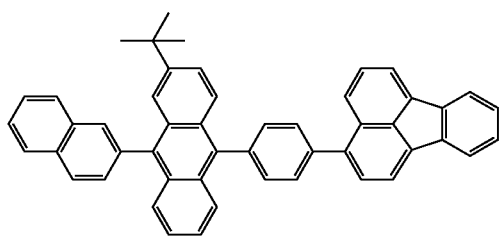
[Compound128]
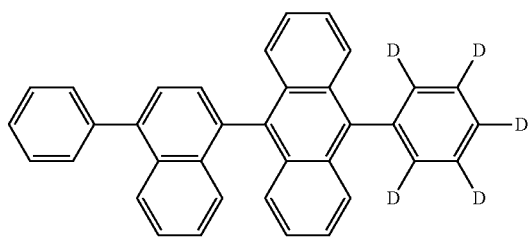

-continued
[Compound129]
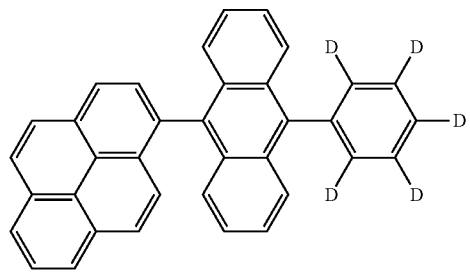
[Compound130]
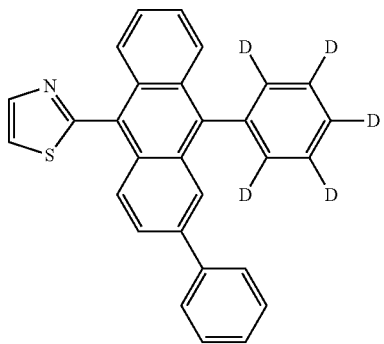
[Compound131]
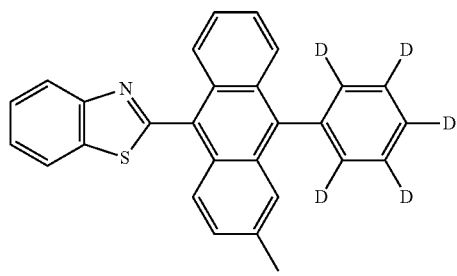
[Compound132]
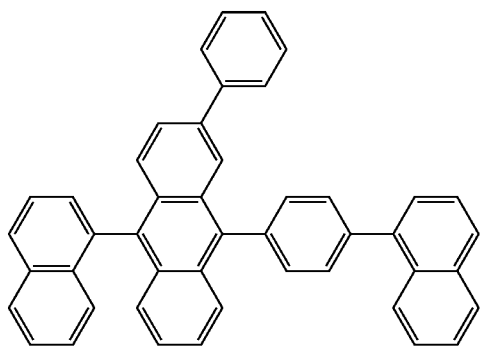
[Compound133]
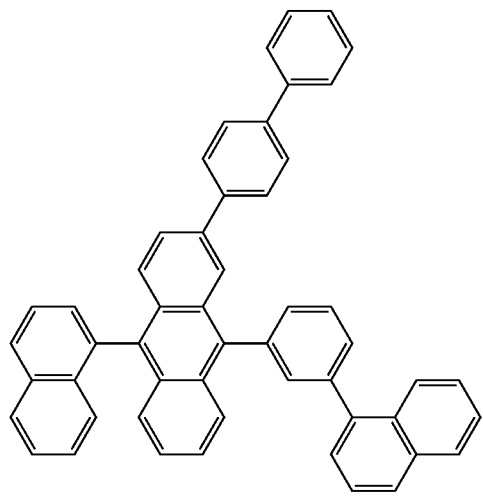
[Compound134]
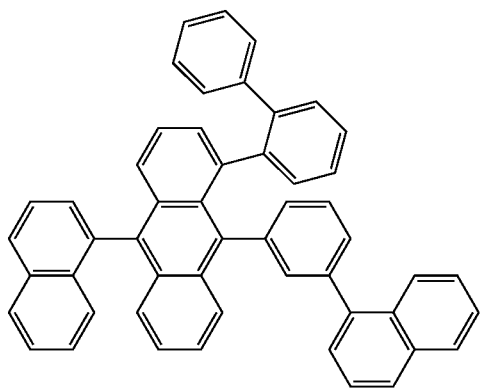

[Compound135]
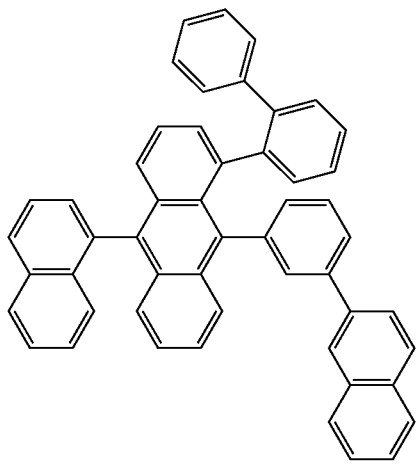
[Compound136]
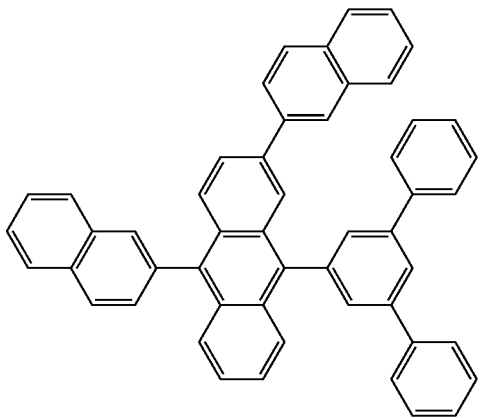
[Compound137]
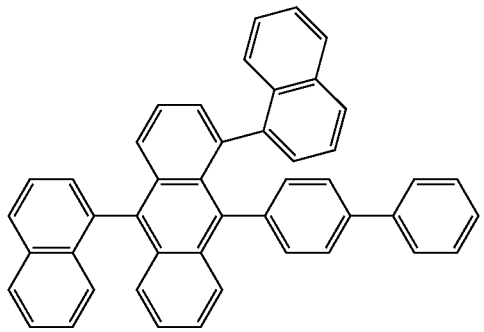
[Compound138]
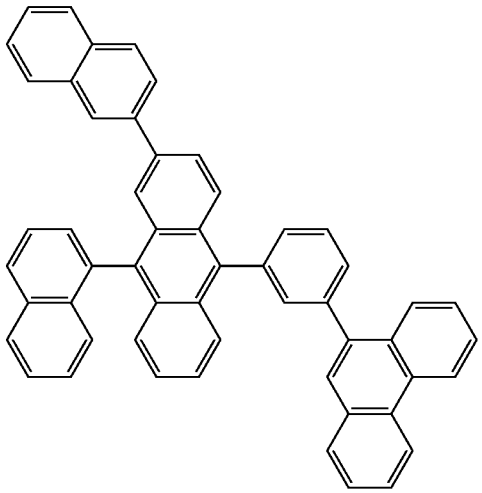
[Compound139]
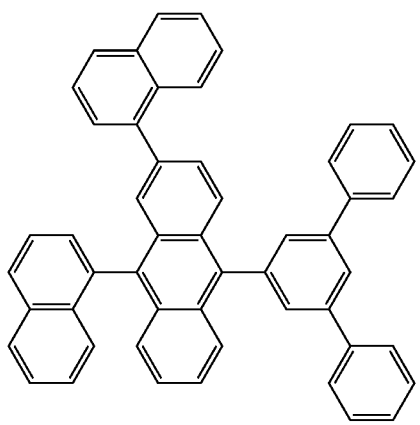
[Compound140]
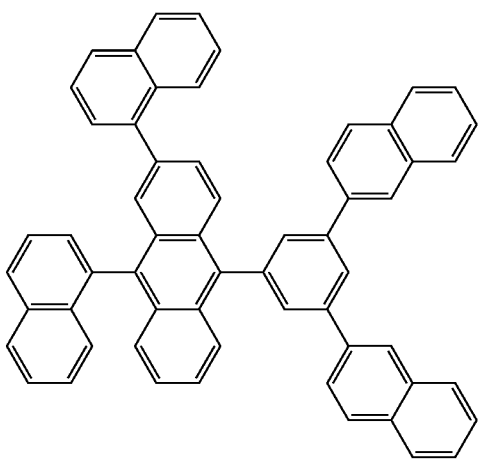

[Compound141]
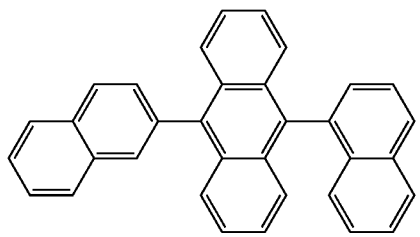
[Compound142]
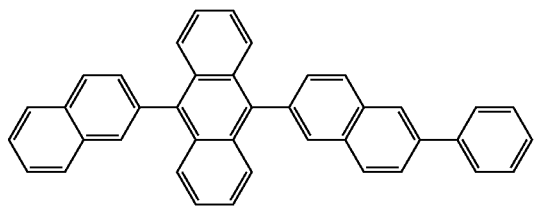
[Compound143]
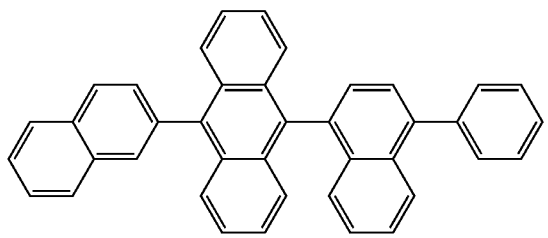
[Compound144]
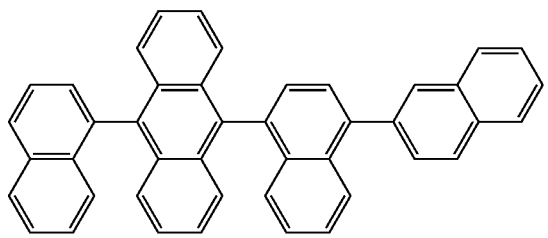
[Compound145]
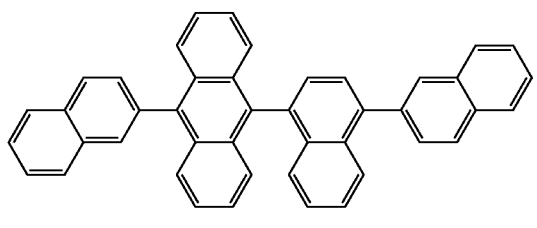
[Compound146]
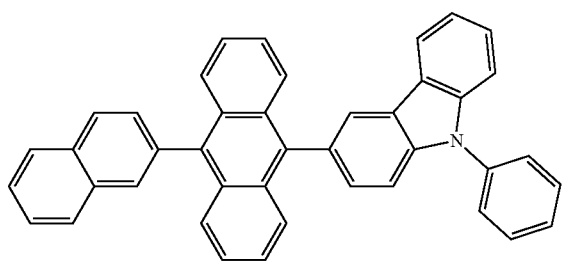
[Compound147]
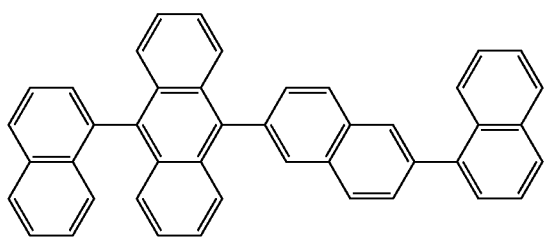
[Compound148]
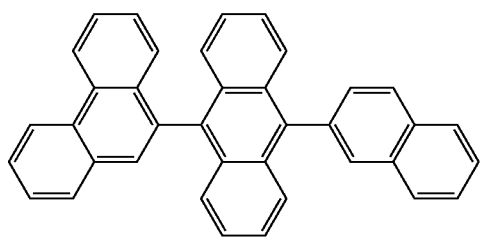
[Compound149]
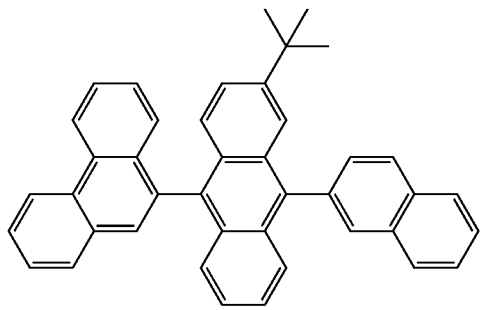
[Compound150]
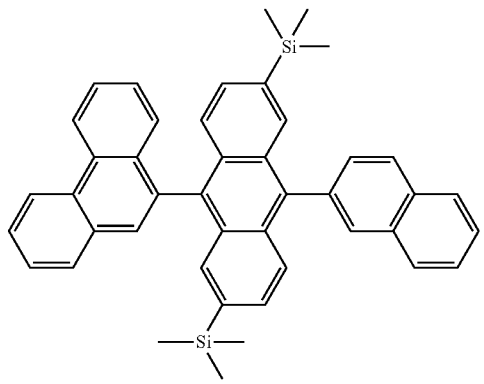

-continued
[Compound151]
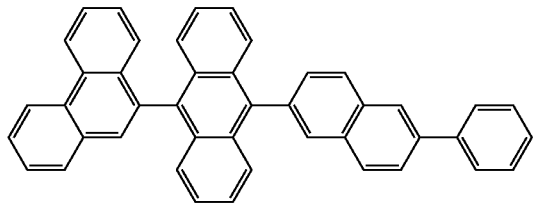
[Compound152]
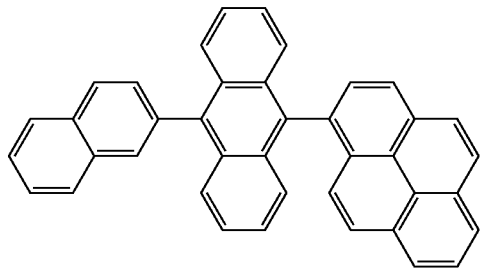
[Compound153]
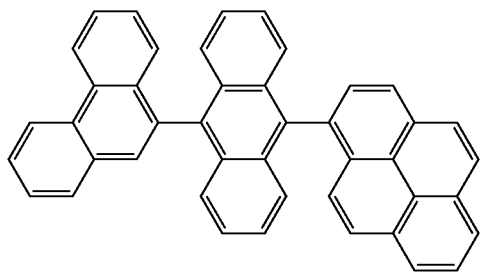
[Compound154]
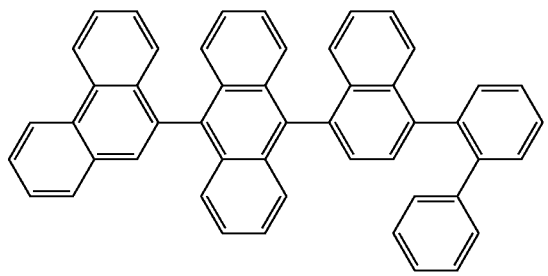
[Compound155]
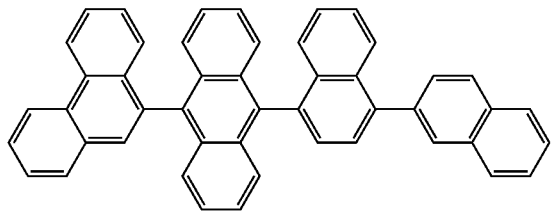
[Compound156]
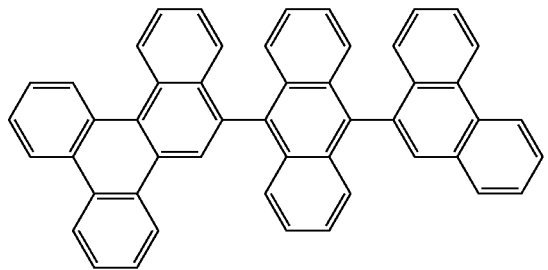
[Compound157]
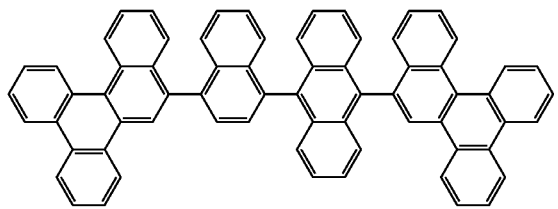
[Compound158]
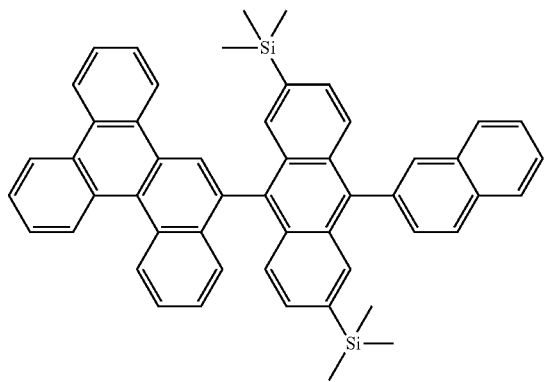

-continued
[Compound159]
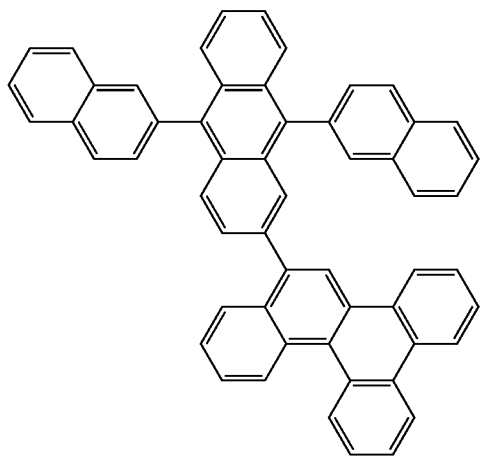
[Compound160]
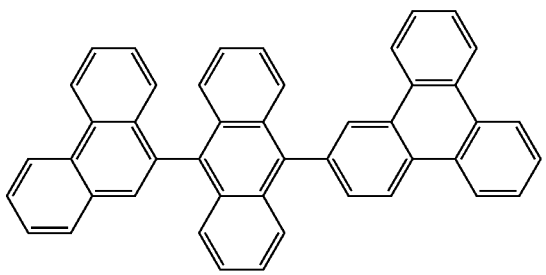
[Compound161]
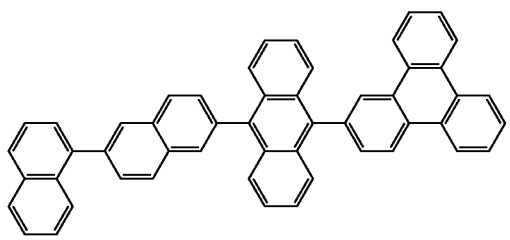
[Compound162]
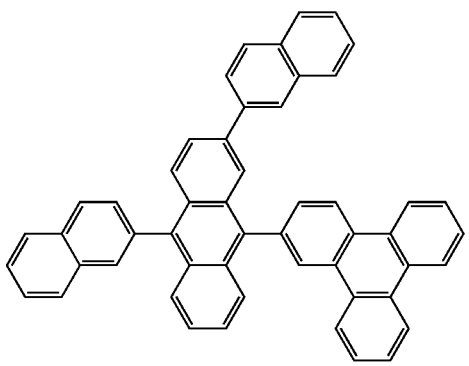
[Compound163]
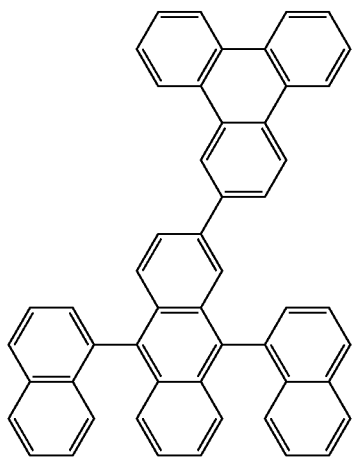
[Compound164]
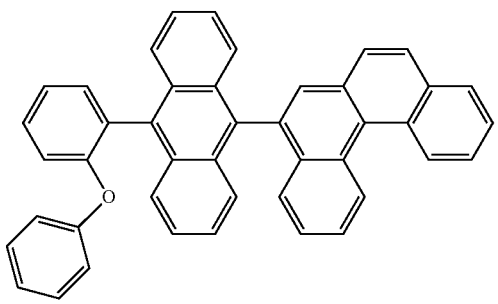
[Compound165]
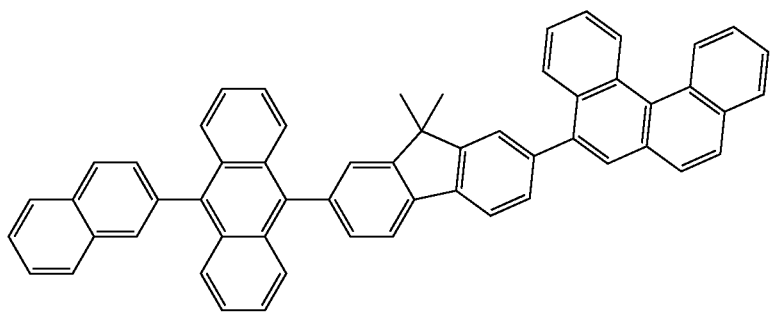

-continued
[Compound166]
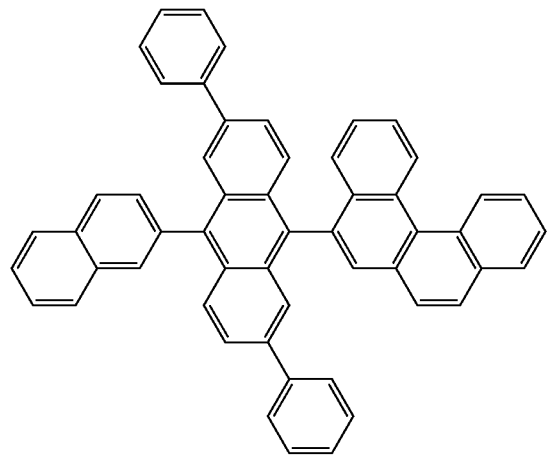
[Compound167]
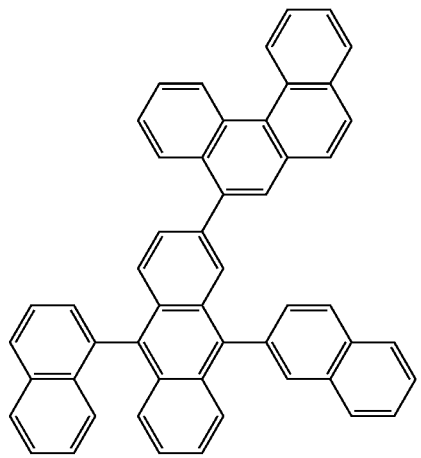
[Compound168]
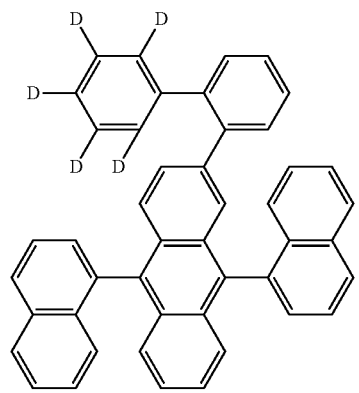
[Compound169]
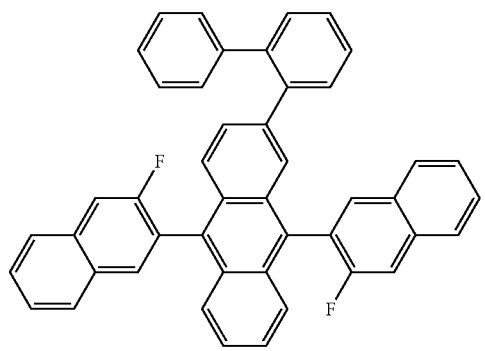
[Compound170]
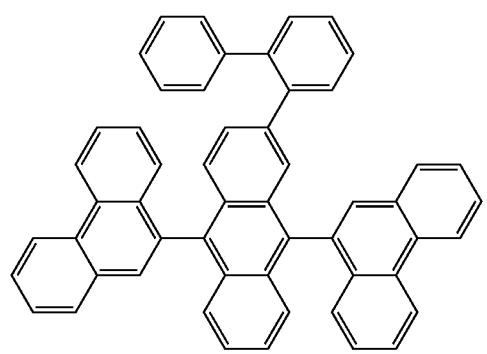
[Compound171]
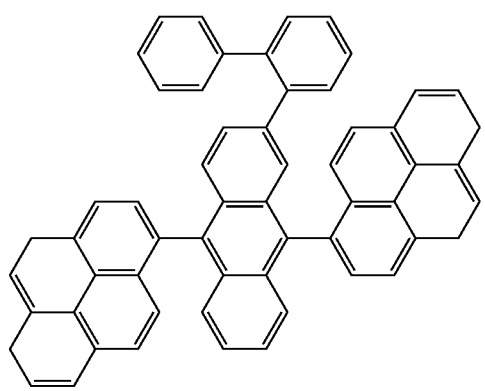
[Compiound172]
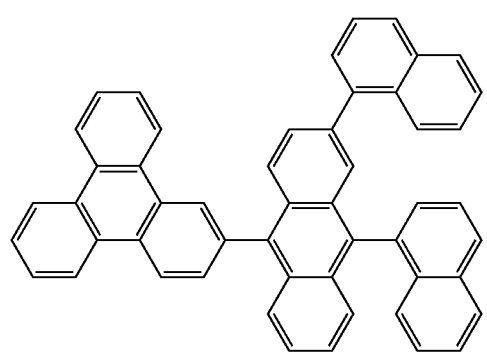
[Compound173]
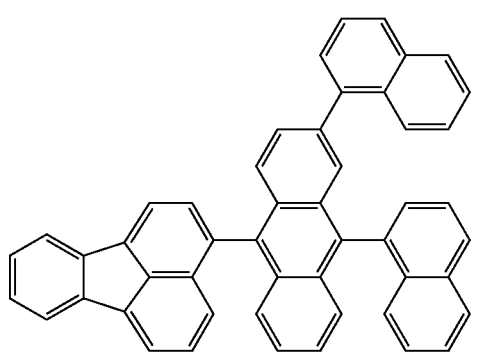

-continued
[Compound174]
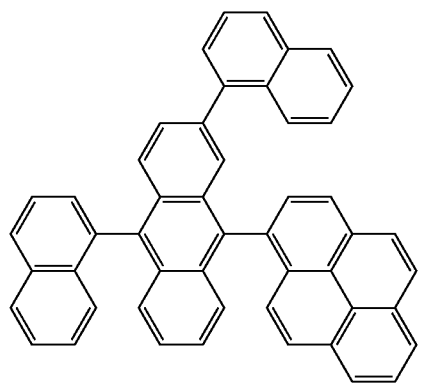
[Compound175]
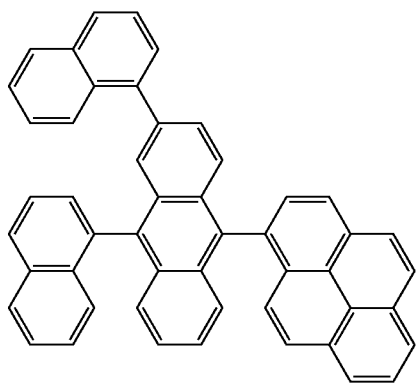
[Compound176]
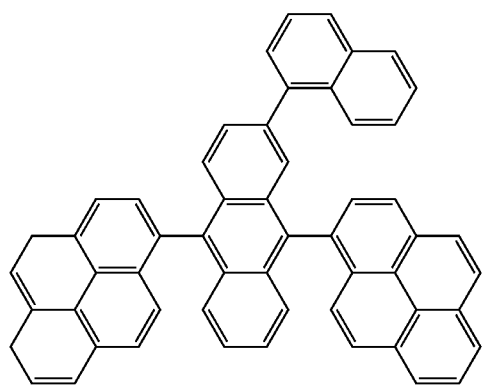
[Compound177]
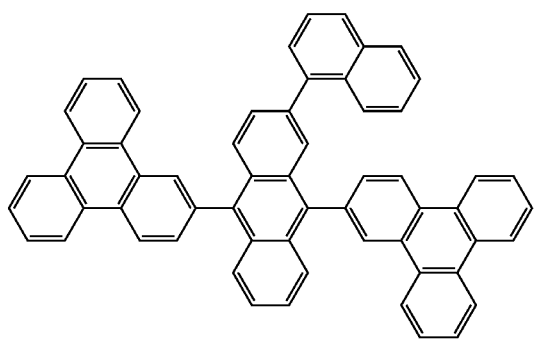
[Compound178]
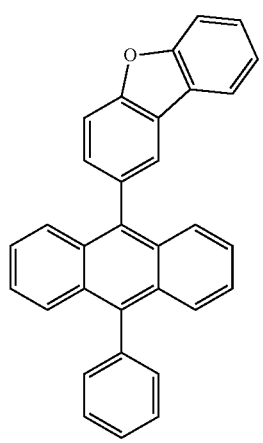
[Compound179]
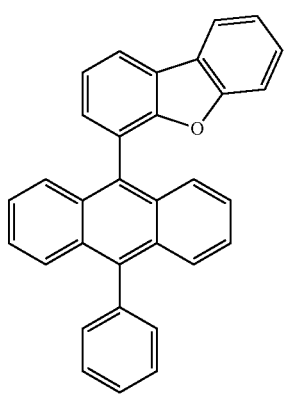

-continued
[Compound180]
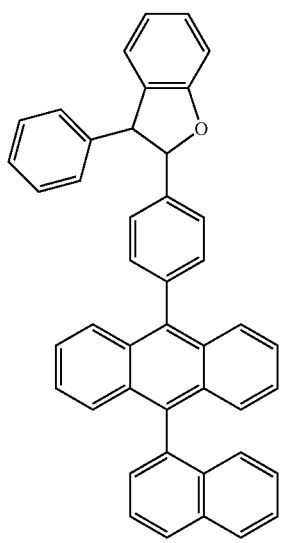
[Compound181]
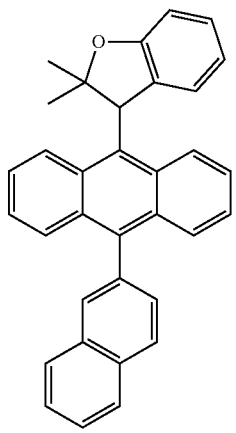
[Compound182]
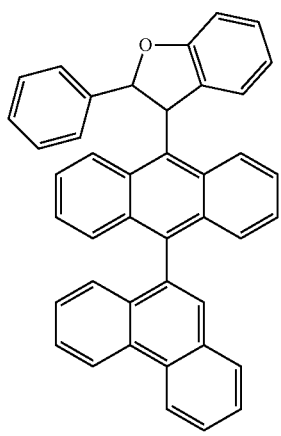
[Compound183]
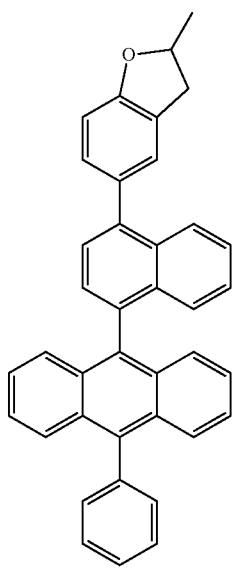
[Compound184]
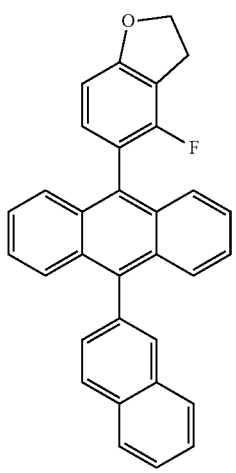
[Compound185]
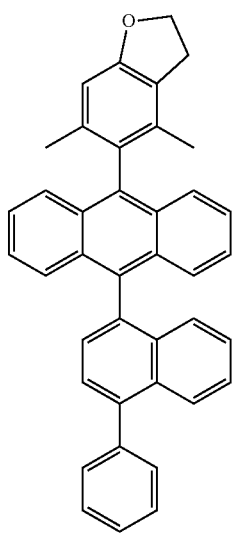

-continued
[Compound186]
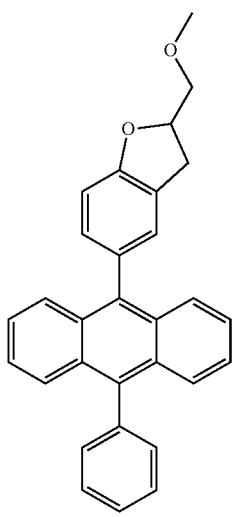
[Compound187]
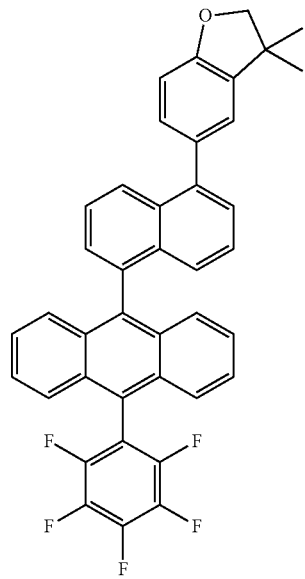
[Compound188]
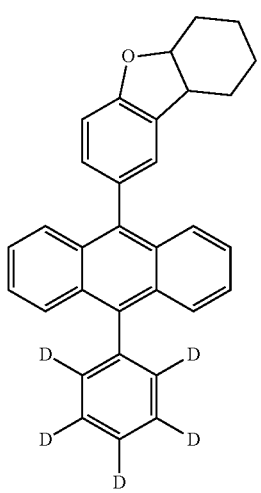
[Compound189]
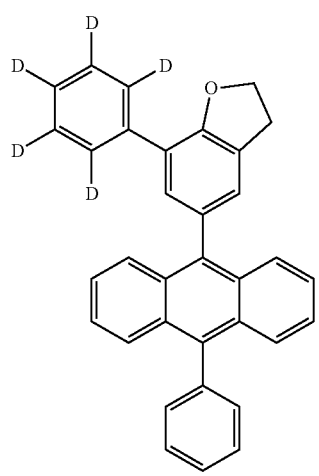
[Compound190]
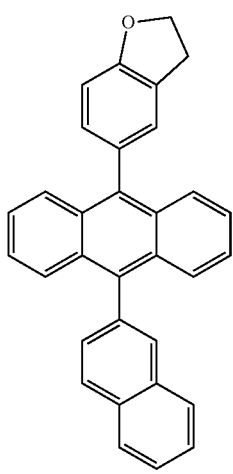
[Compound191]
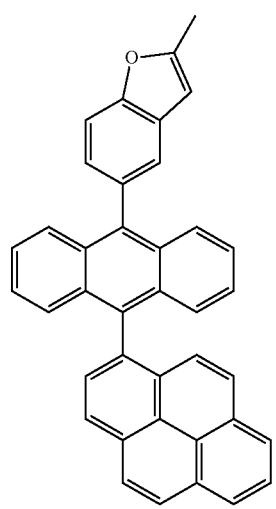

-continued
[Compiound192]
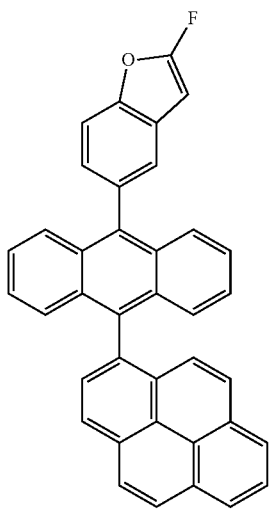
[Compound193]
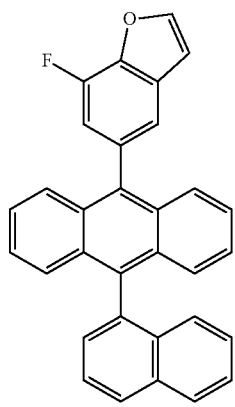
[Compound194]
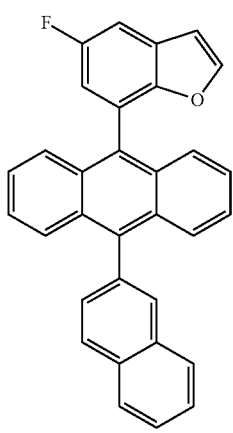
[Compound195]
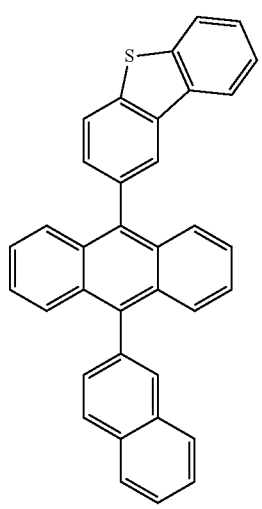
[Compound196]
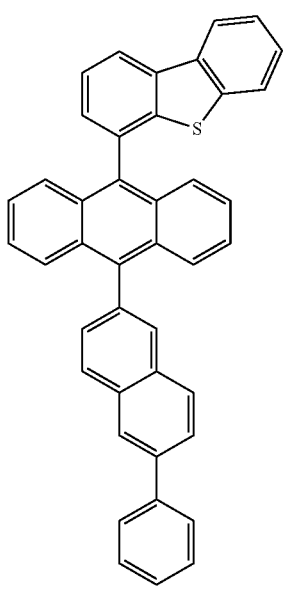

In addition, the dopant used in the light emitting layer according to the present disclosure may include at least one of the following [Chemical Formula 2] to [Chemical Formula 4]:

[Chemical Formula 2]

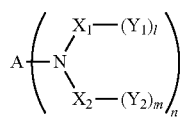

[Chemical Formula 3]

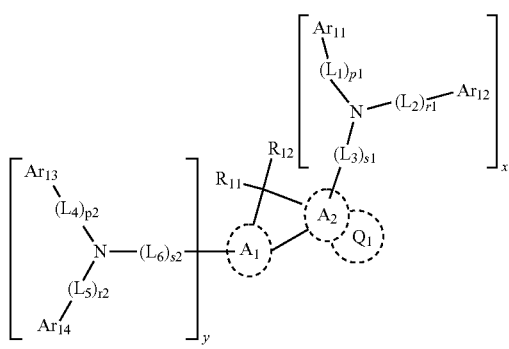

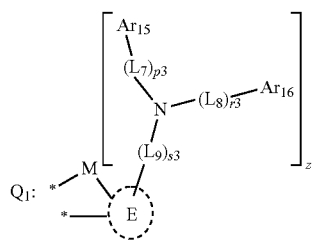

[Chemical Formula 4]

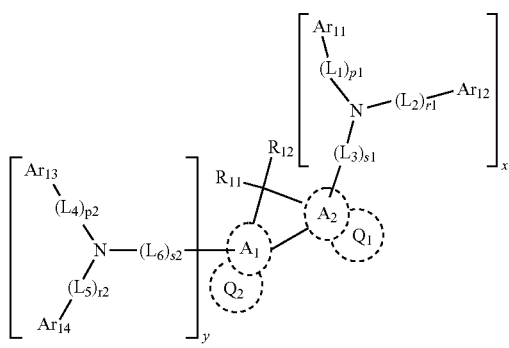

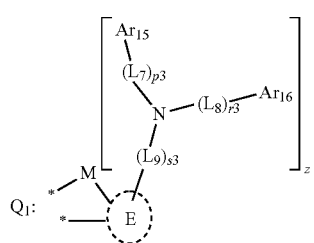

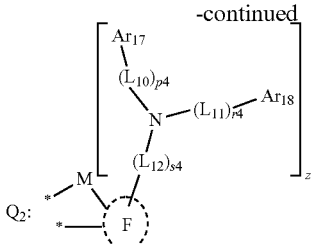

wherein,

A in [Chemical Formula 2] is selected from among a substituted or unsubstituted aryl of 5 to 50 carbon atoms, a substituted or unsubstituted heteroaryl of 3 to 50 carbon atoms bearing O, N, or S as a heteroatom, a substituted or unsubstituted arylene of 6 to 60 carbon atoms, and a substituted or unsubstituted heteroarylene of 3 to 50 carbon atoms bearing O, N, or S as a heteroatom.

In a particular embodiment, A may be anthracene, pyrene, phenanthrene, indenophenanthrene, chrysene, naphthacene, pycene, triphenylene, perylene, or pentacene. In this regard, A may be any one of the compounds represented by the following Chemical Formulas A1 to A10.

[Chemical Formula A1]

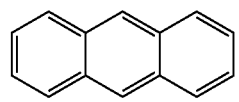

[Chemical Formula A2]

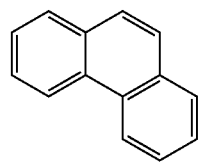

[Chemical Formula A3]

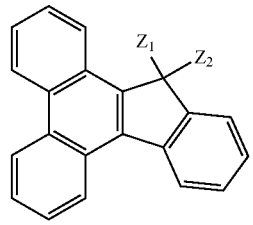

[Chemical Formula A4]

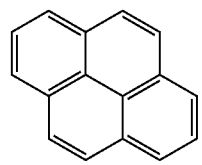

[Chemical Formula A5]

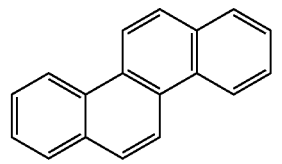

[Chemical Formula A6]

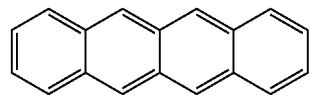

-continued

[Chemical Formula A7]

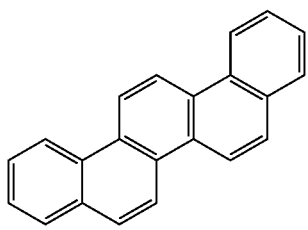

[Chemical Formula A8]

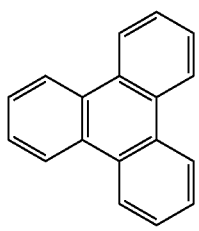

[Chemical Formula A9]

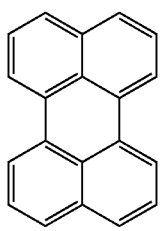

[Chemical Formula A10]

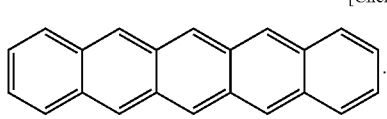

In Chemical Formula A3, $Z_1$ and $Z_2$, which may be the same or different, are each independently selected from the group consisting of a hydrogen atom, a deuterium atom, a substituted or unsubstituted alkyl of 1 to 60 carbon atoms, a substituted or unsubstituted alkenyl of 2 to 60 carbon atoms, a substituted or unsubstituted alkynyl of 2 to 60 carbon atoms, a substituted or unsubstituted alkoxy of 1 to 60 carbon atoms, a substituted or unsubstituted alkylthio of 1 to 60 carbon atoms, a substituted or unsubstituted cycloalkyl of 3 to 60 carbon atoms, a substituted or unsubstituted aryl of 6 to 60 carbon atoms, a substituted or unsubstituted aryloxy of 5 to 60 carbon atoms, a substituted or unsubstituted arylthio of 5 to 60 carbon atoms, a substituted or unsubstituted heteroaryl of 2 to 60 carbon atoms, a substituted or unsubstituted (alkyl)amino of 1 to 60 carbon atoms, a di(substituted or unsubstituted alkyl)amino of 1 to 60 carbon atoms or a (substituted or unsubstituted aryl)amino of 6 to 60 carbon atoms, and a di(substituted or unsubstituted aryl) amino of 6 to 60 carbon atoms, and may each form a fused ring with an adjacent radical.

In Chemical Formula 2, $X_1$ and $X_2$, which may the same or different, are each independently a substituted or unsubstituted arylene of 6 to 30 carbon atoms or a single bond, and may bond to each other;

$Y_1$ and $Y_2$, which may be the same or different, are each independently selected from the group consisting of a substituted or unsubstituted aryl of 6 to 24 carbon atoms, a substituted or unsubstituted heteroaryl of 2 to 24 carbon atoms, a substituted or unsubstituted alkyl of 1 to 24 carbon atoms, a substituted or unsubstituted heteroalkyl of 1 to 24 carbon atoms, a substituted or unsubstituted cycloalkyl of 3 to 24 carbon atoms, a substituted or unsubstituted alkoxy of 1 to 24 carbon atoms, a cyano, a halogen, a substituted or unsubstituted aryloxy of 6 to 24 carbon atoms, a substituted or unsubstituted alkylsilyl of 1 to 40 carbon atoms, a substituted or unsubstituted arylsilyl of 6 to 30 carbon atoms, a germanium, a phosphorus, a boron, a deuterium, and a hydrogen, and may each form with an aliphatic, aromatic, heteroaliphatic, or heteroaromatic fused ring with an adjacent radical; and l and m are each an integer of 1 to 20, and n is an integer of 1 to 4.

In Chemical Formulas 3 and 4, $A_1$, $A_2$, E, and F, which may be the same or different, are each independently a substituted or unsubstituted aromatic hydrocarbon ring of 6 to 50 carbon atoms or a substituted or unsubstituted heteroaromatic ring of 2 to 40 carbon atoms, wherein two adjacent carbon atoms of the aromatic ring $A_1$ and two adjacent carbon atoms of the aromatic ring $A_2$ form a 5-membered fused ring together with a carbon atom connected to both substituents $R_{11}$ and $R_{12}$;

linkers $L_1$ to and $L_{12}$, which may be the same or different, are each independently selected from among a single bond, a substituted or unsubstituted alkylene of 1 to 60 carbon atoms, a substituted or unsubstituted alkenylene of 2 to 60 carbon atoms, a substituted or unsubstituted alkynylene of 2 to 60 carbon atoms, a substituted or unsubstituted cycloalkylene of 3 to 60 carbon atoms, a substituted or unsubstituted heterocycloalkylene of 2 to 60 carbon atoms, a substituted or unsubstituted arylene of 6 to 60 carbon atoms, and a substituted or unsubstituted heteroarylene of 2 to 60 carbon atoms;

M is any one selected from among N—$R_{13}$, $CR_{14}R_{15}$, $SiR_{16}R_{17}$, $GeR_{18}R_{19}$, O, S, and Se;

$R_{11}$ to $R_{19}$, and $Ar_{11}$ to $Ar_{18}$, which may be the same or different, are each independently selected from among a hydrogen atom, a deuterium atom, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a substituted or unsubstituted alkylgermanium of 1 to 30 carbon atoms, a substituted or unsubstituted arylgermanium of 1 to 30 carbon atoms, a cyano, a nitro, and a halogen, wherein $R_{11}$ and $R_{12}$ may be connected to each other to form a mono- or polycyclic aliphatic or aromatic ring which may bear at least one heteroatom selected from among N, O, P, Si, S, Ge, Se, and Te as a ring member;

p1 to p4, r1 to r4, and s1 to s4 are each independently an integer of 1 to 3, under which when any of them is 2 or greater, the corresponding linkers Li to Liz may be the same or different, x is an integer of 1 or 2, y and z, which are the same or different, are each an integer of 0 to 3, respective rings may be formed through linkages between $Ar_{11}$ and $Ar_{12}$, between $Ar_{13}$ and $A_{14}$, between $Ar_{15}$ and $Ar_{16}$, and between $Ar_{17}$ and $Ar_{18}$;

two adjacent carbon atoms of the $A_2$ ring moiety of Chemical Formula 3 may occupy respective positions * of Structural Formula $Q_1$ to form a fused ring; and two adjacent carbon atoms of the $A_1$ ring moiety of Chemical Formula 4 may occupy respective positions * of structural Formula $Q_2$ to form a fused ring, and two adjacent carbon atoms of the $A_2$ ring moiety may occupy respective positions * of Structural Formula $Q_1$ to form a fused ring.

The amine group attached to Chemical Formulas 2 to 4 may be selected from the group consisting of the following [Substituent 1] to [Substituent 52], but is not limited thereto:

[Substituent 1]

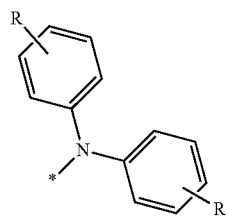

[Substituent 2]

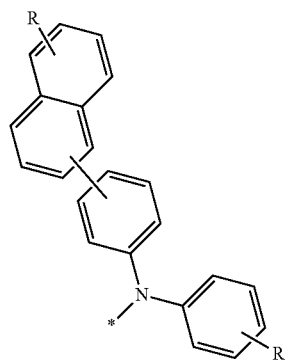

[Substituent 3]

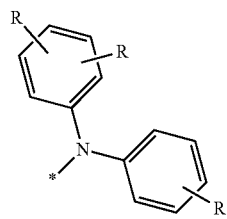

[Substituent 4]

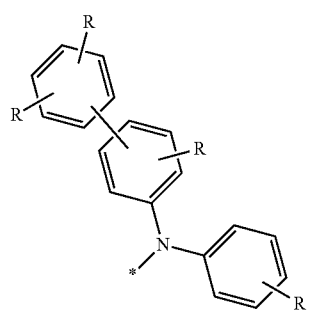

[Substituent 5]

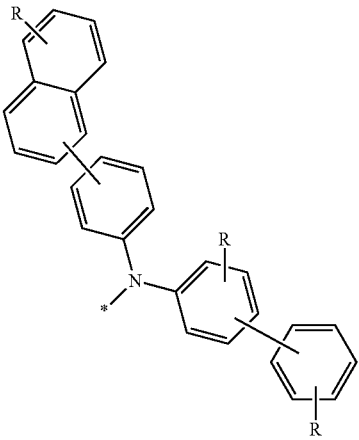

[Substituent 6]

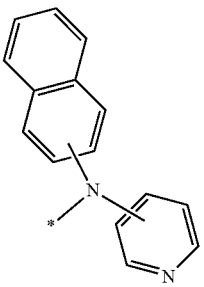

[Substituent 7]

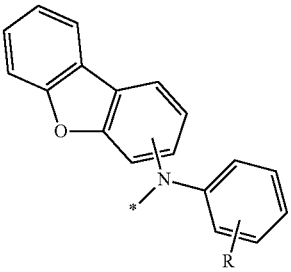

[Substituent 8]

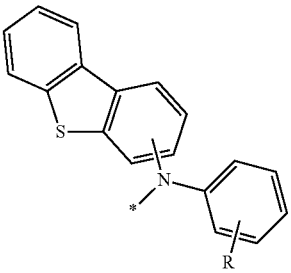

[Substituent 9]

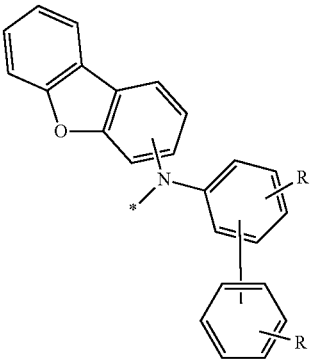

[Substituent 10]
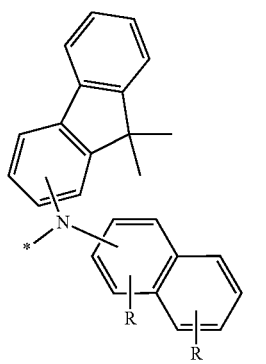
[Substituent 11]
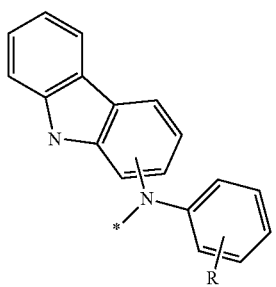
[Substituent 12]
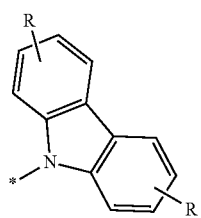
[Substituent 13]
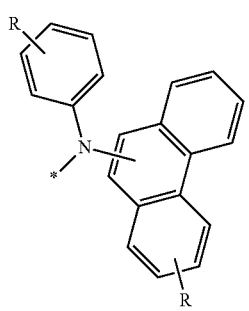
[Substituent 14]
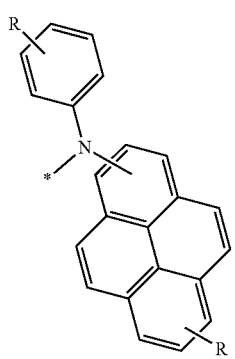
[Substituent 15]
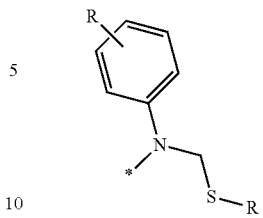
[Substituent 16]
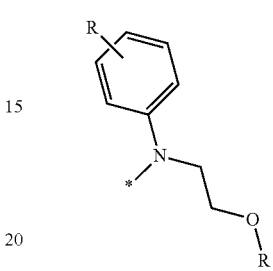
[Substituent 17]
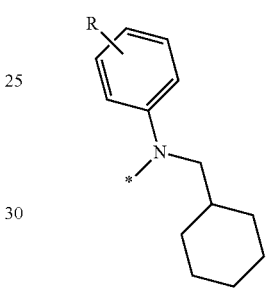
[Substituent 18]
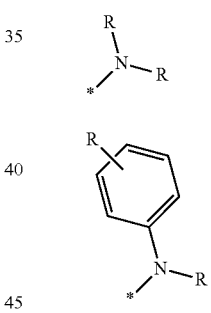
[Substituent 19]
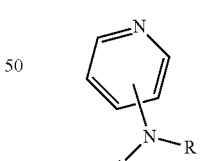
[Substituent 20]
[Substituent 21]
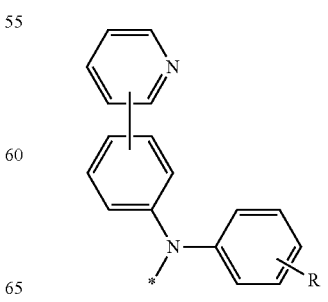

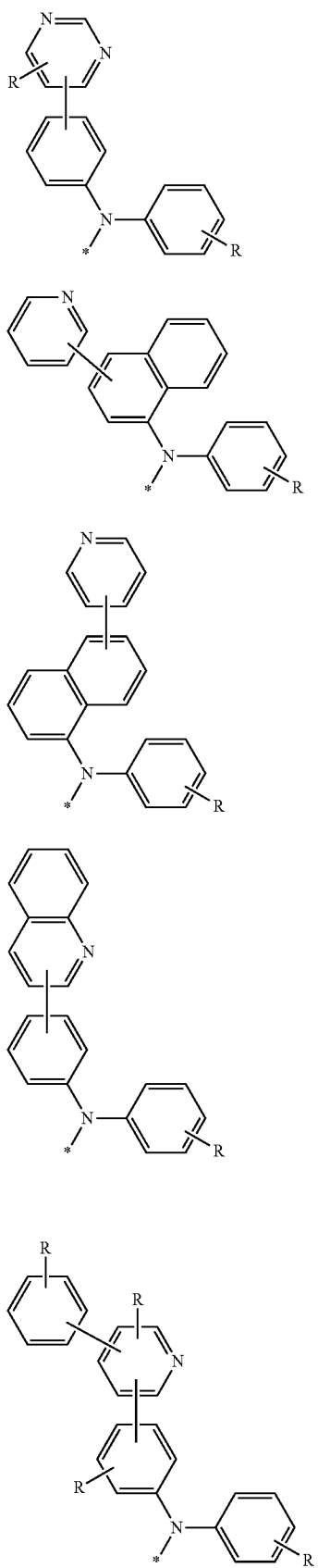
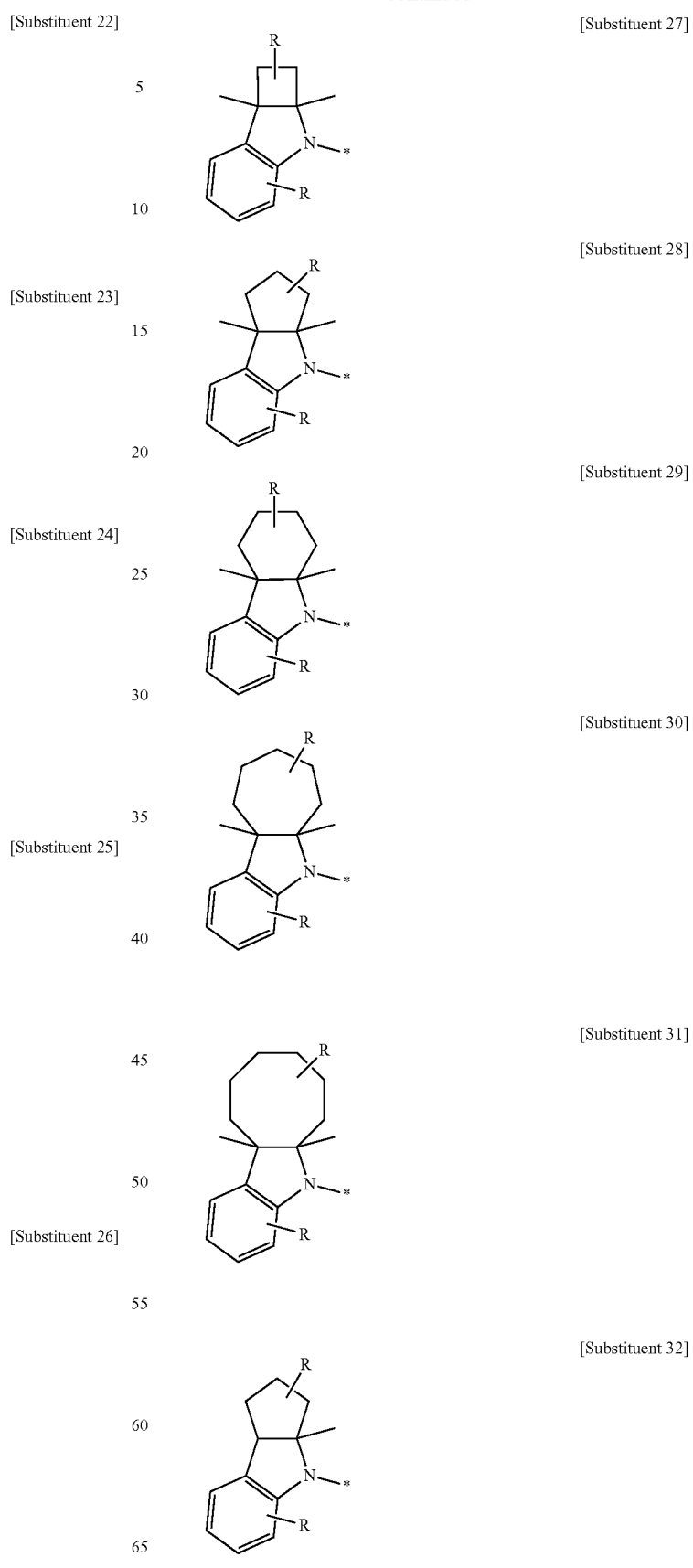

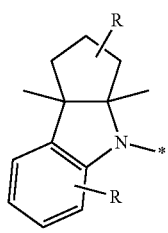
[Substituent 33]
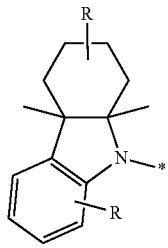
[Substituent 34]
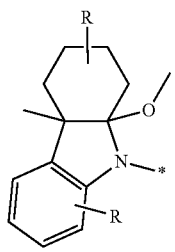
[Substituent 35]
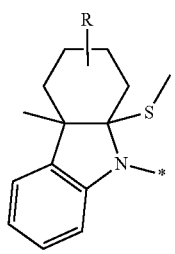
[Substituent 36]
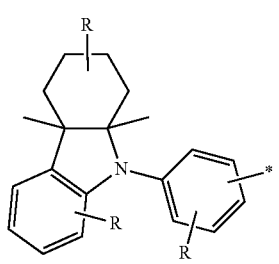
[Substituent 37]
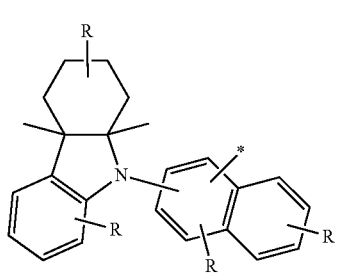
[Substituent 38]
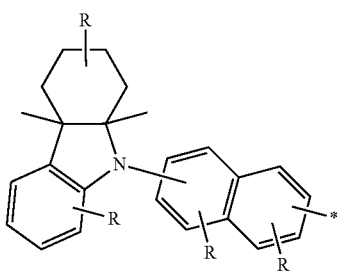
[Substituent 39]
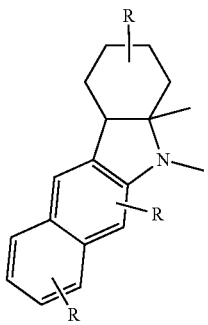
[Substituent 40]
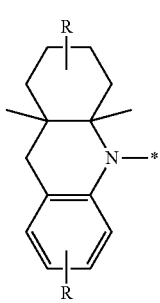
[Substituent 41]
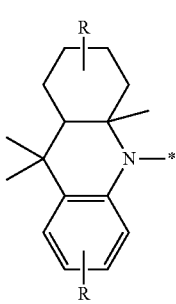
[Substituent 42]
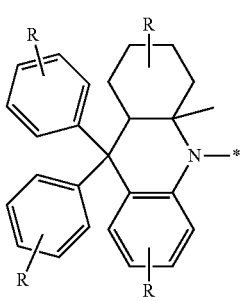
[Substituent 43]

[Substituent 44]

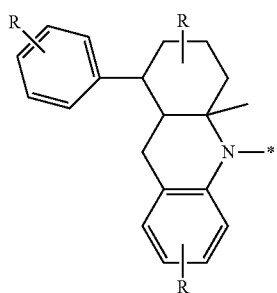

[Substituent 45]

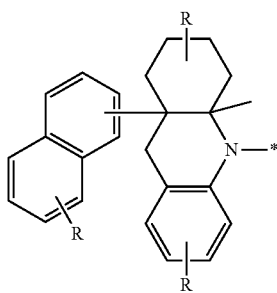

[Substituent 46]

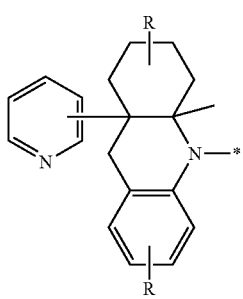

[Substituent 47]

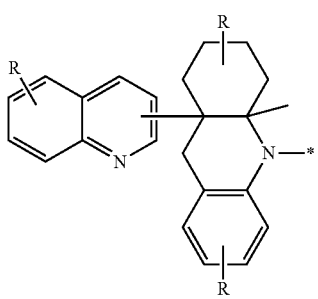

[Substituent 48]

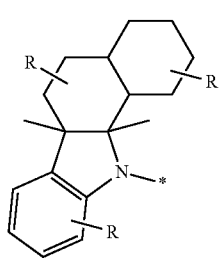

[Substituent 49]

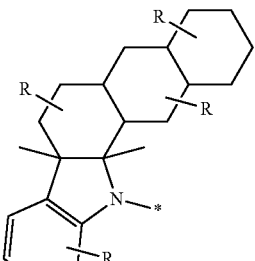

[Substituent 50]

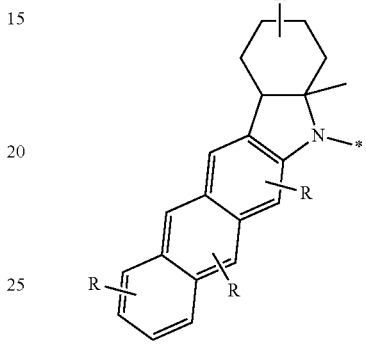

[Substituent 51]

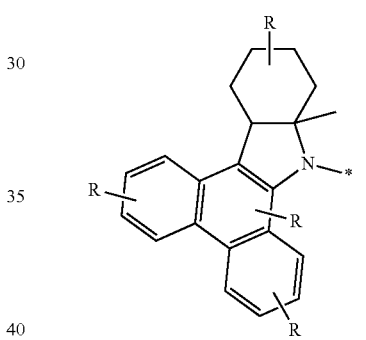

[Substituent 52]

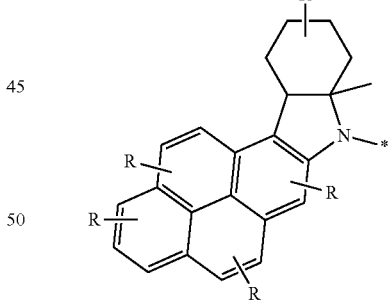

wherein R's, which may be the same or different, are each independently selected from among a hydrogen atom, a deuterium atom, a halogen atom, a hydroxyl, a cyano, a nitro, an amino, an amidino, a hydrazine, a hydrazone, a carboxyl or a salt thereof, a sulfonic acid or a salt thereof, a phosphoric acid or a salt thereof, a substituted or unsubstituted alkyl of 1 to 60 carbon atoms, a substituted or unsubstituted akenyl of 2 to 60 carbon atoms, a substituted or unsubstituted alkynyl of 2 to 60 carbon atoms, a substituted or unsubstituted alkoxy of 1 to 60 carbon atoms, a substituted or unsubstituted alkylthio of 1 to 60 carbon atoms, a substituted or unsubstituted cycloalkyl of 3 to 60 carbon atoms, a substituted or unsubstituted aryl of 6 to 60 carbon atoms, a substituted or unsubstituted aryloxy of 5 to 60 carbon atoms, a substituted or unsubstituted arylthio of 5 to 60 carbon atoms, a substituted or unsubstituted heteroaryl of 2 to 60 carbon atoms, a substituted or unsubstituted (alkyl)amino of 1 to 60 carbon atoms, a di(substituted or unsubstituted alkyl)amino of 1 to 60 carbon atoms, a substituted or unsubstituted arylamino of 6 to 60 carbon atoms, a di(substituted or unsubstituted aryl)amino of 6 to 60 carbon atoms, a substituted or unsubstituted alkylsilyl of 1 to 40 carbon atoms, a substituted or unsubstituted arylsilyl of 6 to 30 carbon atoms, geramanium, phosphorous, and boron and may each have 1 to 12 substituents when substituted, wherein the substitutents may form a fused ring with adjacent groups;

When the light emitting layer contains a host and a dopant, the amount of the dopant in the light-emitting layer may range from about 0.01 to about 20 weight parts, based on 100 weight parts of the host, but is not limited thereto.

After formation of the light emitting layer, an electron transport layer 60 is deposited using a vacuum deposition method or a spin-coating method and then overlaid with an electron injection layer 70. A cathode metal is deposited on the electron injection layer 70 by thermal deposition in a vacuum to form a cathode 80, thus fabricating an organic EL diode.

A material for use in the electron transport layer functions to stably carry the electrons injected from the electron injection electrode (cathode), and may be an electron transport material known in the art. Examples of the electron transport material known in the art include quinoline derivatives, particularly, tris(8-quinolinorate)aluminum (Alq3), Liq, TAZ, Balq, beryllium bis(benzoquinolin-10-olate) (Bebq2), ADN, Compound 201, Compound 202, BCP, and oxadiazole derivatives such as PBD, BMD, and BND, but are not limited thereto:

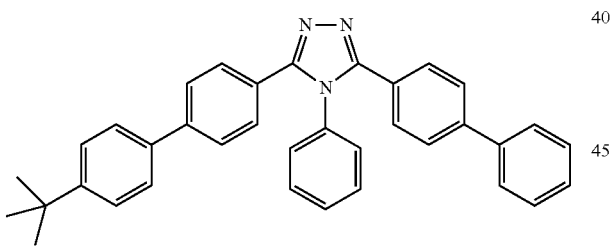

TAZ

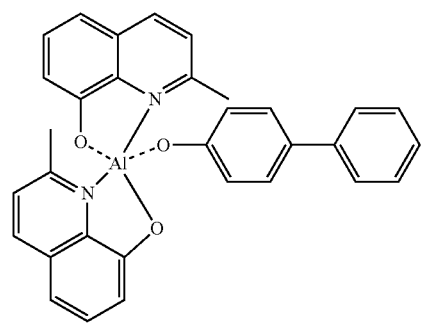

BAlq

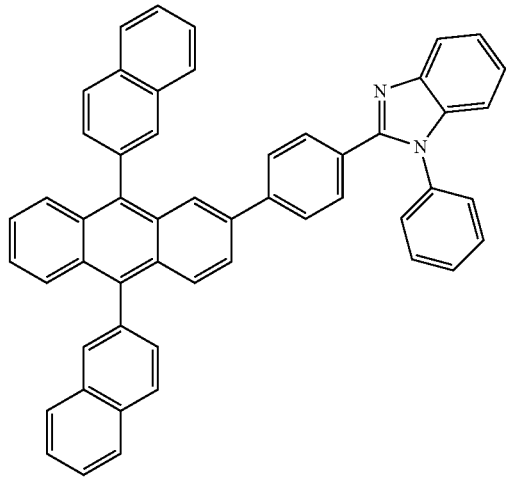

<Compound 201>

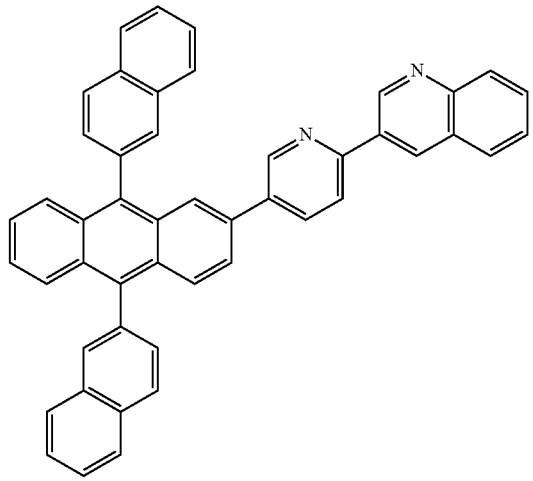

<Compound 202>

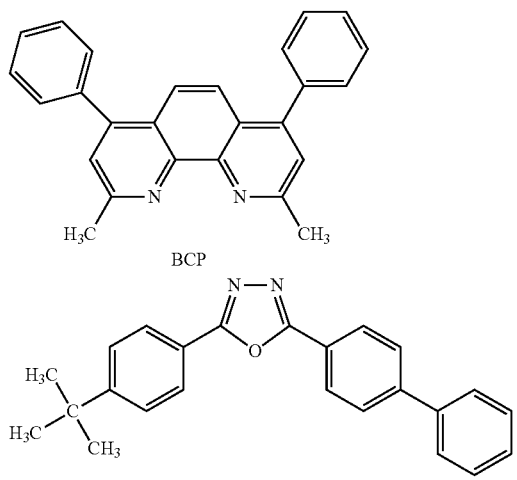

BCP

PBD

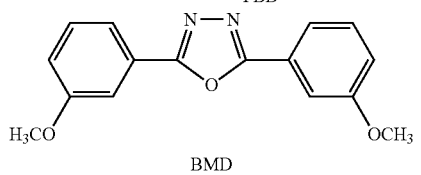

BMD

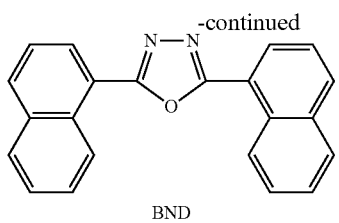

BND

In addition, the organic metal compound represented by Chemical Formula F may be used, either alone or in combination with the aforementioned electron transport layer material in the present disclosure:

$Y_m\text{-M-(OA)}_n$     [Chemical Formula F]

wherein,

Y is a ligand that contains two moieties respectively responsible for forming a single bond through a direct bond to M and for forming a coordinate bond with M, each moiety being selected from among C, N, O and S, and which is chelated by the single bond and the coordinate bond;

M is an alkali metal, an alkaline earth metal, an aluminum (Al) atom, or a boron (B) atom, with the proviso that:

when M is an alkali metal, m=1 and n=0;

when M is an alkaline earth metal, m=1 and n=1, or m=2 and n=0; or when M is aluminum or a boron, m is an integer of 1 to 3 and n is an integer of 0 to 2, satisfying the relationship m+n=3; and OA is a monodentate ligand capable of forming a single bond or a coordinate bond with M, O is oxygen, and A is selected from among a substituted or unsubstituted alkyl of 1 to 30 carbon atoms, a substituted or unsubstituted aryl of 5 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, and a substituted or unsubstituted heteroaryl of 2 to 50 carbon atoms bearing at least one of O, N, S, and $S_1$ as a heteroatom, wherein the term 'substituted' in the expression "a substituted or unsubstituted" means having at least one substituent selected from the group consisting of a deuterium atom, a cyano, a halogen, a hydroxy, a nitro, an alkyl, an alkoxy, an alkylamino, an arylamino, a heteroarylamino, an alkylsilyl, an arylsilyl, an aryloxy, an aryl, a heteroaryl, a germanium, a phosphorus, and a boron.

In the present disclosure, Y's, which may be the same or different, are each one selected from among, but not limited to, the following [Structural Formula C1] to [Structural Formula C39]:

[Structural Formula C1]

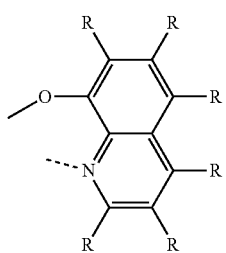

[Structural Formula C2]

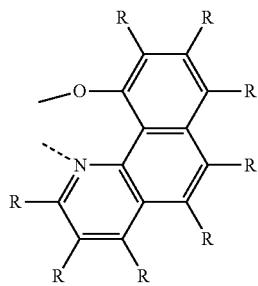

[Structural Formula C3]

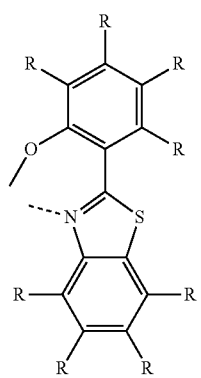

[Structural Formula C4]

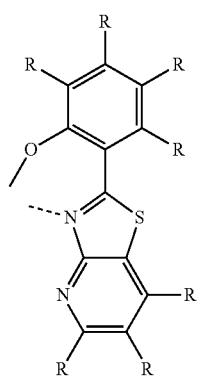

[Structural Formula C5]

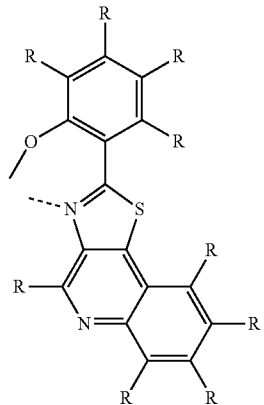

[Structural Formula C6]
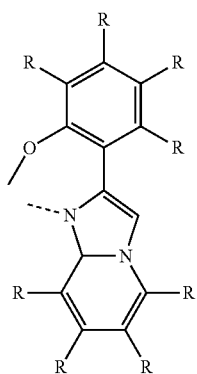
[Structural Formula C7]
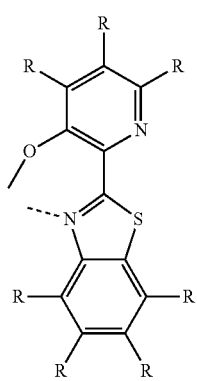
[Structural Formula C8]
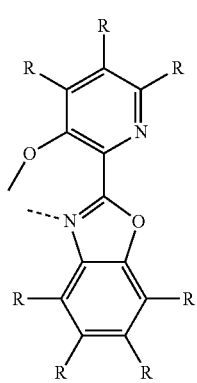
[Structural Formula C9]
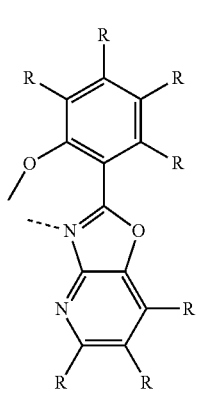
[Structural Formula C10]
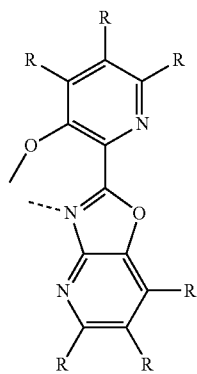
[Structural Formula C11]
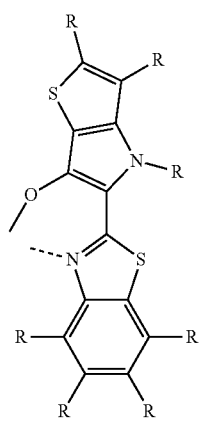
[Structural Formula C12]
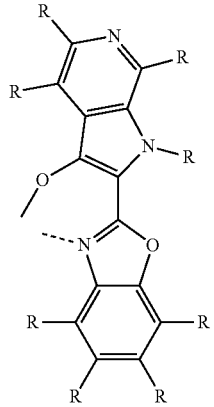
[Structural Formula C13]
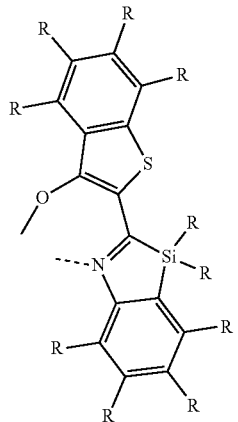

[Structural Formula C14]
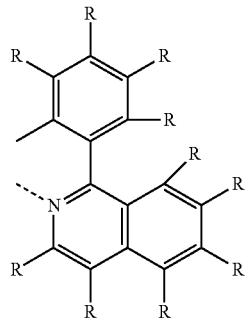
[Structural Formula C15]
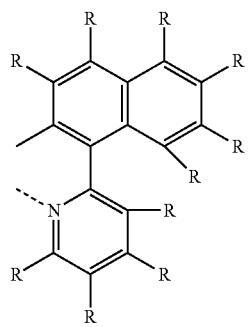
[Structural Formula C16]
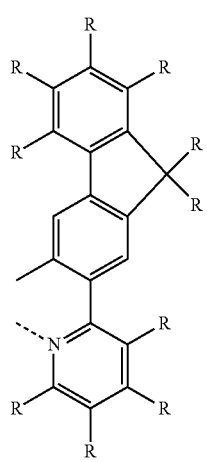
[Structural Formula C17]
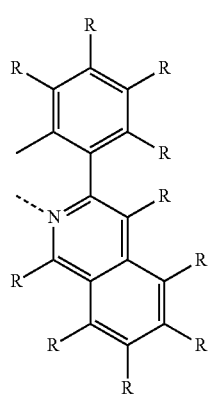
[Structural Formula C18]
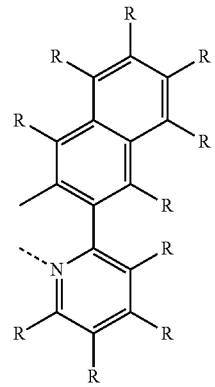
[Structural Formula C19]
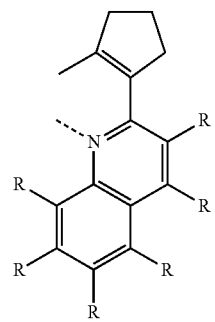
[Structural Formula C20]
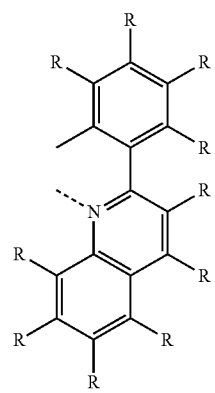
[Structural Formula C21]
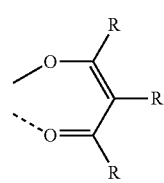
[Structural Formula C22]
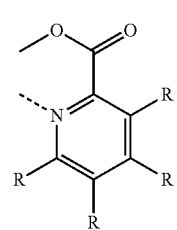

[Structural Formula C23]
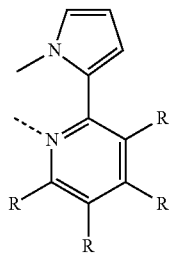
[Structural Formula C24]
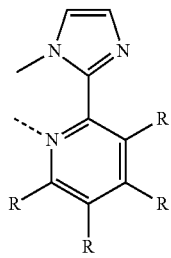
[Structural Formula C25]
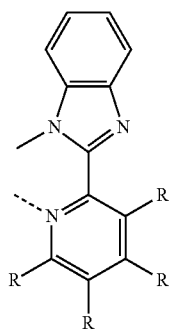
[Structural Formula C26]
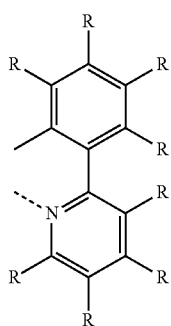
[Structural Formula C27]
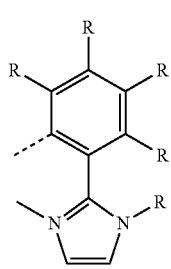
[Structural Formula C28]
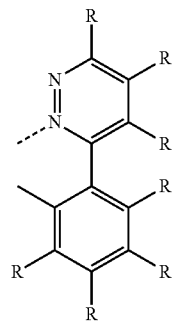
[Structural Formula C29]
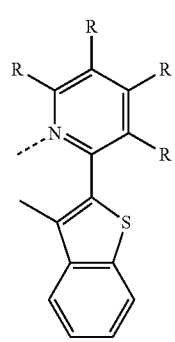
[Structural Formula C30]
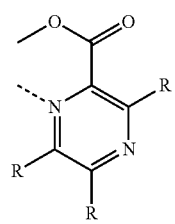
[Structural Formula C31]
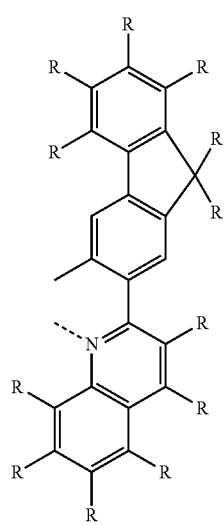

[Structural Formula C32]

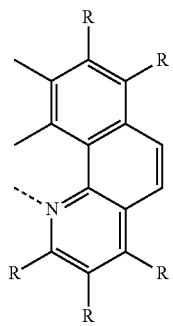

[Structural Formula C33]

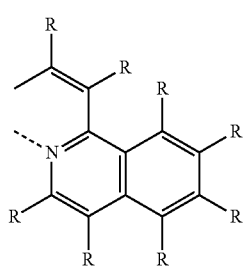

[Structural Formula C34]

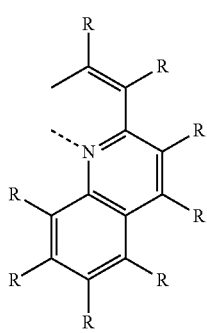

[Structural Formula C35]

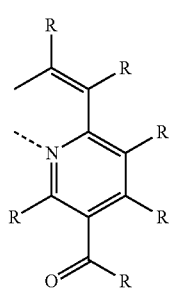

[Structural Formula C36]

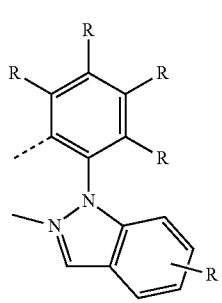

[Structural Formula C37]

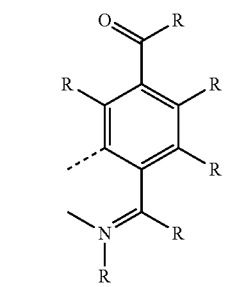

[Structural Formula C38]

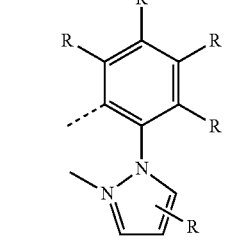

[Structural Formula C39]

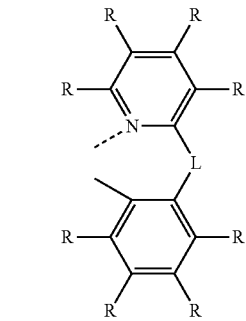

wherein,

Rs, which may be the same or different, are each independently selected from among a hydrogen atom, a deuterium atom, a halogen, a cyano, a substituted or unsubstituted alkyl of 1 to 30 carbon atoms, a substituted or unsubstituted aryl of 6 to 30 carbon atoms, a substituted or unsubstituted heteroaryl of 3 to 30 carbon atoms, a substituted or unsubstituted alkoxy of 1 to 30 carbon atoms, a substituted or unsubstituted cycloalkyl of 3 to 30 carbon atoms, a substituted or unsubstituted alkenyl of 2 to 30 carbon atoms, a substituted or unsubstituted alkylamino of 1 to 30 carbon atoms, a substituted or unsubstituted alkylsilyl of 1 to 30 carbon atoms, a substituted or unsubstituted arylamino of 6 to 30 carbon atoms, and a substituted or unsubstituted arylsilyl of 6 to 30 carbon atoms, and may form a spiro or fused ring with an adjacent substituent via an alkylene or alkenylene linker.

In the organic light emitting diode of the present disclosure, an electron injection layer (EIL) that functions to facilitate electron injection from the cathode, thus improving the power efficiency of the diode, may be deposited on the electron transport layer. The material for the EIL is not particularly limited.

So long as it is conventionally used in the art, any material can be available for the electron injection layer without particular limitations. Examples include LiF, NaCl, CsF, $Li_2O$, and BaO. Deposition conditions for the electron injection layer may vary, depending on compounds used, but may be generally selected from condition scopes that are almost the same as for the formation of hole injection layers.

The electron injection layer may range in thickness from about 1 Å to about 100 Å, and particularly from about 3 Å to about 90 Å. Given the thickness range for the electron injection layer, the diode can exhibit satisfactory electron injection properties without actually elevating a driving voltage.

Here, the cathode may be made of lithium (Li), magnesium (Mg), aluminum (Al), aluminum-lithium (Al—Li), calcium (Ca), magnesium-indium (Mg—In), or magnesium-silver (Mg—Ag). For a top-emitting OLED, a transparent cathode made of ITO or IZO may be employed In another embodiment, the light-emitting device of the present disclosure may further comprise a light-emitting layer, made of a blue light-emitting material, a green light-emitting material, or a red light-emitting material, which can emit light in a wavelength range of 380 nm to 800 nm. That is, the light-emitting layer in the organic light-emitting device of the present disclosure may have a multilayer structure in which the additional blue, green, and/or red light-emitting layer may be made of a fluorescent or phosphorescent material.

Further, one or more layers selected from among a hole injection layer, a hole transport layer, a light emitting layer, an electron density control layer, an electron transport layer, and an electron injection layer may be deposited using a single-molecule deposition process or a solution process.

Here, the deposition process is a process by which a material is vaporized in a vacuum or at a low pressure and deposited to form a layer, and the solution process is a method in which a material is dissolved in a solvent and applied for the formation of a thin film by means of inkjet printing, roll-to-roll coating, screen printing, spray coating, dip coating, spin coating, etc.

Also, the organic light-emitting diode of the present disclosure may be applied to a device selected from among flat display devices, flexible display devices, monochrome or grayscale flat illumination devices, and monochrome or grayscale flexible illumination devices.

A better understanding of the present disclosure may be obtained through the following examples which are set forth to illustrate, but are not to be construed as limiting the present invention.

EXAMPLES

Synthesis Example 1: Synthesis Example of Compound 1

Synthesis Example 1-(1): Synthesis of [Intermediate 1-a]

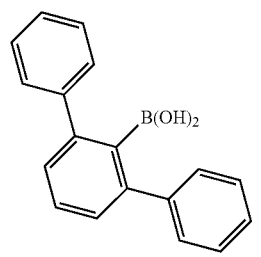

-continued

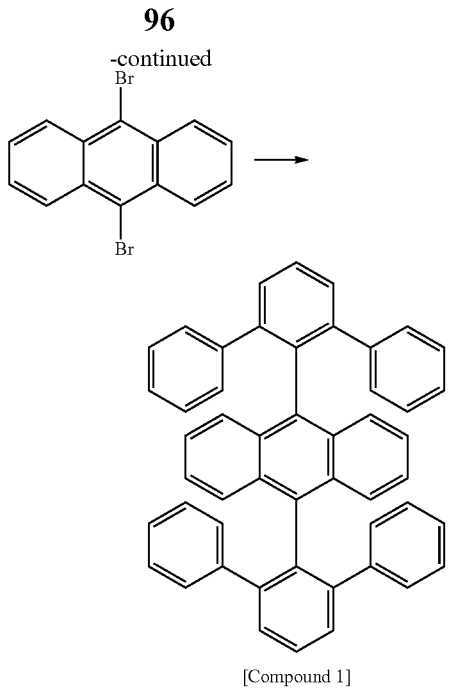

[Compound 1]

In a round bottom flask, [1,1':3',1''-terphenyl]-2'-yl boronic acid (2.5 g, 9 mmol), 9,10-dibromoanthracene (3.0 g, 9 mmol), tetrakis(triphenylphosphine)palladium(0) (0.4 g), and potassium carbonate (3.3 g) were placed, followed by toluene (25 mL), ethanol (25 mL), and water (10 mL). The reactor was heated to 90° C. and the mixture was stirred overnight. After completion of the reaction, the reactor was cooled to room temperature and the reaction mixture was extracted with ethyl acetate and water. The organic layer thus formed was concentrated, followed by isolation through column chromatography to afford [Compound 1] (3.5 g, yield 62%)

MS (MALDI-TOF): m/z 634.27 [M$^+$]

Synthesis Example 2: Synthesis Example of Compound 2

Synthesis Example 2-(1): Synthesis of [Compound 2]

The same procedure as in Synthesis Example 1-(1) was conducted, with the exception of using 2-biphenylboronic acid instead of [1,1':3',1''-terphenyl]-2'-yl boronic acid, to afford [Compound 2](yield 75%).

MS (MALDI-TOF): m/z 482.20 [M$^+$]

Synthesis Example 3: Synthesis Example of Compound 3

Synthesis Example 3-(1): Synthesis of [Compound 3]

The same procedure as in Synthesis Example 1-(1) was conducted, with the exception of using 2,6-dimethylphenylboronic acid instead of [1,1':3',1''-terphenyl]-2'-yl boronic acid, to afford [Compound 3] (yield 77%).

MS (MALDI-TOF): m/z 386.20 [M$^+$]

Synthesis Example 4: Synthesis Example of Compound 4

Synthesis Example 4-(1): Synthesis of [Intermediate 4-a]

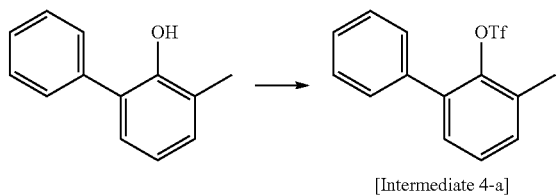 [SMILES: Cc1cccc(-c2ccccc2)c1O ; Cc1cccc(-c2ccccc2)c1OS(=O)(=O)C(F)(F)F]

[Intermediate 4-a]

In a round-bottom flask, pyridine (1.7 mL, 21.7 mmol) was added to a solution of 3-methyl biphenyl-2-ol (3.3 g 18.2 mmol) in dichloromethane and cooled to 0° C. Drops of trifluoromethanesulfonic anhydride (3.7 mL, 21.7 mmol) were slowly added and stirred. After the temperature was elevated to the room temperature, 2 N HCl was added and stirred. After extraction and concentration was sequentially conducted, column chromatography isolated [Intermediate 4-a] (4.2 g, yield 73%).

Synthesis Example 4-(2): Synthesis of [Compound 4]

The same procedure as in Synthesis Example 1-(1) was conducted, with the exception of using [Intermediate 4-a] instead of [1,1':3',1''-terphenyl]-2'-yl boronic acid, to afford [Compound 4](yield 72%).
MS (MALDI-TOF): m/z 510.23 [M+]

Synthesis Example 5: Synthesis Example of Compound 5

Synthesis Example 5-(1): Synthesis of [Compound 5]

The same procedure as in Synthesis Example 1-(1) was conducted, with the exception of using 2,6-difluorophenyl boronic acid instead of [1,1':3',1''-terphenyl]-2'-yl boronic acid, to afford [Compound 5] (yield 70%).
MS (MALDI-TOF): m/z 402.10 [M+]

Synthesis Example 6: Synthesis Example of Compound 6

Synthesis Example 6-(1): Synthesis of [Compound 6]

The same procedure as in Synthesis Example 1-(1) was conducted, with the exception of using 2-methylbenzene boronic acid instead of [1,1':3',1''-terphenyl]-2'-yl boronic acid, to afford [Compound 6] (yield 65%).
MS (MALDI-TOF): m/z 358.17 [M+]

Molecular Simulation Results of the Compounds According the Present Disclosure

Using the method illustrated in Table 2, molecular simulation was performed for Compounds A and B, which correspond to the Compounds 1 to 5 according to the present disclosure and compounds of Comparative Examples. The molecular simulation results of Compounds A and B are given for Compounds 1 to 5 in Table 3, below and for compounds of Comparative Examples in Table 4, below.

TABLE 2

| Program | Method | Basic-set | |
|---------|--------|-----------|---|
| | | Optimize | Excited state |
| Gaussin a09W | DFT | B3LYP/6-31G | B3LYP/6-31G** |

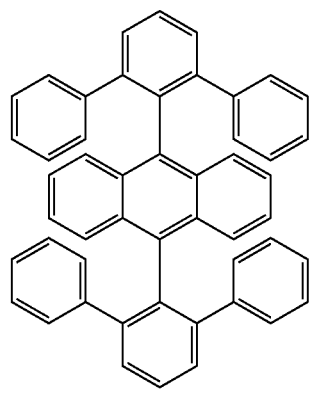

[Compound 1]

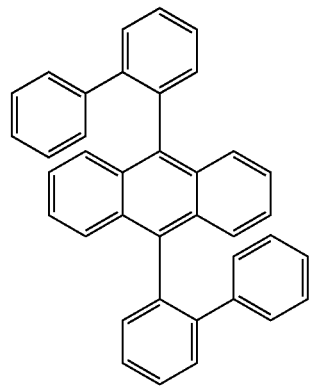

[Compound 2]

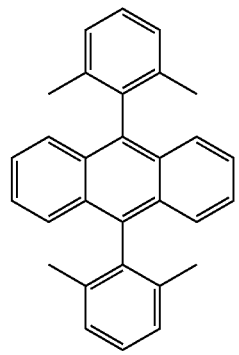

[Compound 3]

-continued
[Compound 4]
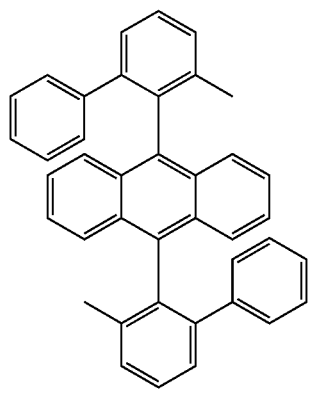
[Compound 5]
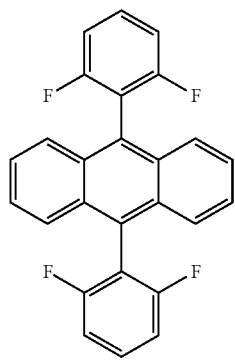
[Compound 6]
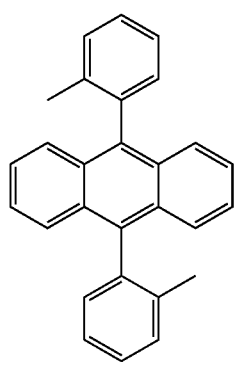
COMPOUNDS OF COMPARATIVE EXAMPLES
[BH 1]
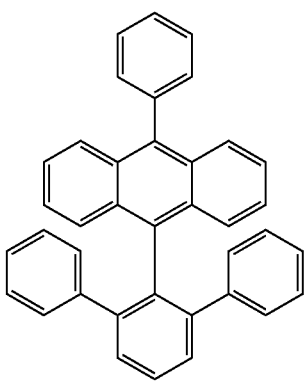
[BH 2]
[BH 3]
TABLE 3
|  | Compound 1 | Compound 2 | Compound 3 | Compound 4 | Compound 5 | Compound 6 |
|---|---|---|---|---|---|---|
| S1 (eV) | 3.022 | 3.067 | 3.129 | 3.054 | 3.124 | 3.149 |
| S2 (eV) | 3.706 | 3.731 | 3.835 | 3.765 | 3.836 | 3.382 |
| T1 (eV) | 1.685 | 1.698 | 1.710 | 1.691 | 1.710 | 1.725 |
| T2 (eV) | 3.405 | 3.404 | 3.470 | 3.470 | 3.431 | 3.472 |
| 2T1 (eV) | 3.369 | 3.396 | 3.421 | 3.382 | 3.419 | 3.450 |
| TTA Type | Type III | Type III | Type III | Type III | Type III | Type III |

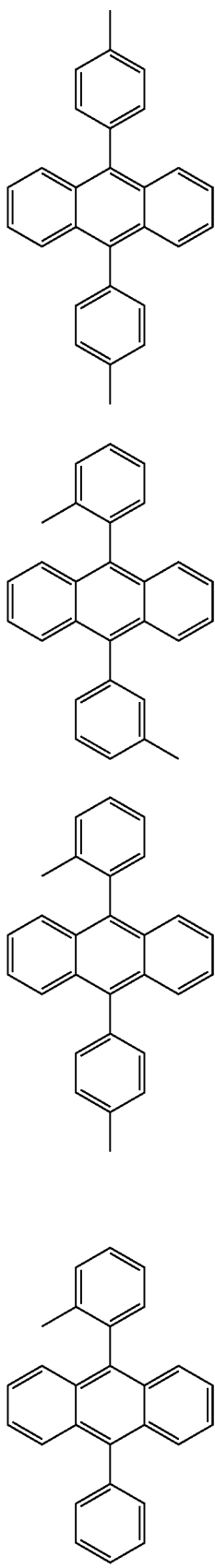
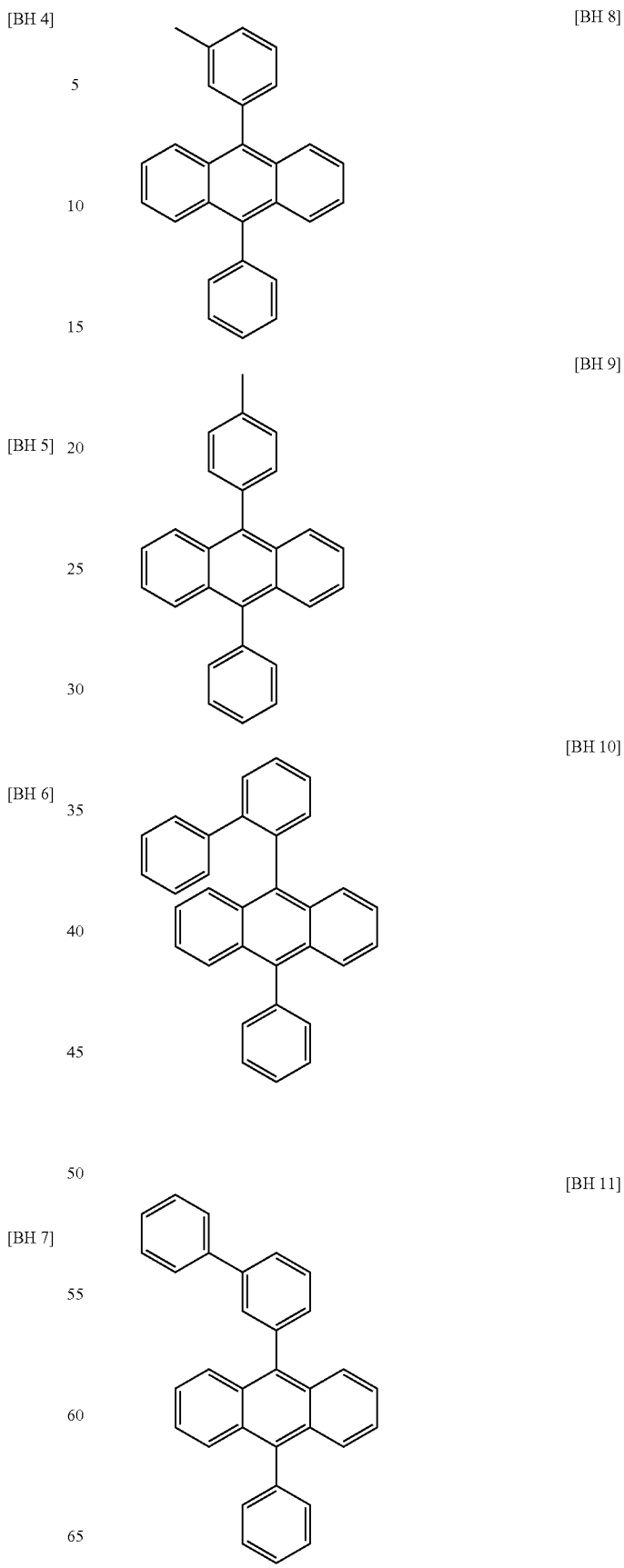

-continued

[BH 12]

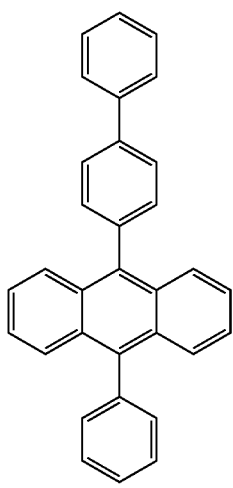

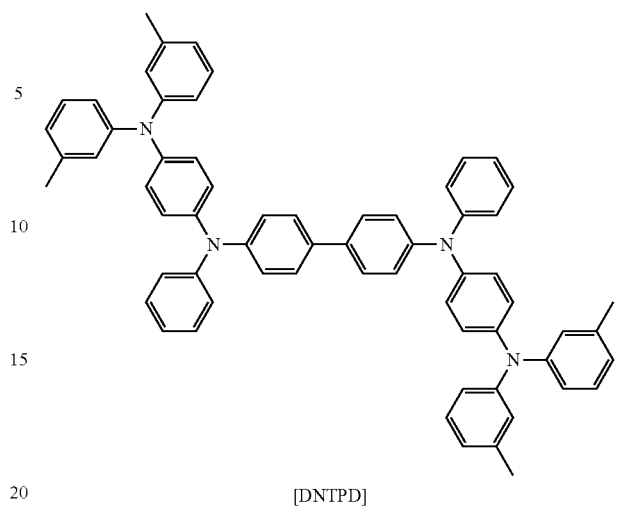

[DNTPD]

TALE 4

|      | S1 (eV) | S2 (eV) | T1 (eV) | T2 (eV) | 2T1 (eV) | TTA Type |
|------|---------|---------|---------|---------|----------|----------|
| BH 1 | 3.078   | 3.736   | 1.702   | 3.244   | 3.405    | Type II  |
| BH 2 | 3.031   | 3.699   | 1.684   | 3.235   | 3.367    | Type II  |
| BH 3 | 3.152   | 3.822   | 1.733   | 3.260   | 3.466    | Type II  |
| BH 4 | 3.164   | 3.822   | 1.737   | 3.471   | 3.473    | Type II  |
| BH 5 | 3.153   | 3.828   | 1.730   | 3.263   | 3.460    | Type II  |
| BH 6 | 3.156   | 3.827   | 1.731   | 3.264   | 3.462    | Type II  |
| BH 7 | 3.158   | 3.827   | 1.731   | 3.264   | 3.462    | Type II  |
| BH 8 | 3.164   | 3.521   | 1.737   | 3.261   | 3.473    | Type II  |
| BH 9 | 3.165   | 3.822   | 1.737   | 3.262   | 3.473    | Type II  |
| BH 10| 3.113   | 3.770   | 1.716   | 3.253   | 3.432    | Type II  |
| BH 11| 3.150   | 3.753   | 1.733   | 3.256   | 3.466    | Type II  |
| BH 12| 3.160   | 3.802   | 1.736   | 3.262   | 3.472    | Type II  |

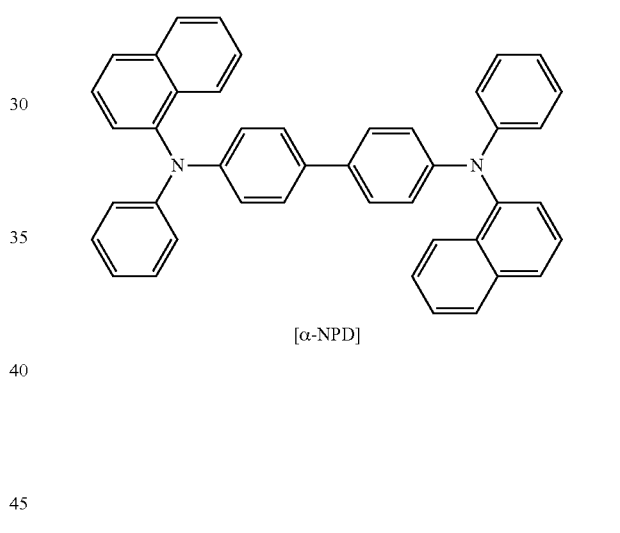

[α-NPD]

Examples 1 to 6

Fabrication of Organic Light-Emitting Diode

An ITO glass substrate was patterned to have a translucent area of 2 mm×2 mm and cleansed. The ITO glass was mounted in a vacuum chamber that was then set to have a base pressure of $1\times10^{-7}$ torr. On the ITO glass substrate, films were sequentially formed of DNTPD (400 Å) and α-NPD(200 Å). A light-emitting layer (200 Å) was formed of each of the compounds listed in Table 5, below and [BD 1] at a weight ratio of 97:3, as a host. Then, [Chemical Formula E-1] was deposited to form an electron transport layer (300 Å), on which an electron injection layer of Liq (10 Å) was formed and then covered with an Al layer (1000 Å) to fabricate an organic light-emitting diode. The organic light-emitting diodes thus obtained were measured at 10 mA/cm² for luminescence properties:

[BD 1]

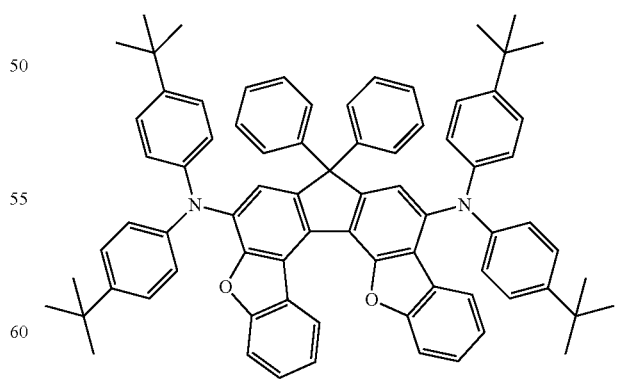

[Compound E-1]

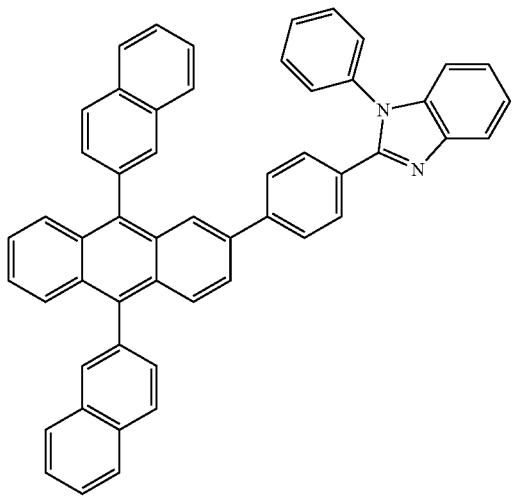

Comparative Examples 1 to 12

Organic light-emitting diodes were fabricated in the same manner as in Examples 1 to 6, with the exception that [BH 1] to [BH 12] were used, instead of the host compounds used in Examples 1 to 6. The luminescence of the organic light-emitting diode was measured at 10 mA/cm² and the measurements are summarized in Table 5.

TABLE 5

| | Host | Dopant | V | cd/A | CIEx | CIEy |
|---|---|---|---|---|---|---|
| Comparative Example 1 | BH 1 | BD1 | 3.82 | 9.12 | 0.137 | 0.114 |
| Comparative Example 2 | BH 2 | BD1 | 3.81 | 9.06 | 0.136 | 0.115 |
| Comparative Example 3 | BH 3 | BD1 | 3.84 | 8.98 | 0.137 | 0.113 |
| Comparative Example 4 | BH 4 | BD1 | 3.82 | 9.02 | 0.137 | 0.113 |
| Comparative Example 5 | BH 5 | BD1 | 3.80 | 9.16 | 0.138 | 0.112 |
| Comparative Example 6 | BH 6 | BD1 | 3.84 | 9.22 | 0.136 | 0.114 |
| Comparative Example 7 | BH 7 | BD1 | 3.83 | 9.17 | 0.137 | 0.113 |
| Comparative Example 8 | BH 8 | BD1 | 3.85 | 9.07 | 0.138 | 0.111 |
| Comparative Example 9 | BH 9 | BD1 | 3.82 | 9.14 | 0.136 | 0.114 |
| Comparative Example 10 | BH 10 | BD1 | 3.80 | 9.13 | 0.136 | 0.115 |
| Comparative Example 11 | BH 11 | BD1 | 3.84 | 9.07 | 0.137 | 0.112 |
| Comparative Example 12 | BH 12 | BD1 | 3.81 | 9.09 | 0.136 | 0.115 |
| Example 1 | Compound 13 | BD1 | 3.83 | 9.82 | 0.137 | 0.114 |
| Example 2 | Compound 14 | BD1 | 3.83 | 9.87 | 0.136 | 0.115 |
| Example 3 | Compound 15 | BD1 | 3.81 | 9.98 | 0.136 | 0.115 |
| Example 4 | Compound 16 | BD1 | 3.81 | 9.94 | 0.137 | 0.113 |
| Example 5 | Compound 17 | BD1 | 3.82 | 9.88 | 0.138 | 0.112 |
| Example 6 | Compound 18 | BD1 | 3.80 | 9.93 | 0.136 | 0.114 |

As is understood from data of Table 5, the organic light-emitting diodes according to the present disclosure exhibit greater luminous efficiencies compared to conventional organic light-emitting diodes of Comparative Examples 1 to 12 and thus the present disclosure allows the fabrication of an organic light-emitting diode having high efficiency.

The invention claimed is:
1. An organic light emitting diode, comprising:
a first electrode;
a second electrode facing the first electrode; and
a light emitting layer interposed between the first electrode and the second electrode,
wherein,
the light emitting layer includes a host and a dopant and at least one of the anthracene derivatives represented by the following Chemical Formula A is the host; and
the second triplet excited orbital energy level ($T_2$) of the Chemical Formula A is higher than two times the lowest triplet excited orbital energy level ($T_1$) ($T_2 > 2T_1$),

[Chemical Formula A]

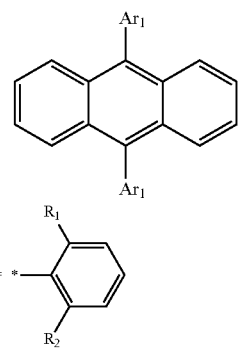

wherein,
"*" within $Ar_1$ denotes a bond to the carbon atom in the aromatic ring of the anthracene moiety, and
$R_1$ and $R_2$ are a substituted or unsubstituted heteroaryl of 2 to 20 carbon atoms,
wherein,
the substituents $R_1$ and $R_2$ are identical to each other, and
the term "substituted" in the expression "substituted or unsubstituted" means having at least one substituent selected from the group consisting of a deuterium atom, a cyano, a halogen, an alkyl of 1 to 10 carbon atoms, an aryl of 6 to 12 carbon atoms, and an arylalkyl of 6 to 12 carbon atoms.

2. The organic light emitting diode of claim 1, wherein the substituents $R_1$ and $R_2$ in the anthracene derivative represented by Chemical Formula A are a substituted or unsubstituted heteroaryl of 2 to 12 carbon atoms.

3. The organic light emitting diode of claim 1, further comprising at least one of a hole injection layer, a hole transport layer, a functional layer capable of both hole injection and hole transport, an electron transport layer, and an electron injection layer in addition to the light emitting layer.

4. The organic light emitting diode of claim 1, further comprising a light emitting layer, made of a blue light emitting material, a green light emitting material, or a red light emitting material, which emits light in a wavelength range of 380 nm to 800 nm, wherein the blue, green, or red light emitting layer is a fluorescent or phosphorescent material.

5. The organic light emitting diode of claim 3, wherein the at least one selected from among the hole injection layer, the hole transport layer, the functional layer capable of both hole injection and hole transport, the electron transport layer, the electron injection layer, and the light emitting layer, is formed using a deposition process or a solution process.

6. The organic light emitting diode of claim 1, wherein the organic light emitting diode is used for a device selected from among a flat display device, a flexible display device, a monochrome or grayscale flat illumination device, and a monochrome or grayscale flexible illumination device.

7. The organic light emitting diode of claim 1, wherein the dopant contains at least one of the following [Chemical Formula 2] to [Chemical Formula 4]:

[Chemical Formula 2]

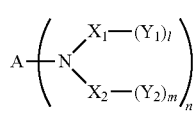

wherein

A is selected from among a substituted or unsubstituted aryl of 5 to 50 carbon atoms, a substituted or unsubstituted heteroaryl of 3 to 50 carbon atoms bearing O, N, or S as a heteroatom, a substituted or unsubstituted arylene of 6 to 60 carbon atoms, and a substituted or unsubstituted heteroarylene of 3 to 50 carbon atoms bearing O, N, or S as a heteroatom, $X_1$ and $X_2$, which are same or different, are each independently a substituted or unsubstituted arylene of 6 to 30 carbon atoms or a single bond, and can bond to each other;

$Y_1$ and $Y_2$, which are same or different, are each independently selected from the group consisting of a substituted or unsubstituted aryl of 6 to 24 carbon atoms, a substituted or unsubstituted heteroaryl of 2 to 24 carbon atoms, a substituted or unsubstituted alkyl of 1 to 24 carbon atoms, a substituted or unsubstituted heteroalkyl of 1 to 24 carbon atoms, a substituted or unsubstituted cycloalkyl of 3 to 24 carbon atoms, a substituted or unsubstituted alkoxy of 1 to 24 carbon atoms, a cyano, a halogen, a substituted or unsubstituted aryloxy of 6 to 24 carbon atoms, a substituted or unsubstituted alkylsilyl of 1 to 40 carbon atoms, a substituted or unsubstituted arylsilyl of 6 to 30 carbon atoms, a deuterium, and a hydrogen, and can each form an aliphatic, aromatic, heteroaliphatic, or heteroaromatic fused ring with an adjacent radical, l and m are each an integer of 1 to 20, and n is an integer of 1 to 4;

[Chemical Formula 3]

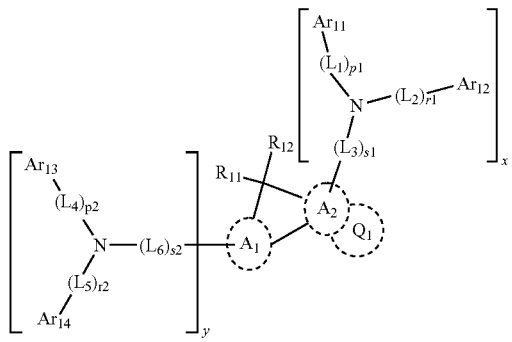

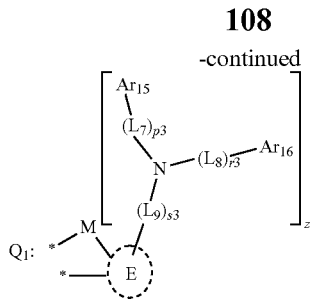

[Chemical Formula 4]

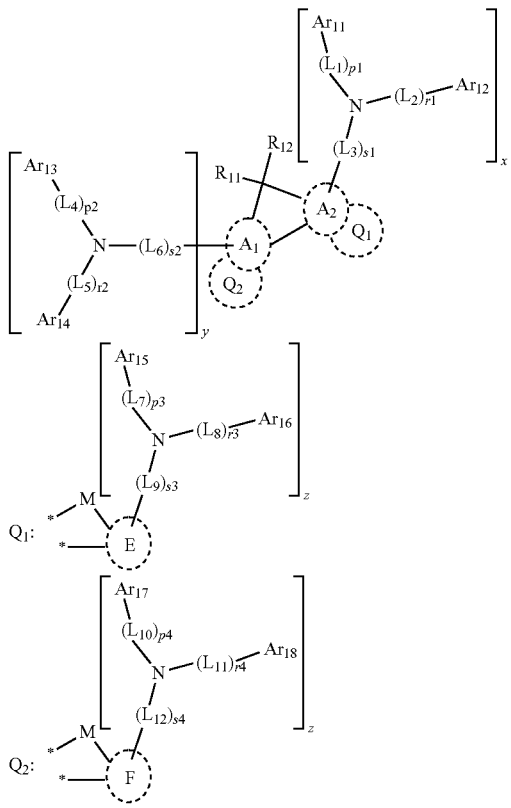

wherein, $A_1$, $A_2$, E, and F, which are same or different, are each independently a substituted or unsubstituted aromatic hydrocarbon ring of 6 to 50 carbon atoms or a substituted or unsubstituted heteroaromatic ring of 2 to 40 carbon atoms, wherein two adjacent carbon atoms of the aromatic ring $A_1$ and two adjacent carbon atoms of the aromatic ring $A_2$ form a 5-membered fused ring together with a carbon atom connected to both substituents $R_{11}$ and $R_{12}$;

linkers $L_1$ to $L_{12}$, which are same or different, are each independently selected from among a single bond, a substituted or unsubstituted alkylene of 1 to 60 carbon atoms, a substituted or unsubstituted alkenylene of 2 to 60 carbon atoms, a substituted or unsubstituted alkynylene of 2 to 60 carbon atoms, a substituted or unsubstituted cycloalkylene of 3 to 60 carbon atoms, a substituted or unsubstituted heterocycloalkylene of 2 to 60 carbon atoms, a substituted or unsubstituted arylene of 6 to 60 carbon atoms, and a substituted or unsubstituted heteroarylene of 2 to 60 carbon atoms;

M is any one selected from among N—$R_{13}$, $CR_{14}R_{15}$, $SiR_{16}R_{17}$, $GeR_{18}R_{19}$, O, S, and Se;

$R_{11}$ to $R_{19}$, and $Ar_{11}$ to $Ar_{18}$, which are same or different, are each independently selected from among a hydrogen atom, a deuterium atom, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 5 to 30 carbon atoms, a substituted or unsubstituted alkylamine of 1 to 30 carbon atoms, a substituted or unsubstituted arylamine of 5 to 30 carbon atoms, a substituted or unsubstituted alkylsilyl of 1 to 30 carbon atoms, a substituted or unsubstituted arylsilyl of 5 to 30 carbon atoms, a substituted or unsubstituted alkylgermanium of 1 to 30 carbon atoms, a substituted or unsubstituted arylgermanium of 1 to 30 carbon atoms, a cyano, a nitro, and a halogen, wherein $R_{11}$ and $R_{12}$ may be connected to each other to form a mono- or polycyclic aliphatic or aromatic ring which may bear at least one heteroatom selected from among N, O, P, Si, S, Ge, Se, and Te as a ring member;

p1 to p4, r1 to r4, and s1 to s4 are each independently an integer of 1 to 3, under which when any of them is 2 or greater, the corresponding linkers $L_1$ to $L_{12}$ are same or different, x is an integer of 1 or 2, y and z, which are the same or different, are each an integer of 0 to 3, respective rings may be formed through linkages between $Ar_{11}$ and $Ar_{12}$, between $Ar_{13}$ and $A_{14}$, between $Ar_{15}$ and $Ar_{16}$, and between $Ar_{17}$ and $Ar_{18}$;

two adjacent carbon atoms of the $A_2$ ring moiety of Chemical Formula 3 occupy respective positions * of Structural Formula $Q_1$ to form a fused ring; and two adjacent carbon atoms of the $A_1$ ring moiety of Chemical Formula 4 occupy respective positions * of structural Formula $Q_2$ to form a fused ring, and two adjacent carbon atoms of the $A_2$ ring moiety occupy respective positions * of Structural Formula $Q_1$ to form a fused ring.

* * * * *